(12) United States Patent
Titus et al.

(10) Patent No.: US 11,621,277 B2
(45) Date of Patent: Apr. 4, 2023

(54) MULTILEVEL MEMORY STACK STRUCTURE WITH TAPERED INTER-TIER JOINT REGION AND METHODS OF MAKING THEREOF

(71) Applicant: SANDISK TECHNOLOGIES LLC, Addison, TX (US)

(72) Inventors: Monica Titus, Sunnyvale, CA (US); Zhixin Cui, Yokkaichi (JP); Senaka Kanakamedala, San Jose, CA (US); Yao-Sheng Lee, Tampa, FL (US); Chih-Yu Lee, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 213 days.

(21) Appl. No.: 17/098,743

(22) Filed: Nov. 16, 2020

(65) Prior Publication Data
US 2021/0066347 A1 Mar. 4, 2021

Related U.S. Application Data

(62) Division of application No. 15/593,820, filed on May 12, 2017, now abandoned.

(51) Int. Cl.
*H01L 27/11582* (2017.01)
*H01L 27/11565* (2017.01)
*H01L 27/11575* (2017.01)

(52) U.S. Cl.
CPC .. *H01L 27/11582* (2013.01); *H01L 27/11565* (2013.01); *H01L 27/11575* (2013.01)

(58) Field of Classification Search
CPC ......... H01L 27/11582; H01L 27/11565; H01L 27/11575
See application file for complete search history.

(56) References Cited

U.S. PATENT DOCUMENTS

| 5,387,530 A | 2/1995 | Doyle et al. |
| 5,915,167 A | 6/1999 | Leedy |

(Continued)

FOREIGN PATENT DOCUMENTS

| EP | 1398831 A2 | 3/2004 |
| WO | WO2002/015277 A2 | 2/2002 |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Peter M Albrecht
(74) *Attorney, Agent, or Firm* — The Marbury Law Group PLLC

(57) ABSTRACT

A joint level dielectric material layer is formed over a first alternating stack of first insulating layers and first spacer material layers. A first memory opening is formed with a tapered sidewall of the joint level dielectric material layer. A second alternating stack of second insulating layers and second spacer material layers is formed over the joint level dielectric material layer. An inter-tier memory opening is formed, which includes a volume of an second memory opening that extends through the second alternating stack and a volume of the first memory opening. A memory film and a semiconductor channel are formed in the inter-tier memory opening with respective tapered portions overlying the tapered sidewall of the joint level dielectric material layer.

8 Claims, 31 Drawing Sheets

(56) References Cited

U.S. PATENT DOCUMENTS

| | | | |
|---|---|---|---|
| 7,005,350 B2 | 2/2006 | Walker et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,821,058 B2 | 10/2010 | Kidoh et al. |
| 7,848,145 B2 | 12/2010 | Mokhlesi et al. |
| 7,851,851 B2 | 12/2010 | Mokhlesi et al. |
| 7,867,822 B2 | 1/2011 | Lee |
| 7,983,084 B2 | 7/2011 | Tokiwa et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,681 B2 | 1/2013 | Alsmeier et al. |
| 8,394,716 B2 | 3/2013 | Hwang et al. |
| 8,445,347 B2 | 5/2013 | Alsmeier |
| 8,450,181 B2 | 5/2013 | Chen et al. |
| 8,614,126 B1 | 12/2013 | Lee et al. |
| 8,658,499 B2 | 2/2014 | Makala et al. |
| 8,741,761 B2 | 6/2014 | Lee et al. |
| 8,828,884 B2 | 9/2014 | Lee et al. |
| 8,847,302 B2 | 9/2014 | Alsmeier et al. |
| 8,878,278 B2 | 11/2014 | Alsmeier et al. |
| 8,884,357 B2 | 11/2014 | Wang et al. |
| 8,946,023 B2 | 2/2015 | Makala et al. |
| 9,230,987 B2 | 1/2016 | Pachamuthu et al. |
| 9,449,982 B2 | 9/2016 | Lu et al. |
| 9,449,987 B1 | 9/2016 | Miyata et al. |
| 9,490,262 B1 | 11/2016 | Pang et al. |
| 9,490,371 B2 | 11/2016 | Noh et al. |
| 9,490,429 B2 | 11/2016 | Sasago et al. |
| 9,502,471 B1 | 11/2016 | Lu et al. |
| 9,515,080 B2 | 12/2016 | Takahashi et al. |
| 9,520,406 B2 | 12/2016 | Makala et al. |
| 9,570,463 B1 | 2/2017 | Zhang et al. |
| 9,627,403 B2 | 4/2017 | Liu et al. |
| 2006/0001073 A1 | 1/2006 | Chen et al. |
| 2006/0003531 A1 | 1/2006 | Chang et al. |
| 2006/0258076 A1 | 11/2006 | Mizushima et al. |
| 2007/0210338 A1 | 9/2007 | Orlowski |
| 2007/0252201 A1 | 11/2007 | Kito et al. |
| 2008/0067583 A1 | 3/2008 | Kidoh et al. |
| 2008/0169496 A1 | 7/2008 | Keller et al. |
| 2009/0026561 A1 | 1/2009 | Reichenbach et al. |
| 2009/0090965 A1 | 4/2009 | Kito et al. |
| 2009/0097309 A1 | 4/2009 | Mizukami et al. |
| 2009/0108333 A1 | 4/2009 | Kito et al. |
| 2009/0121271 A1 | 5/2009 | Son et al. |
| 2009/0146206 A1 | 6/2009 | Fukuzumi et al. |
| 2009/0224309 A1 | 9/2009 | Kidoh et al. |
| 2009/0230458 A1 | 9/2009 | Ishiduki et al. |
| 2009/0242967 A1 | 10/2009 | Katsumata et al. |
| 2009/0294844 A1 | 12/2009 | Tanaka et al. |
| 2010/0044778 A1 | 2/2010 | Seol |
| 2010/0059811 A1 | 3/2010 | Sekine et al. |
| 2010/0072538 A1 | 3/2010 | Kito et al. |
| 2010/0109065 A1 | 5/2010 | Oh et al. |
| 2010/0112769 A1 | 5/2010 | Son et al. |
| 2010/0117137 A1 | 5/2010 | Fukuzumi et al. |
| 2010/0120214 A1 | 5/2010 | Park et al. |
| 2010/0123202 A1 | 5/2010 | Hofmann |
| 2010/0155810 A1 | 6/2010 | Kim et al. |
| 2010/0155818 A1 | 6/2010 | Cho |
| 2010/0163968 A1 | 7/2010 | Kim et al. |
| 2010/0171162 A1 | 7/2010 | Katsumata et al. |
| 2010/0181610 A1 | 7/2010 | Kim et al. |
| 2010/0207195 A1 | 8/2010 | Fukuzumi et al. |
| 2010/0213458 A1 | 8/2010 | Prall |
| 2010/0213537 A1 | 8/2010 | Fukuzumi et al. |
| 2010/0320528 A1 | 12/2010 | Jeong et al. |
| 2011/0002178 A1 | 1/2011 | Hwang et al. |
| 2011/0049607 A1 | 3/2011 | Yahashi |
| 2011/0049608 A1 | 3/2011 | Kidoh et al. |
| 2011/0057251 A1 | 3/2011 | Higashi |
| 2011/0065270 A1 | 3/2011 | Shim et al. |
| 2011/0076819 A1 | 3/2011 | Kim et al. |
| 2011/0133606 A1 | 6/2011 | Yoshida et al. |
| 2011/0151667 A1 | 6/2011 | Hwang et al. |
| 2011/0163449 A1 | 7/2011 | Kelly et al. |
| 2011/0266606 A1 | 11/2011 | Park et al. |
| 2011/0287612 A1 | 11/2011 | Lee et al. |
| 2011/0312174 A1 | 12/2011 | Lee et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0003800 A1 | 1/2012 | Lee et al. |
| 2012/0049268 A1 | 3/2012 | Chang et al. |
| 2012/0052674 A1 | 3/2012 | Lee et al. |
| 2012/0068242 A1 | 3/2012 | Shin et al. |
| 2012/0074367 A1 | 3/2012 | Costa et al. |
| 2012/0100700 A1 | 4/2012 | Kim |
| 2012/0104484 A1 | 5/2012 | Lee |
| 2012/0140562 A1 | 6/2012 | Choe et al. |
| 2012/0153376 A1 | 6/2012 | Alsmeier et al. |
| 2012/0170369 A1 | 7/2012 | Kim et al. |
| 2012/0241842 A1 | 9/2012 | Matsuda |
| 2012/0256247 A1 | 10/2012 | Alsmeier et al. |
| 2012/0261638 A1 | 10/2012 | Sills et al. |
| 2012/0267701 A1 | 10/2012 | Chae et al. |
| 2012/0276719 A1 | 11/2012 | Han et al. |
| 2012/0327715 A1 | 12/2012 | Lee et al. |
| 2013/0044531 A1 | 2/2013 | Baek et al. |
| 2013/0059422 A1 | 3/2013 | Lee et al. |
| 2013/0189444 A1 | 7/2013 | Kub et al. |
| 2013/0207178 A1 | 8/2013 | Lee et al. |
| 2013/0237025 A1 | 9/2013 | Yang |
| 2013/0248974 A1 | 9/2013 | Alsmeier |
| 2013/0264631 A1 | 10/2013 | Alsmeier et al. |
| 2013/0313627 A1 | 11/2013 | Lee et al. |
| 2013/0313717 A1 | 11/2013 | Holmes et al. |
| 2013/0322174 A1 | 12/2013 | Li et al. |
| 2014/0008714 A1 | 1/2014 | Makala et al. |
| 2014/0264525 A1 | 9/2014 | Takahashi et al. |
| 2014/0273373 A1 | 9/2014 | Makala et al. |
| 2015/0155296 A1* | 6/2015 | Yoon ............... H01L 27/11582 |
| | | 438/703 |
| 2015/0294978 A1 | 10/2015 | Lu et al. |
| 2016/0204117 A1 | 7/2016 | Liu et al. |
| 2016/0322378 A1 | 11/2016 | Ito et al. |
| 2016/0322381 A1 | 11/2016 | Liu et al. |
| 2016/0322382 A1 | 11/2016 | Lee |
| 2017/0062454 A1 | 3/2017 | Lu et al. |
| 2018/0331117 A1 | 11/2018 | Titus et al. |

FOREIGN PATENT DOCUMENTS

| | | |
|---|---|---|
| WO | WO2008/118433 A1 | 10/2008 |
| WO | WO2009/085078 A1 | 7/2009 |
| WO | WO2012/003301 A2 | 1/2012 |

OTHER PUBLICATIONS

Hammond, M. L., "Silicon Epitaxy by Chemical Vapor Deposition," pp. 45-106.

Csepregi, L. et al., "Substrate-Orientation Dependence of the Epitaxial Regrowth Rate from Si-Implanted Amorphous Si," Journal of Applied Physics, vol. 49, No. 7, pp. 3906-3911 (1978).

Seidel, H. et al., "Anisotropic Etching of Crystalline Silicon in Alkaline Solutions," J. Electrochem. Soc., vol. 137, No. 11, pp. 3612-3626, (1990).

Invitation to Pay Additional Fees, International Application No. PCT/US2016/047397, issued Dec. 8, 2016.

U.S. Appl. No. 15/071,575, Office Action dated Nov. 16, 2016, 13pgs.

U.S. Appl. No. 15/183,195, Office Action dated Feb. 21, 2017, 15pgs.

U.S. Appl. No. 14/585,912, Office Action dated Apr. 7, 2016, 30pgs.

(56) References Cited

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, dated Jan. 17, 2012.
Invitation to Pay Additional Fees & Partial International Search Report, PCT/US2011/042566, dated Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkelbp.co.jp/english/NEWS_EN/20090619/171977/ Nikkei Microdevices, Tech-On, Jun. 19, 2019.
Li et al., "Sacrificial Polymers for Nanofluidic Channels in Biological Applications", Nanotechnology 14 (2003) 578-583.
International Search Report and Written Opinion, International Application No. PCT/US2014/023276, dated Jun. 30, 2014 (13 pages).
International Search Report and Written Opinion, International Application No. PCT/US2014/020290, dated Jun. 25, 2014.
Invitation to Pay Additional Search Fees, International Application No. PCT/US2013/024638, issued Apr. 24, 2013.
Boogaard et al., "Net negative charge in low-temperature SiO2 gate dielectric layers," Microelectronic Engineering, vol. 86, Issues 7-9, Jul.-Sep. 2009, pp. 1707-1710.
U.S. Appl. No. 13/933,743, Office Action dated Apr. 21, 2014, 29pgs.
U.S. Appl. No. 14/219,161, Office Action dated Jul. 28, 2014, 18pgs.
U.S. Appl. No. 14/207,012, Office Action dated Nov. 9, 2015, 36pgs.
U.S. Appl. No. 15/015,190, filed Feb. 4, 2016, SanDisk Technologies Inc.
U.S. Appl. No. 15/049,444, filed Feb. 22, 2016, SanDisk Technologies Inc.
U.S. Appl. No. 15/071,575, filed Mar. 16, 2016, SanDisk Technologies Inc.
U.S. Appl. No. 15/183,195, filed Jun. 15, 2016, SanDisk Technologies LLC.
U.S. Appl. No. 15/186,768, filed Jun. 20, 2016, SanDisk Technologies LLC.
U.S. Appl. No. 15/243,260, filed Aug. 22, 2016, SanDisk Technologies LLC.
U.S. Appl. No. 15/292,548, filed Oct. 13, 2016, SanDisk Technologies LLC.
U.S. Appl. No. 15/335,850, filed Oct. 27, 2016, SanDisk Technologies LLC.
U.S. Appl. No. 15/347,101, filed Nov. 9, 2016, SanDisk Technologies LLC.
U.S. Appl. No. 15/445,579, filed Feb. 28, 2017, SanDisk Technologies LLC.

\* cited by examiner

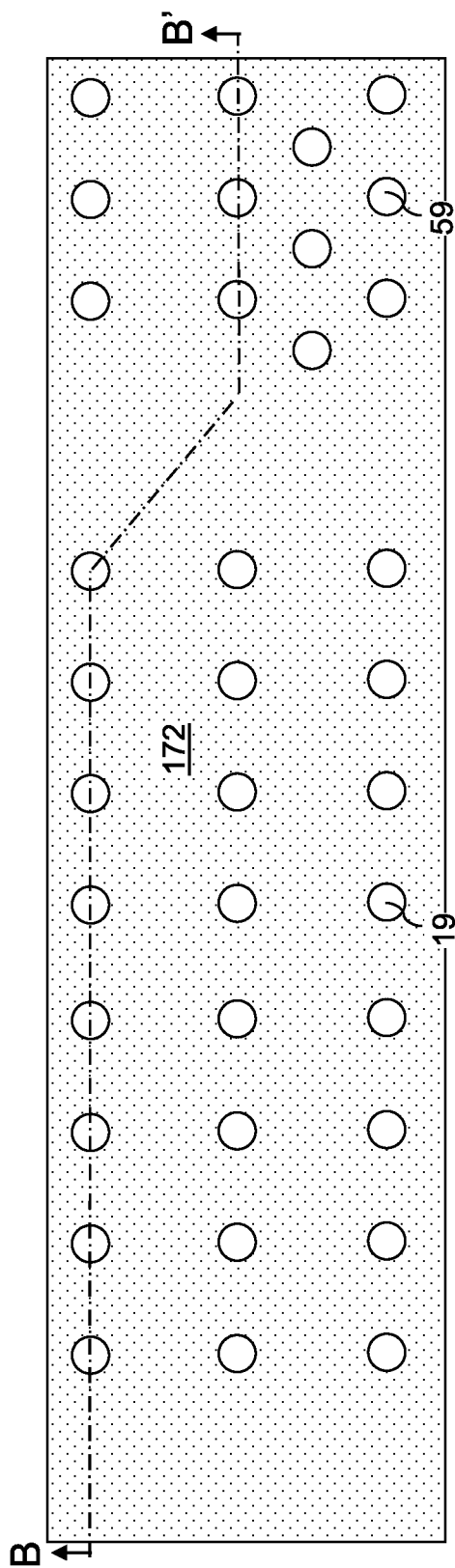
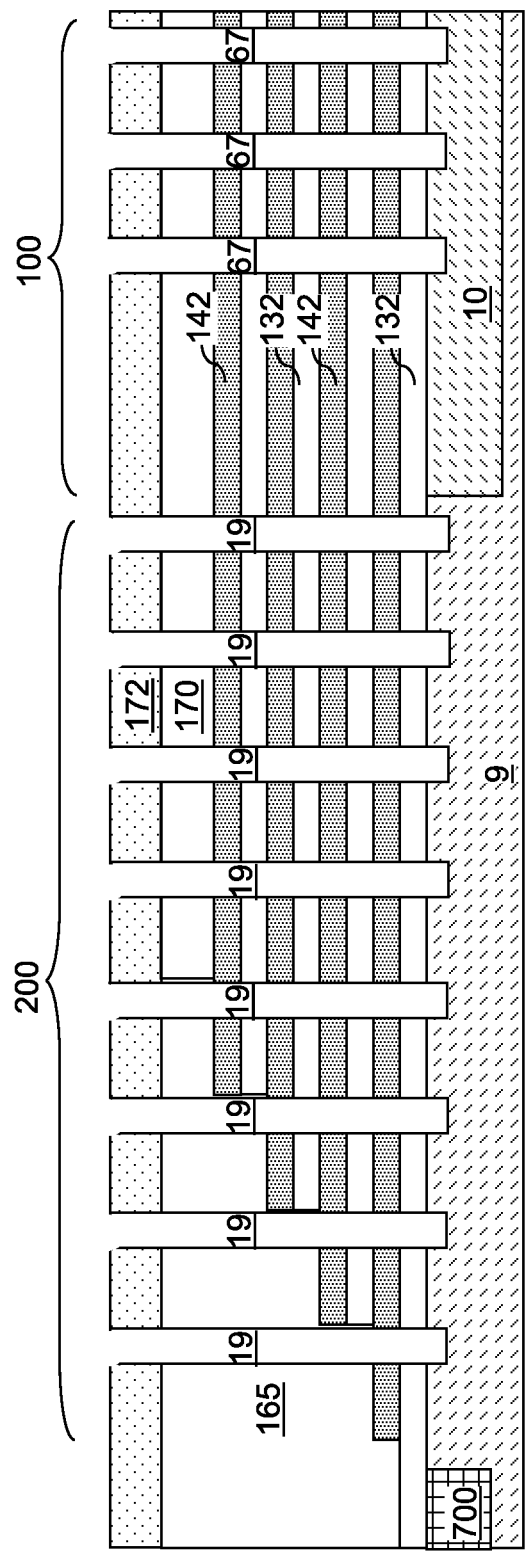
FIG. 2A
FIG. 2B

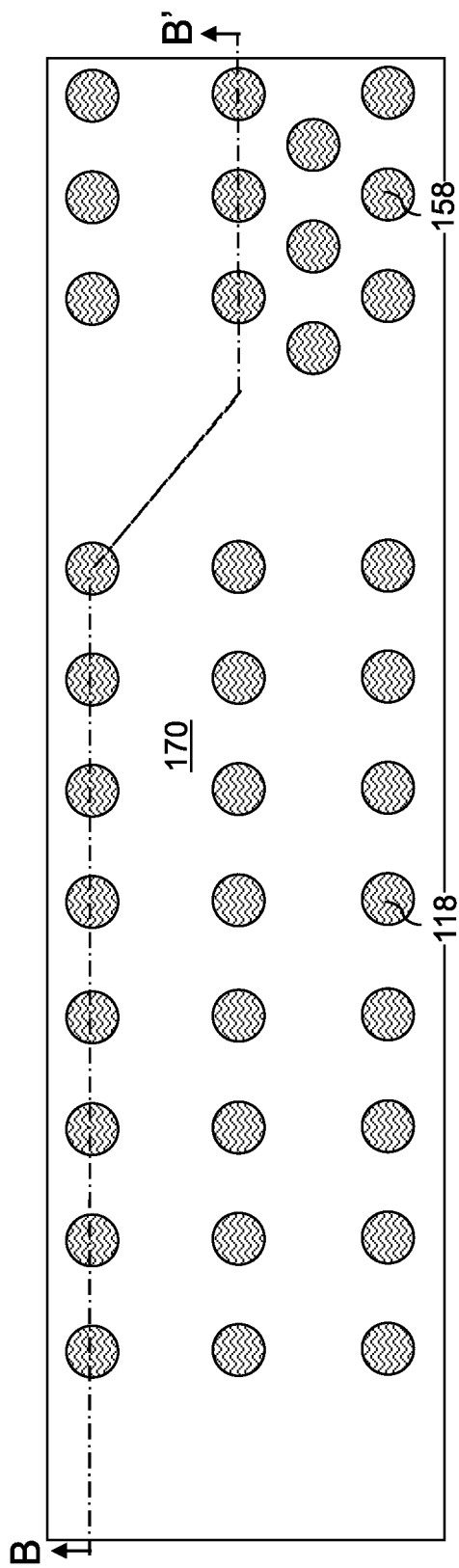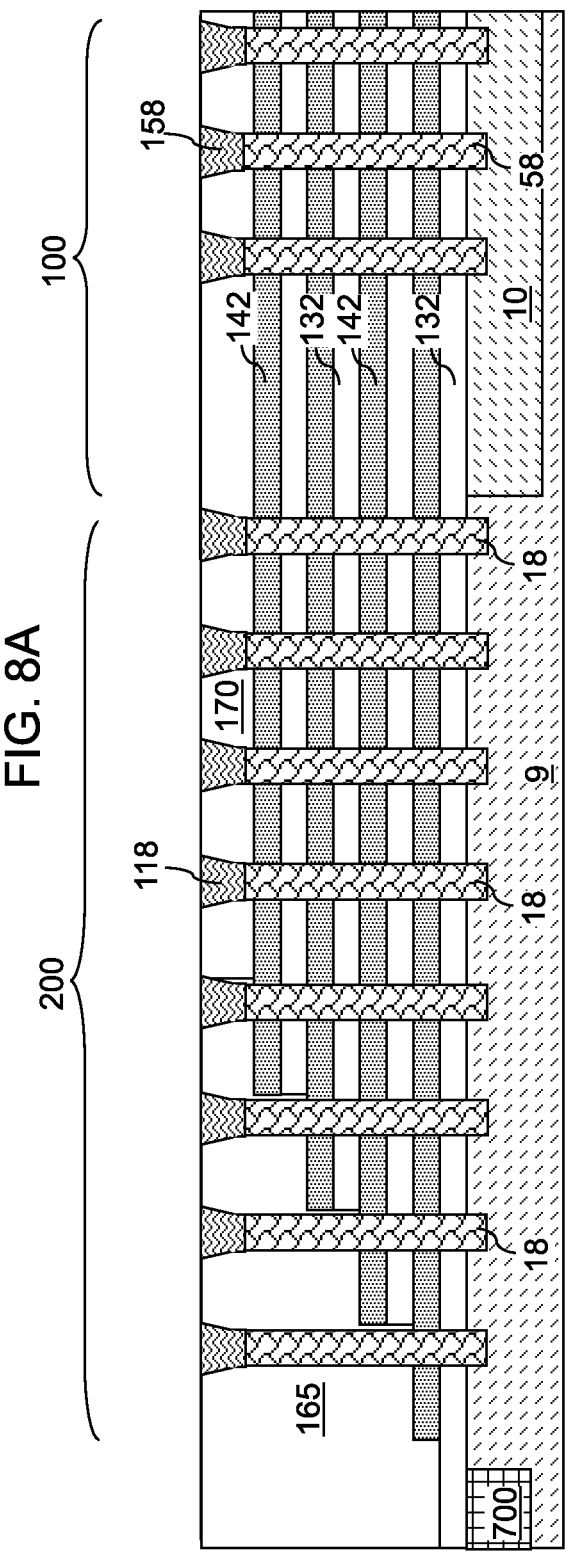

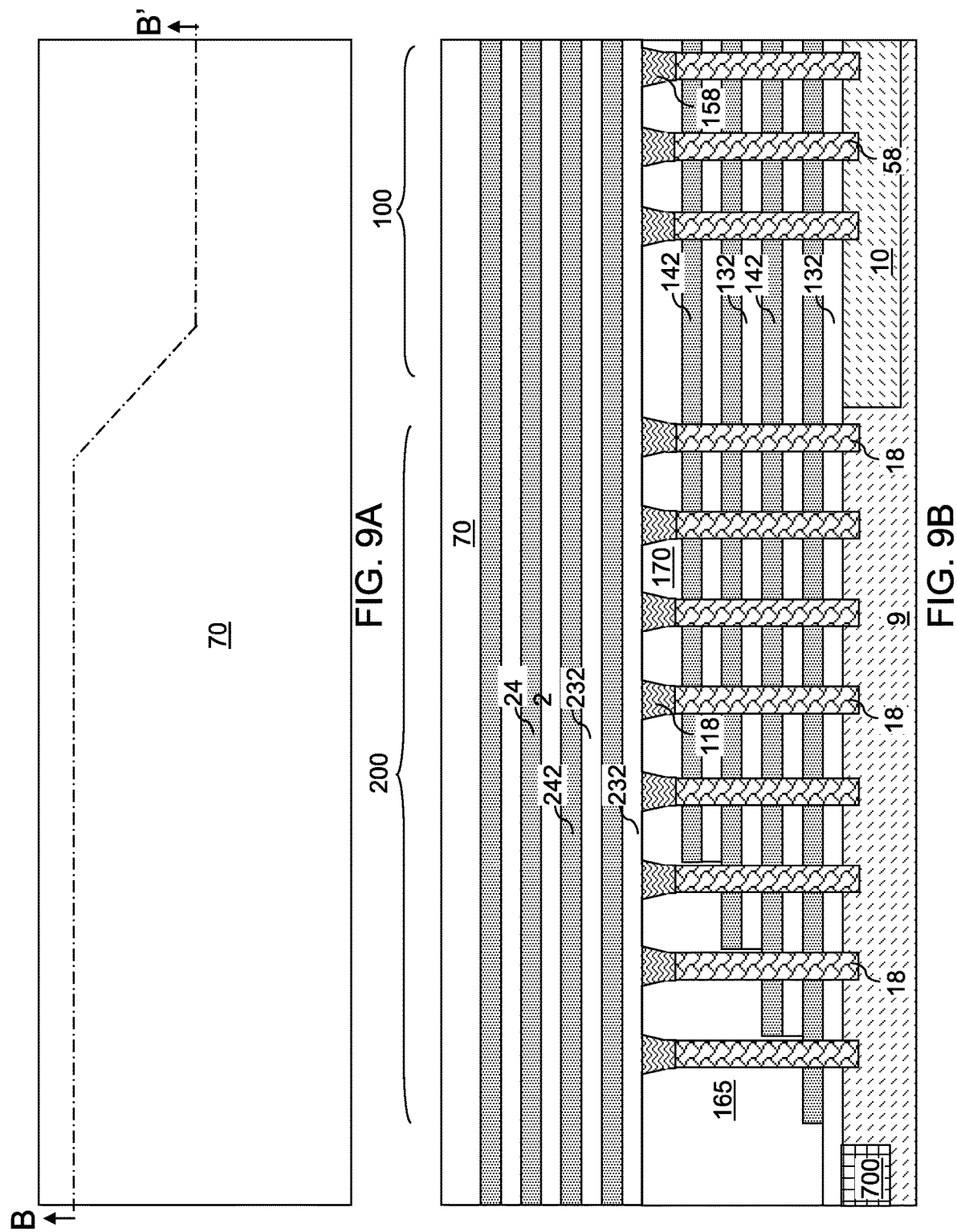

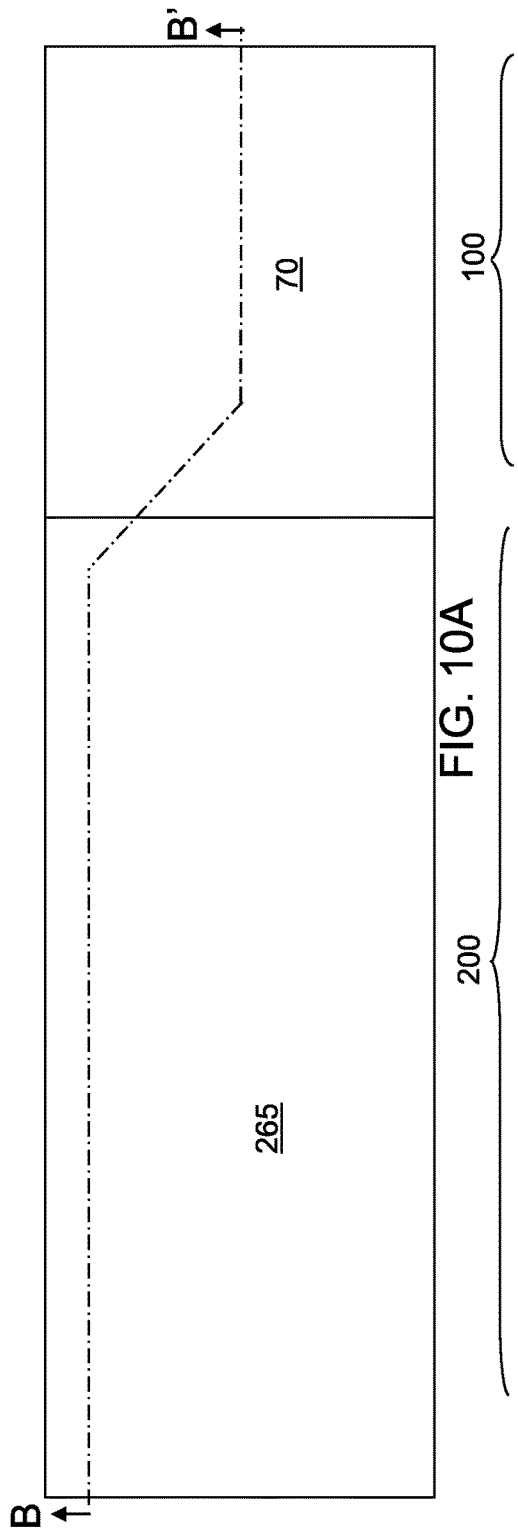
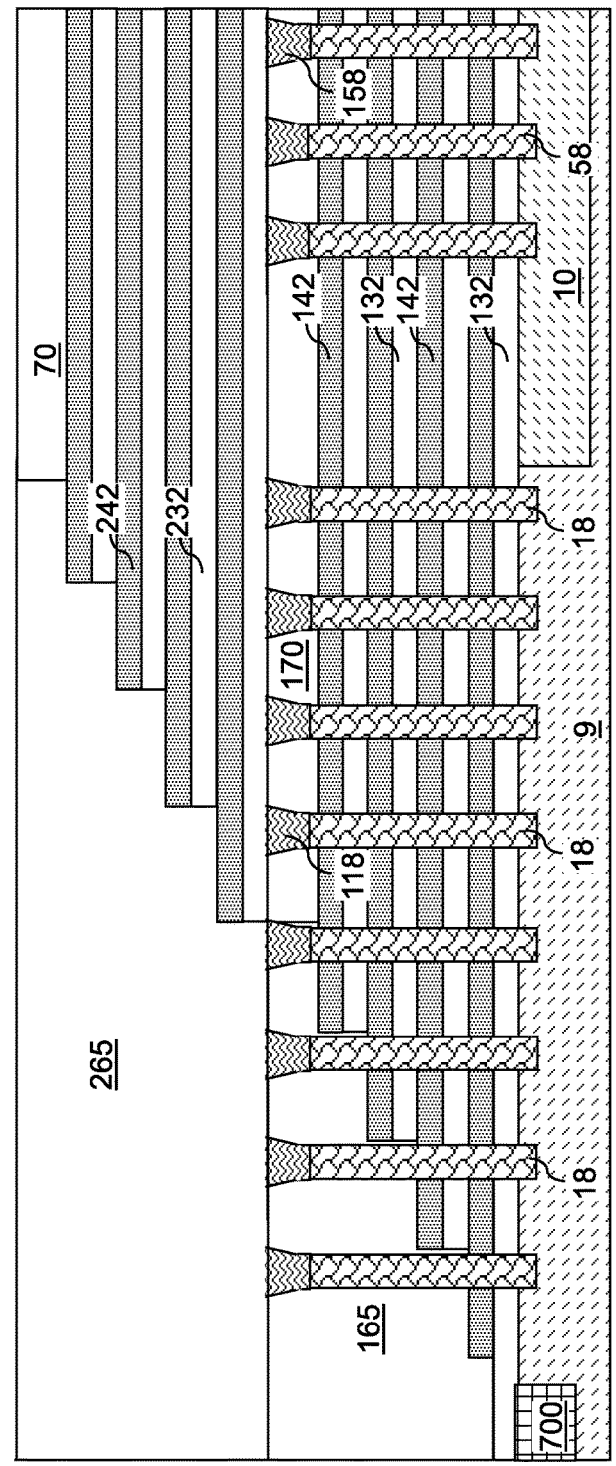
FIG. 10A
FIG. 10B

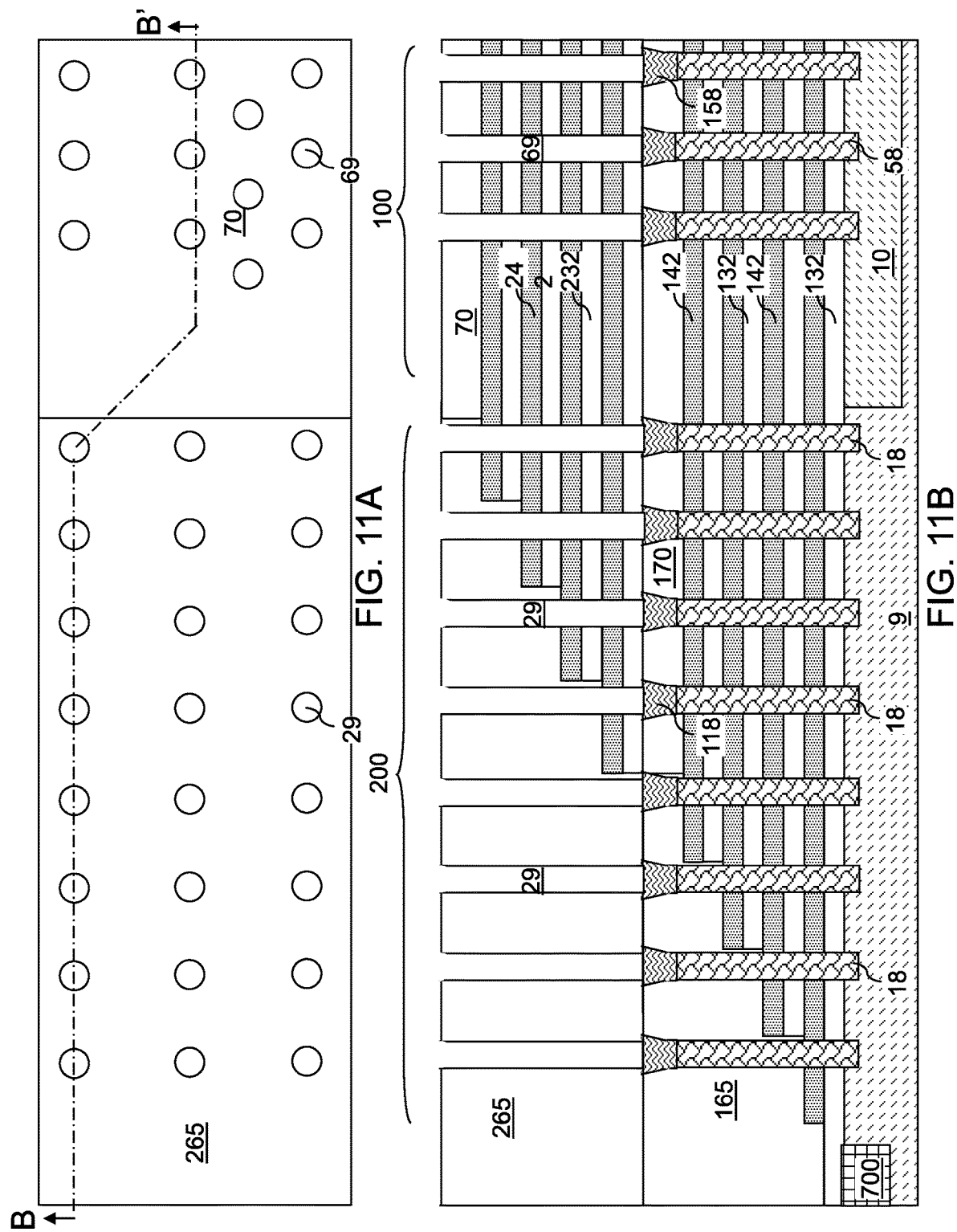

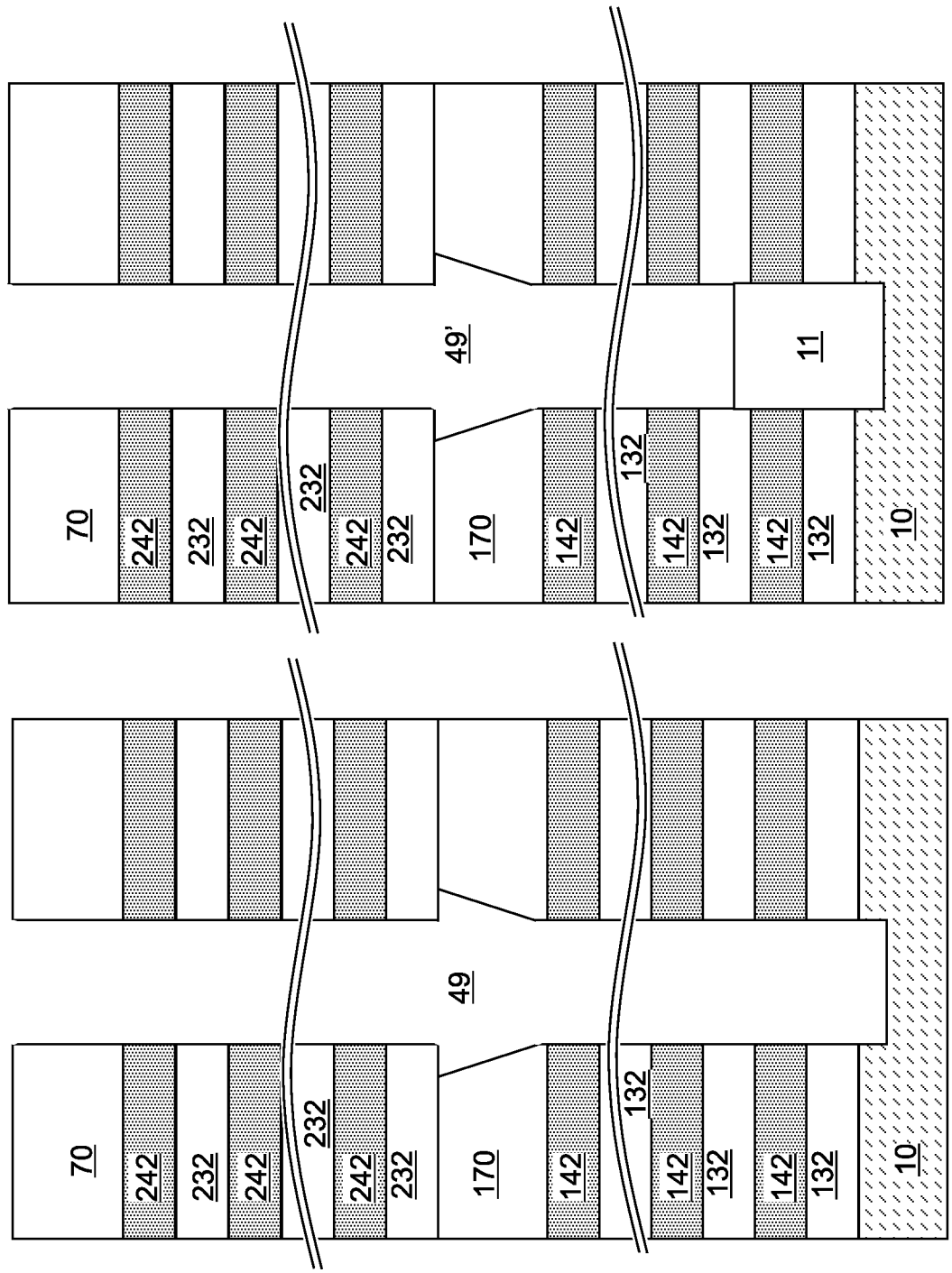

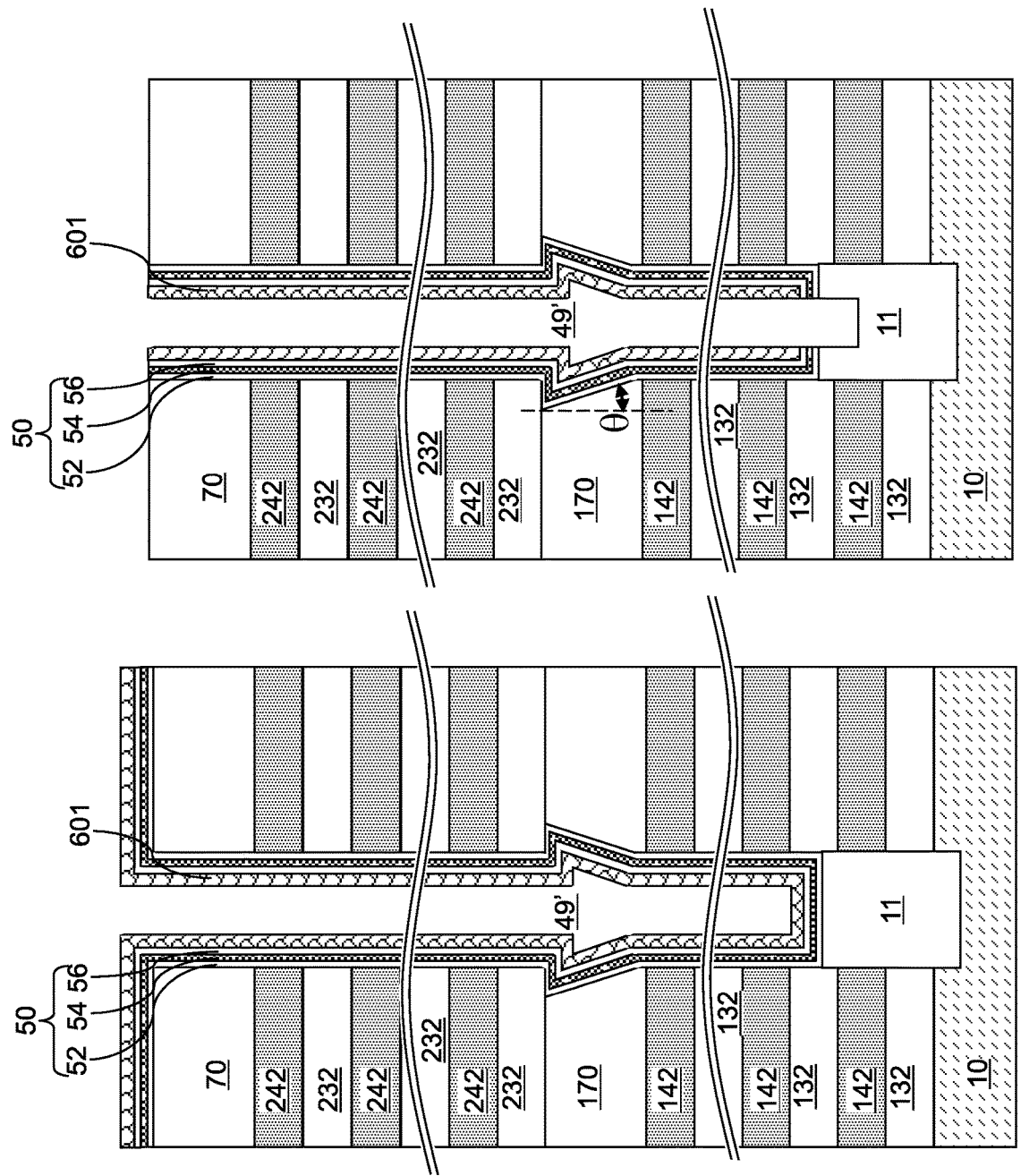

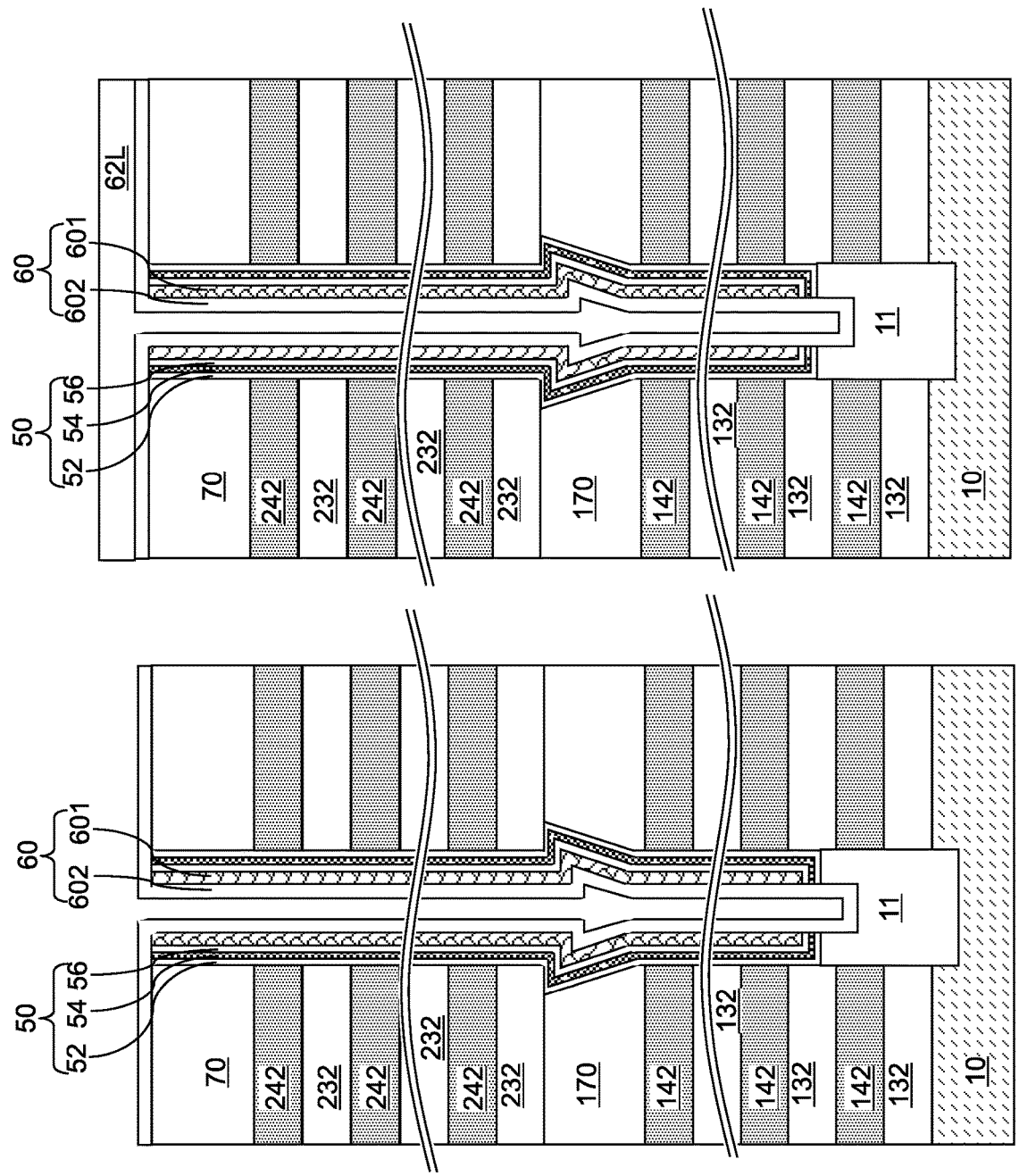

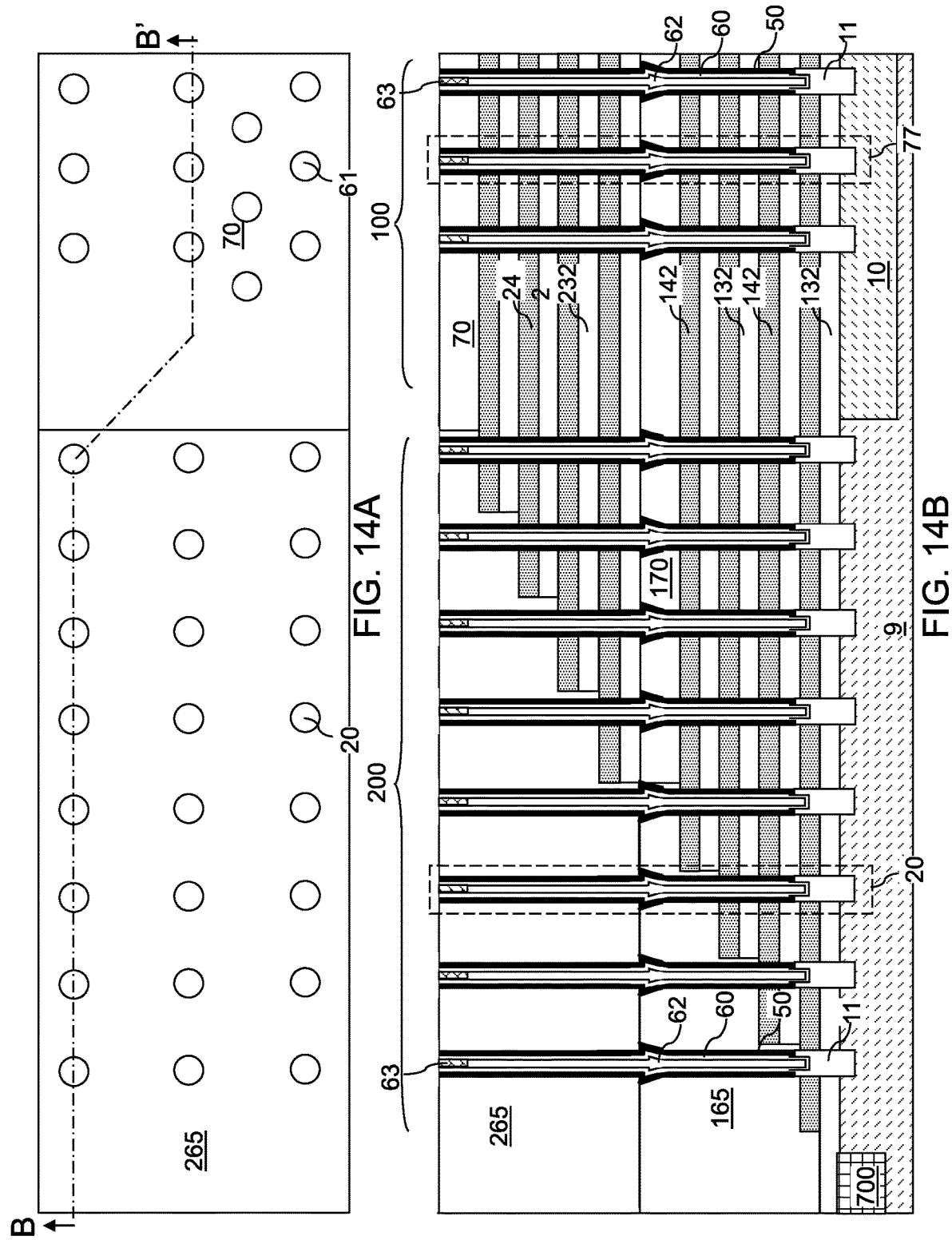

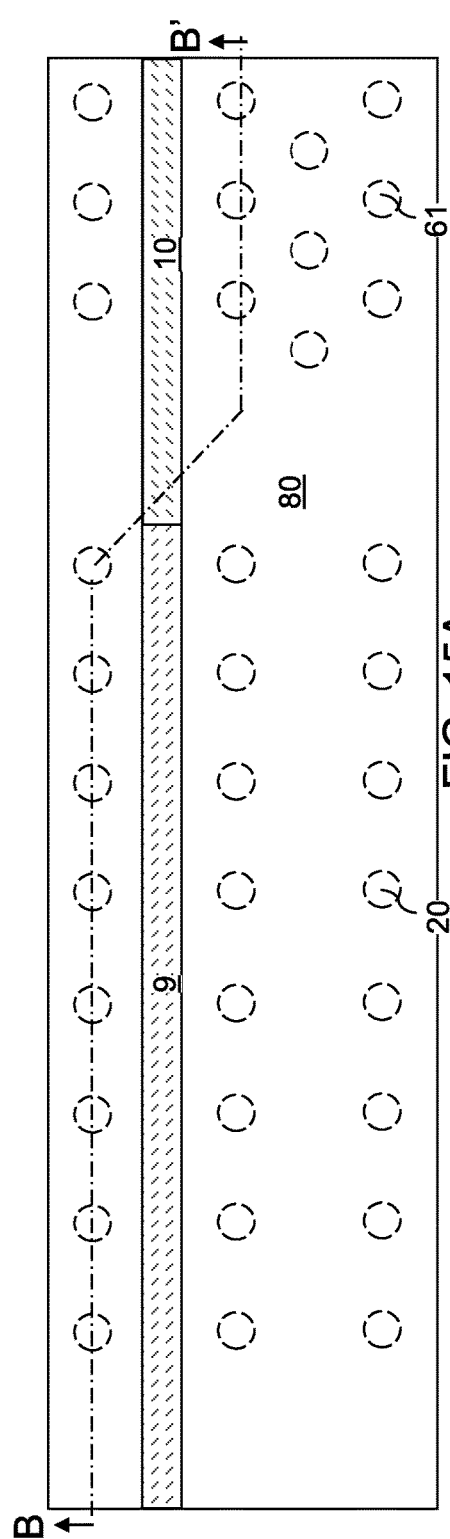
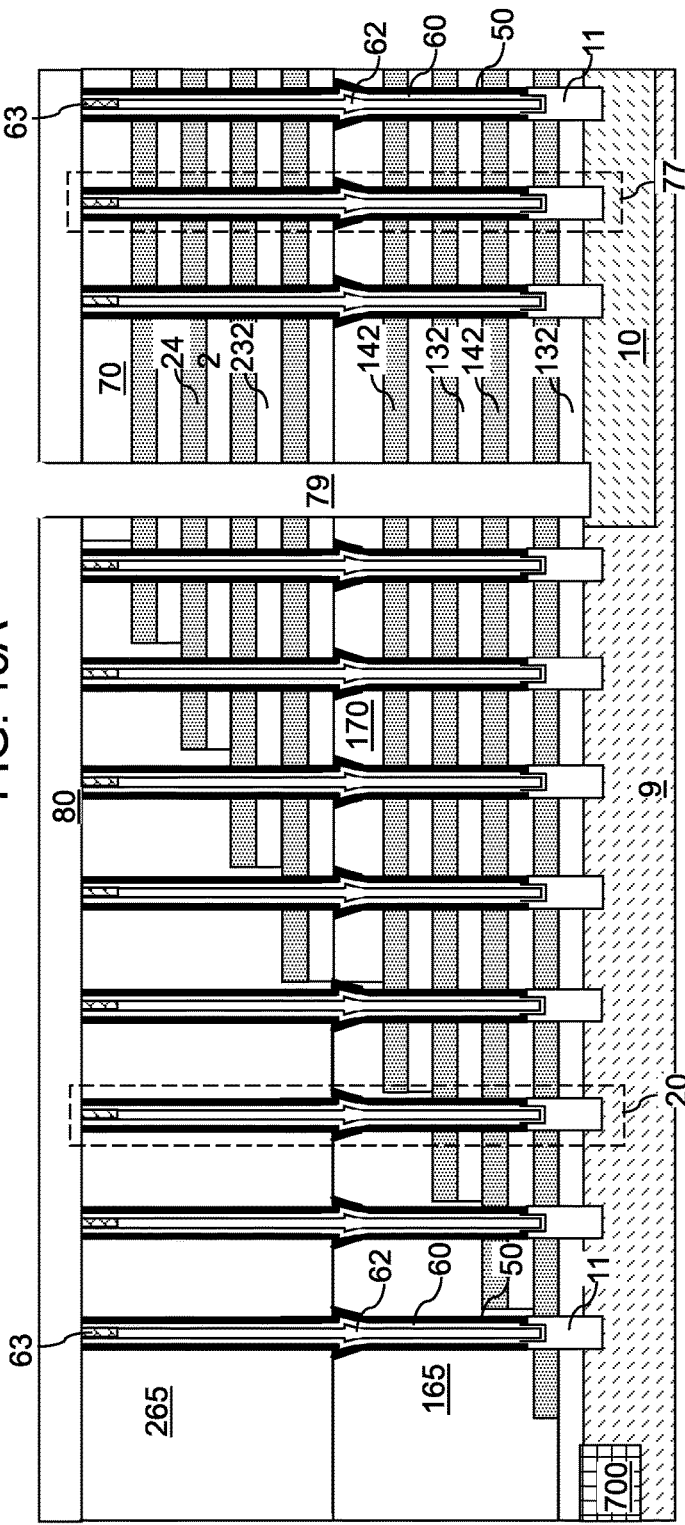
FIG. 15A
FIG. 15B

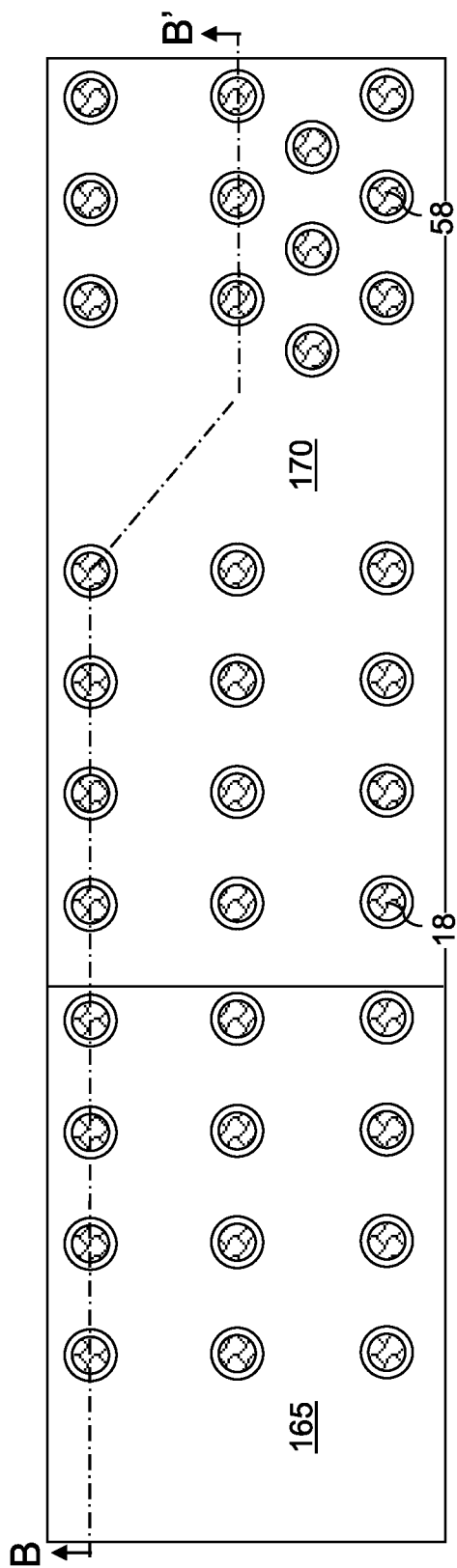
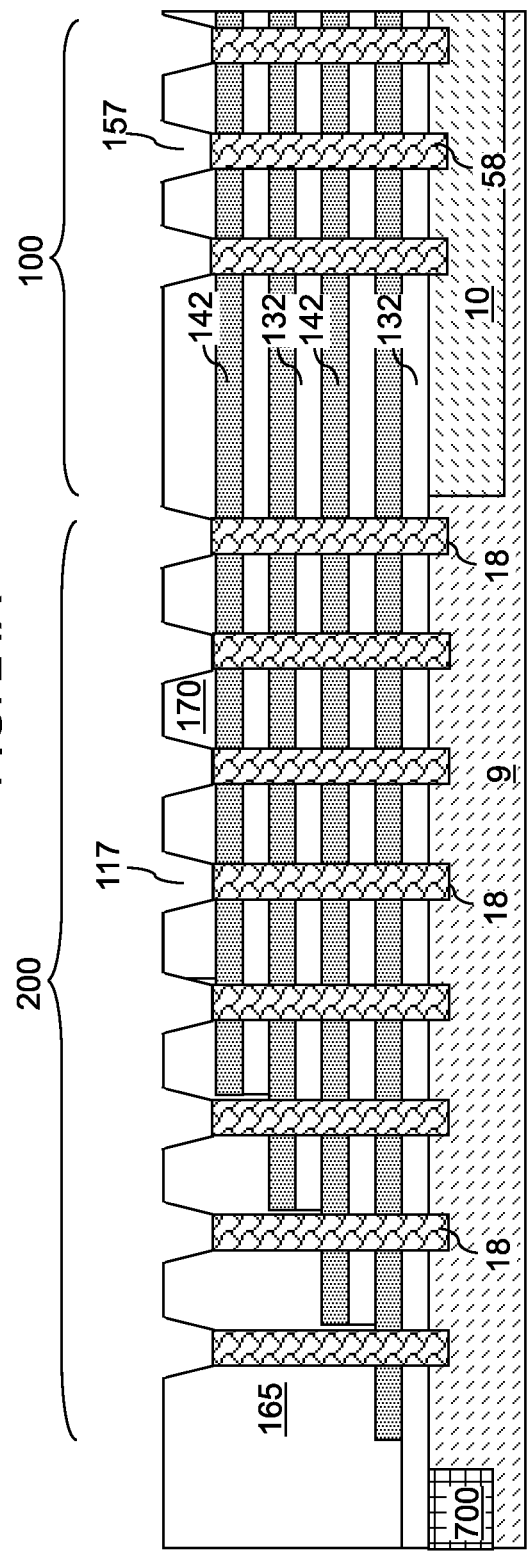
FIG. 24A
FIG. 24B

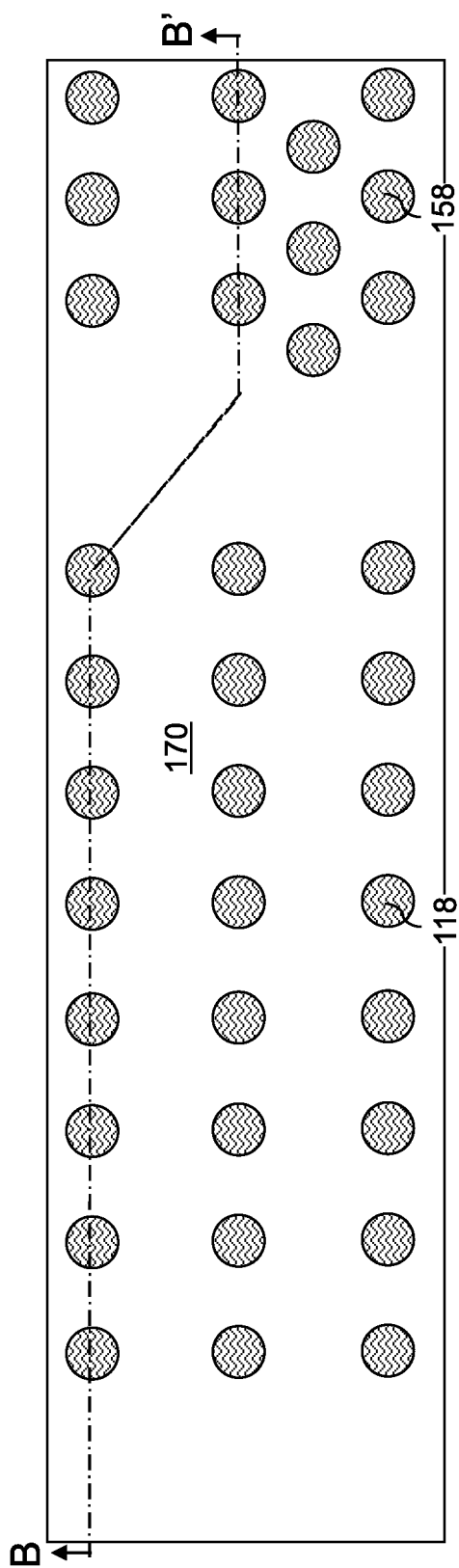
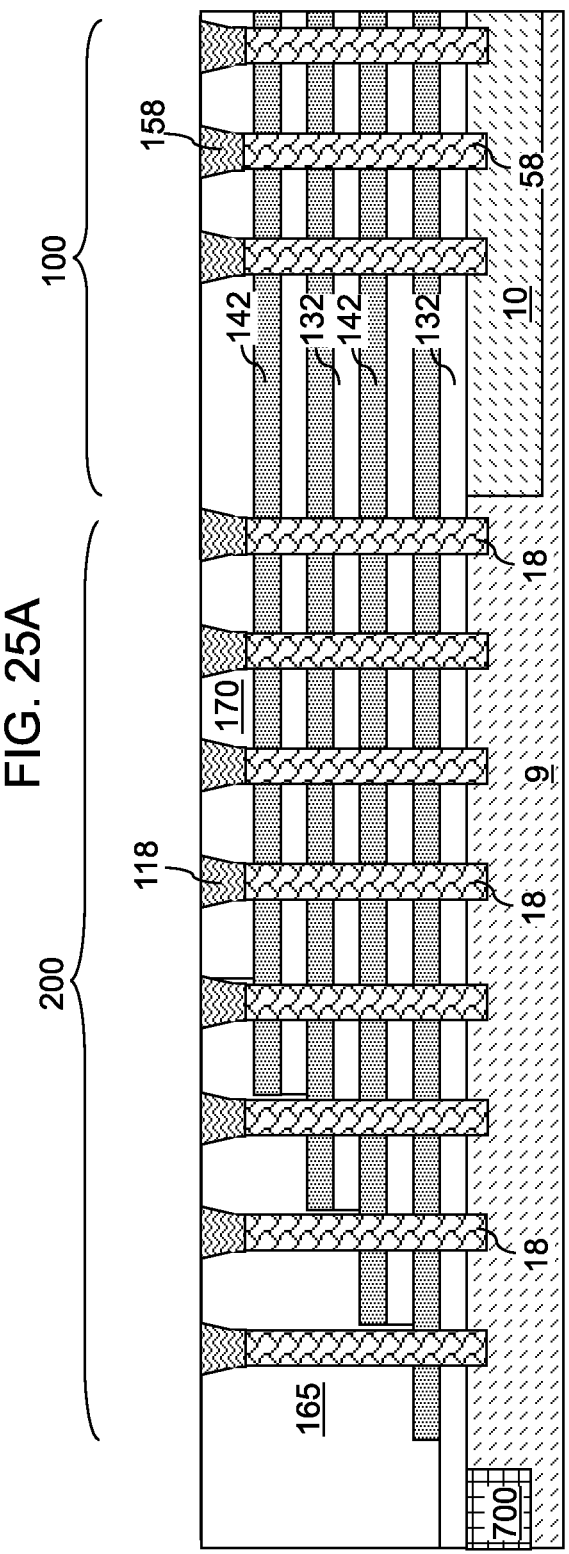
FIG. 25A
FIG. 25B

MULTILEVEL MEMORY STACK STRUCTURE WITH TAPERED INTER-TIER JOINT REGION AND METHODS OF MAKING THEREOF

FIELD

The present disclosure relates generally to the field of three-dimensional memory devices and specifically to three-dimensional memory devices including a tapered inter-tier joint region and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which includes a first alternating stack of first insulating layers and first electrically conductive layers and located over a substrate; a joint level dielectric material layer overlying the first alternating stack; a second alternating stack of second insulating layers and second electrically conductive layers and located over the joint level dielectric material layer; an inter-tier memory opening extending through the second alternating stack, the joint level dielectric material layer, and the first alternating stack; and a memory stack structure located within the inter-tier memory opening and comprising a memory film and a semiconductor channel. The memory film comprises a lower portion located adjacent to the first alternating stack, an upper portion located adjacent to the second alternating stack, and a joint portion located between the lower portion and the upper portion and adjacent to the joint level dielectric material layer. A tapered outer sidewall of the joint portion of the memory film contacts a tapered sidewall of the joint level dielectric material layer in the memory opening. An outer sidewall of the lower portion and an outer sidewall of the upper portion of the memory film are either untapered or have a smaller taper angle than a taper angle of the tapered outer sidewall of the joint portion of the memory film.

According to another aspect of the present disclosure, a method of forming a three-dimensional memory structure is provided. The method comprises the steps of: forming a first alternating stack of first insulating layers and first spacer material layers over a substrate; forming a joint level dielectric material layer over the first alternating stack; forming a first memory opening through the joint level dielectric material layer and the first alternating stack, wherein surfaces of the first memory opening includes a tapered sidewall of the joint level dielectric material layer; forming a second alternating stack of second insulating layers and second spacer material layers over the joint level dielectric material layer, wherein the first and second spacer material layers are formed as, or are subsequently replaced with, electrically conductive layers; forming an inter-tier memory opening that includes a volume of an second memory opening that extends through the second alternating stack and a volume of the first memory opening; and forming a memory stack structure within the inter-tier memory opening. The memory stack structure comprises a memory film and a semiconductor channel. A tapered outer sidewall of the memory film is formed directly on the tapered sidewall of the joint level dielectric material layer.

BRIEF DESCRIPTION OF THE DRAWINGS

FIG. 2A is a top-down view of the first exemplary structure after formation of first memory openings and first support openings according to the first embodiment of the present disclosure.

FIG. 2B is a vertical cross-sectional view of the first exemplary structure of FIG. 2A along the vertical plane B-B'.

FIG. 8A is a top-down view of the first exemplary structure after formation of retro-tapered sacrificial caps according to the first embodiment of the present disclosure.

FIG. 8B is a vertical cross-sectional view of the first exemplary structure of FIG. 8A along the vertical plane B-B'.

FIG. 9A is a top-down view of the first exemplary structure after formation of a second alternating stack of second insulating layers and second sacrificial material layers according to the first embodiment of the present disclosure.

FIG. 9B is a vertical cross-sectional view of the first exemplary structure of FIG. 9A along the vertical plane B-B'.

FIG. 10A is a top-down view of the first exemplary structure after formation of a second retro-stepped dielectric material portion according to the first embodiment of the present disclosure.

FIG. 10B is a vertical cross-sectional view of the first exemplary structure of FIG. 10A along the vertical plane B-B'.

FIG. 11A is a top-down view of the first exemplary structure after formation of second memory openings according to the first embodiment of the present disclosure.

FIG. 11B is a vertical cross-sectional view of the first exemplary structure of FIG. 11A along the vertical plane B-B'.

FIGS. 13A-13H are sequential vertical cross-sectional views of an inter-tier memory opening during formation of a pillar semiconductor channel portion, a memory stack structure, a dielectric core, and a drain region according to the first embodiment of the present disclosure.

FIG. 14A is a top-down view of the first exemplary structure after formation of memory stack structures according to the first embodiment of the present disclosure.

FIG. 14B is a vertical cross-sectional view of the first exemplary structure of FIG. 14A along the vertical plane B-B'.

FIG. 15A is a top-down view of the first exemplary structure after formation of a backside trench according to the first embodiment of the present disclosure.

FIG. 15B is a vertical cross-sectional view of the first exemplary structure of FIG. 15A along the vertical plane B-B'.

FIG. 24A is a top-down view of the third exemplary structure after vertically recessing the sacrificial fill material portions according to the third embodiment of the present disclosure.

FIG. 24B is a vertical cross-sectional view of the third exemplary structure of FIG. 24A along the vertical plane B-B'.

FIG. 25A is a top-down view of the third exemplary structure after formation of retro-tapered sacrificial caps according to the third embodiment of the present disclosure.

FIG. 25B is a vertical cross-sectional view of the first exemplary structure of FIG. 25A along the vertical plane B-B'.

DETAILED DESCRIPTION

As discussed above, the present disclosure is directed to three-dimensional memory devices including tapered inter-tier joint regions and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Figure 1:
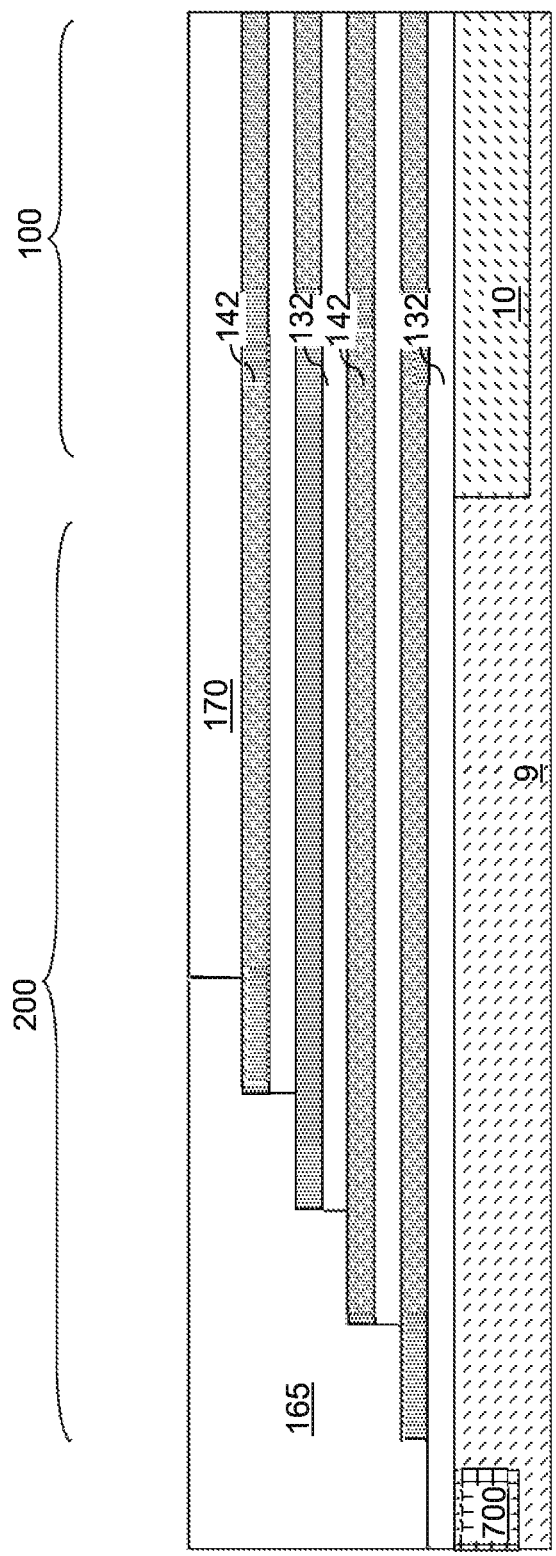
FIG. 1 is a vertical cross-sectional view of a first exemplary structure after formation of a first alternating stack of first insulating layers and first sacrificial material layers, a joint level dielectric material layer, first stepped surfaces, and a first retro-stepped dielectric material portion according to a first embodiment of the present disclosure.

Referring to FIG. 1, a first exemplary structure according to the first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 can be a semiconductor wafer or a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 9 can comprise a single crystalline semiconductor material, such as a single crystal silicon wafer.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to an electrically conductive material including at least one metal element therein. All measurements for electrical conductivities are made at the standard condition.

The first exemplary structure includes a device region 100, in which memory devices can be subsequently formed, and a contact region 200, in which stepped surfaces are subsequently formed. As used herein, a "contact region" refers to a region in which contact via structures are to be formed. At least one semiconductor device 700 for a peripheral circuitry can be formed in a peripheral device region, of which the general location is illustrated by a dotted rectangle (detailed structures not shown for clarity). The at least one semiconductor device 700 can include, for example, one or more field effect transistors. The least one semiconductor device for the peripheral circuitry can contain a driver circuit for memory devices to be subsequently formed, which can include at least one NAND device.

Optionally, a semiconductor material layer 10 can be provided in an upper portion of the substrate. The semiconductor material layer 10 can be formed, for example, by implantation of electrical dopants (p-type dopants or n-type dopants) into an upper portion of the substrate semiconductor layer 9, or by deposition of a single crystalline semiconductor material, for example, by selective epitaxy. In one embodiment, the semiconductor material layer 10 can include a single crystalline semiconductor material (e.g., p-well) that is in epitaxial alignment with the single crystalline structure of the substrate semiconductor layer 9.

An alternating stack of first material layers and second material layers is subsequently formed. Each first material layer can include a first material, and each second material layer can include a second material that is different from the first material. The alternating stack is herein referred to as a first alternating stack. In one embodiment, the first alternating stack can include first insulating layers 132 and first spacer material layers. The first spacer material layers can be electrically conductive layers that do not require subsequent replacement with another material, or sacrificial material layers that require subsequent replacement with respective electrically conductive layers. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first alternating stack (132, 142), or a lower alternating stack (132, 142). In this case, the stack can include an alternating plurality of first insulating layers 132 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A joint level dielectric material layer 170 can be formed over the first alternating stack (132, 142). The joint level dielectric material layer 170 is a dielectric material layer that is formed at a joint level, which is a level between a lower stack structure including the first alternating stack (132, 142) and an upper stack structure to be subsequently formed. The joint level dielectric material layer 170 includes a dielectric material such as silicon oxide. For example, the joint level dielectric material layer 170 can include an undoped silicon oxide from a precursor other than tetraethylorthosilicate (TEOS), such as silicon oxide deposited by plasma enhanced chemical vapor deposition (PECVD) from a silane or dichlorosilane precursor. The thickness of the joint level dielectric material layer 170 can be in a range from 50 nm to 1,000 nm, although lesser and greater thicknesses can also be employed.

The first alternating stack (132, 142) can be patterned to form first stepped surfaces. The first stepped surfaces are formed in the contact region 200. The contact region 200 includes a first stepped area in which the first stepped surfaces are formed, and a second stepped area in which additional stepped surfaces are to be subsequently formed in an upper stack structure (to be subsequently formed). The device region 100 is provided adjacent to the contact region 200. Memory devices including memory stack structures can be subsequently formed in the device region 100. The first stepped surfaces can be formed, for example, by forming a mask layer with an opening therein, etching a cavity within the levels of the joint level dielectric material layer 170, and iteratively expanding the etched area and vertically recessing the cavity by etching each pair of a first insulating layer 132 and a first sacrificial material layer 142 located directly underneath the bottom surface of the etched cavity within the etched area. The first alternating stack (132, 142) is patterned such that each underlying first sacrificial material layer 142 laterally protrudes farther than any overlying first sacrificial material layer 142 in the etched region, and each underlying first insulating layer 132 laterally protrudes farther than any overlying first insulating layer 132 in the etched region. The contact region can be a contact region of the first alternating stack (132, 142). The cavity is herein referred to as a first stepped cavity.

A dielectric material is deposited to fill the first stepped cavity. Excess portions of the dielectric material overlying the topmost surface of the first alternating stack (132, 142), are removed for example, by chemical mechanical planarization. The remaining portion of the deposited dielectric material forms a first retro-stepped dielectric material portion 165, which is formed on the first stepped surfaces. The first dielectric material portion 165 is retro-stepped. As used herein, a "retro-stepped" element refers to an element that has stepped surfaces and a horizontal cross-sectional area that increases monotonically as a function of a vertical distance from a top surface of a substrate on which the element is present.

Referring to FIGS. 2A and 2B, an optional sacrificial dielectric material layer 172 can be formed over the joint level dielectric material layer 170. If present, the sacrificial dielectric material layer 172 includes a dielectric material that can be removed selective to the joint level dielectric material layer 170. For example, the sacrificial dielectric material layer 172 can include an undoped or doped (e.g., boron and/or phosphorus doped) silicon oxide from a tetraethylorthosilicate (TEOS) precursor, a doped silicate glass such as borosilicate glass or a borophosphosilicate glass, an organosilicate glass, or silicon nitride. The thickness of the sacrificial dielectric material layer 172 can be in a range from 30 nm to 1,000 nm, although lesser and greater thicknesses can also be employed.

First memory openings 67 and optional first support openings 19 can be formed through the optional sacrificial dielectric material layer 172, the joint level dielectric material layer 170, the first alternating stack (132, 142), and the first retro-stepped dielectric material portion 165. The first memory openings 67 can be formed in the device region 100, and can extend to a top surface of the substrate (9, 10). Each of the first memory openings 67 can extend through the joint level dielectric material layer 170. The first support openings 19 can be formed in the contact region 200, and can extend to the top surface of the substrate (9, 10). At least a subset of the first support openings 19 can extend through the first retro-stepped dielectric material portion 165.

The first memory openings 67 and optional first support openings 19 can be formed by a combination of lithographic patterning and an anisotropic etch. For example, a lithographic material stack (not shown) including at least a photoresist layer can be formed over the first alternating stack (132, 142), and can be lithographically patterned to form openings within the lithographic material stack. The pattern in the lithographic material stack can be transferred through the entirety of the first alternating stack (132, 142) by at least one anisotropic etch that employs the patterned lithographic material stack as an etch mask. Transfer of the pattern in the patterned lithographic material stack through the optional sacrificial dielectric material layer 172, the joint level dielectric material layer 170, the first alternating stack (132, 142), and the first retro-stepped dielectric material portion 165 forms the first memory openings 67 and the first support openings 19.

In one embodiment, the chemistry of the anisotropic etch process employed to etch through the materials of the first alternating stack (132, 142) can alternate to optimize etching of the first and second materials in the first alternating stack (132, 142) while providing a comparable average etch rate for the first dielectric material portion 165. The anisotropic etch can be, for example, a series of reactive ion etches. The sidewalls of the first memory openings 67 can be substantially vertical, or can be tapered. Subsequently, the patterned lithographic material stack can be subsequently removed, for example, by ashing.

In one embodiment, the substrate (9, 10) can be employed as a stopping layer for the anisotropic etch process. In one embodiment, the first memory openings 67 may extend below the top surface of the substrate (9, 10) by an overetch. The lateral dimensions (e.g., a diameter) of the first memory openings 67 can be from about 20 nm to 200 nm at an upper portion of each first memory opening 67, and can be about 10 nm to 150 nm at a lower portion of each first memory opening 67. In one embodiment, the first memory openings 67 can be formed as an array of openings, which can be a periodic two-dimensional array of openings.

The first memory openings 67 are in-process structures, which are subsequently modified to provide tapered sidewalls at a respective top portion. As used herein, an "in-process" structure refers to a structure that is subsequently modified or removed in a subsequent processing step. In one embodiment, the sidewalls of the joint level dielectric material layer 170 can be substantially vertical at this process step. As used herein, a surface is substantially vertical if the surface does not deviate from a vertical direction by more than 3 degrees.

Figure 3A:
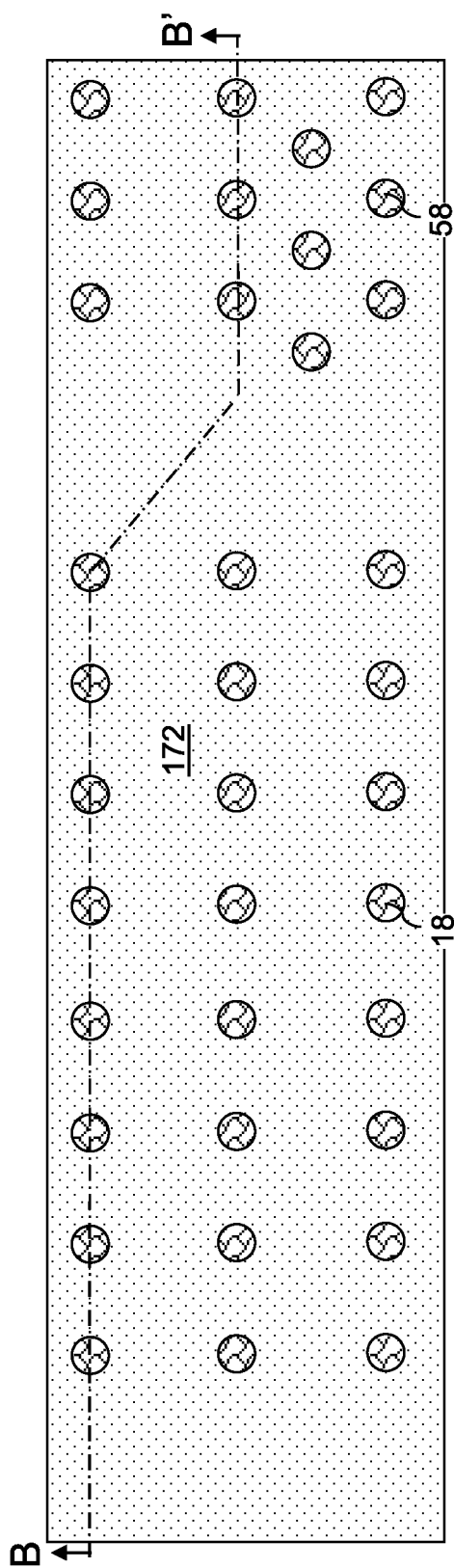
FIG. 3A is a top-down view of the first exemplary structure after formation of sacrificial fill material portions according to the first embodiment of the present disclosure.
Figure 3B:
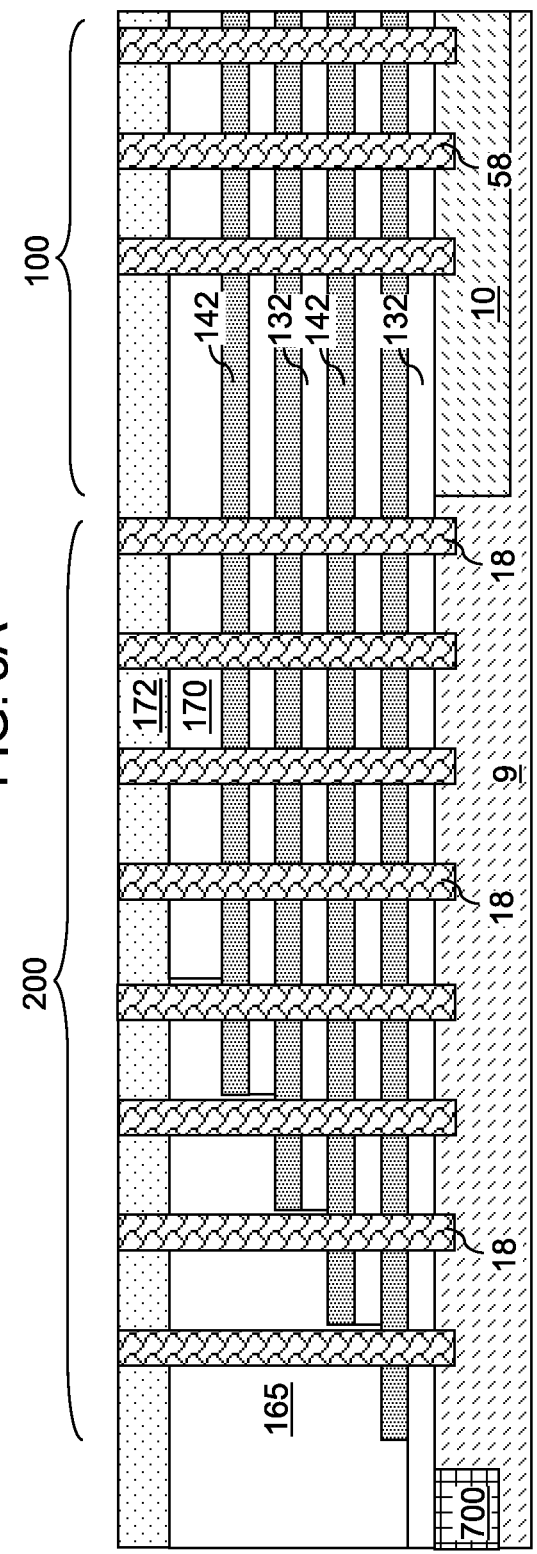
FIG. 3B is a vertical cross-sectional view of the first exemplary structure of FIG. 3A along the vertical plane B-B'.

Referring to FIGS. 3A and 3B, sacrificial fill material portions (58, 18) can be formed in the first memory openings 67 and the first support openings 19, for example, by deposition of a sacrificial fill material in the first memory openings 67 and the first support openings 19, and by removal of excess portions of the sacrificial fill material from above the top surface of the sacrificial dielectric material layer 172 (or from above the joint level dielectric material layer 170 in case the sacrificial dielectric material layer 172 is omitted). The sacrificial fill material includes a material that can be subsequently removed selective to the materials of the joint level dielectric material layer 170, the first alternating stack (132, 142), and the substrate (9, 10). For example, the sacrificial fill material may include amorphous silicon, a silicon-germanium alloy, a carbon-containing material (such as amorphous carbon, diamond-like carbon (DLC), or an organic material that can be subsequently removed by ashing), or porous or non-porous organosilicate glass. The sacrificial fill material portions (58, 18) can include memory opening fill material portions 58 that fill the first memory openings 67 and support opening fill material portions 18 that fill the first support openings 19.

Figure 4A:
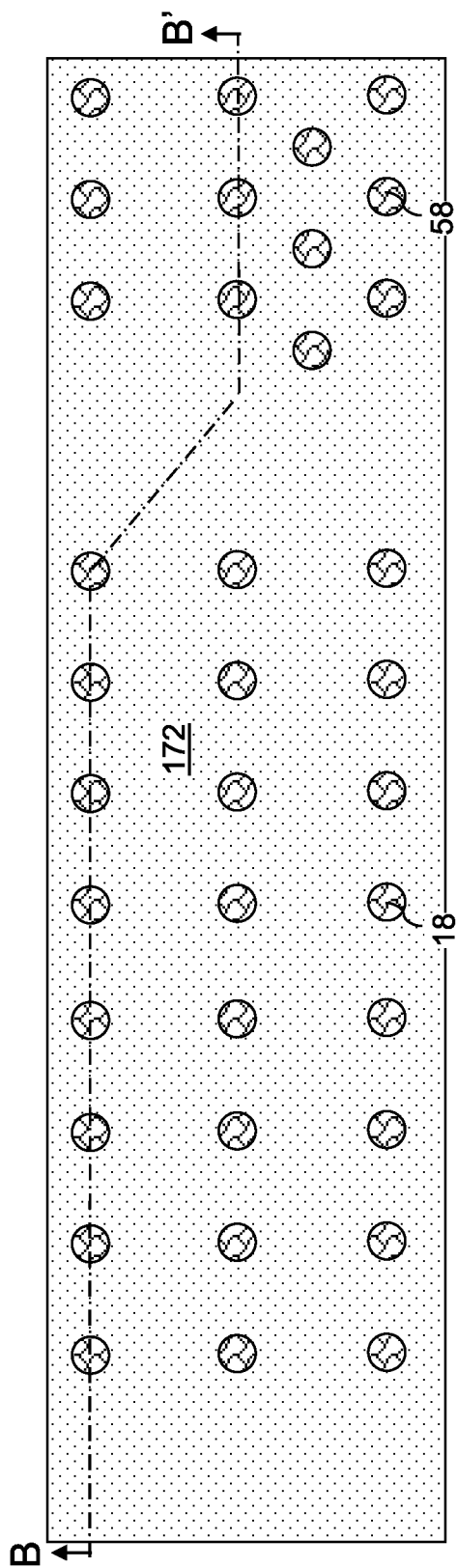
FIG. 4A is a top-down view of the first exemplary structure after vertically recessing the sacrificial fill material portions according to the first embodiment of the present disclosure.
Figure 4B:
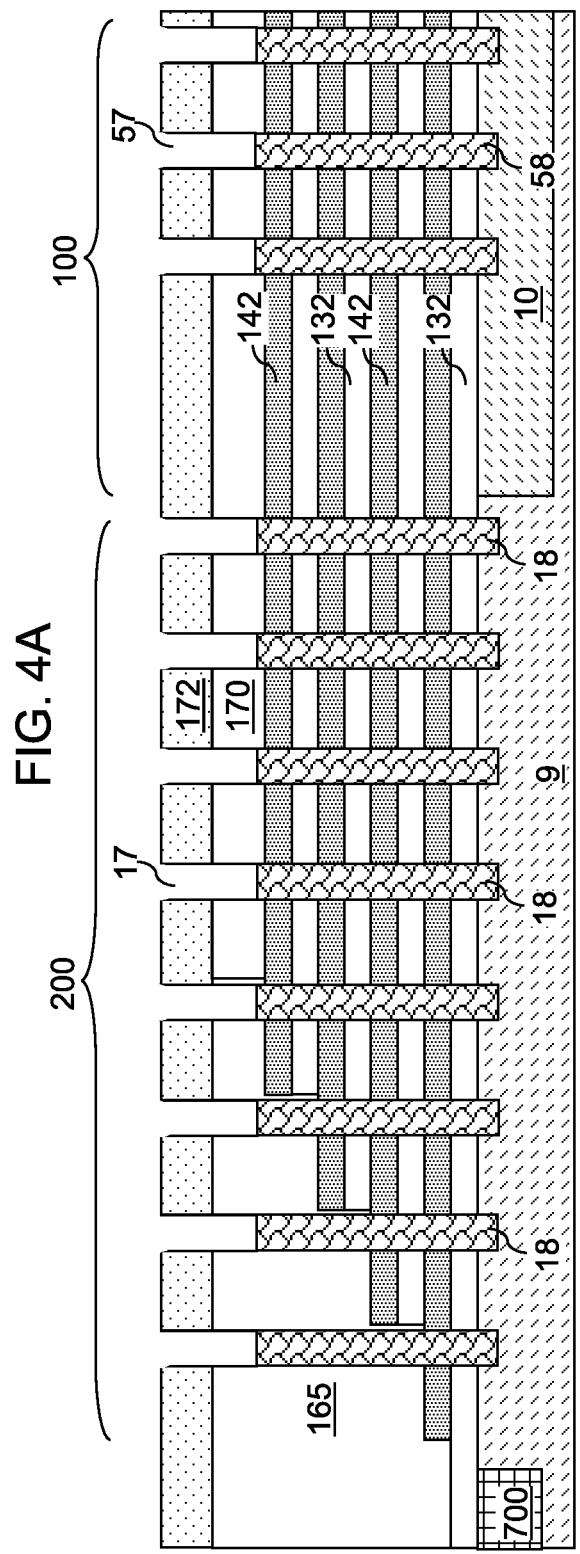
FIG. 4B is a vertical cross-sectional view of the first exemplary structure of FIG. 4A along the vertical plane B-B'.

Referring to FIGS. 4A and 4B, the sacrificial fill material portions (58, 18) are vertically recessed to physically expose the substantially vertical sidewalls of the joint level dielectric material layer 170 at upper portions of the in-process first memory openings 67 and at upper portions of the in-process first support openings 19. An isotropic etch or an anisotropic etch process can be employed to vertically recess top surfaces of the sacrificial fill material portions (58, 18). A memory recess cavity 57 is formed in each volume from which an upper portion of a memory opening fill material portion 58 is etched, and a support recess cavity 17 is formed in each volume from which an upper portion of a support opening fill material portion 18 is etched. In one embodiment, the recessed top surfaces of the sacrificial fill material portions (58, 18) can be at a lower portion of the sidewalls of the joint level dielectric material layer 170, or at the interface between the joint level dielectric material layer 170 and the topmost layer of the first alternating stack (132, 142).

A memory opening fill material portion 58 is present within each in-process first memory opening 67. A support opening fill material portion 18 is present within each in-process first support opening 19. The sacrificial fill material portions (58, 18) protect sidewalls of the first insulating layers 132 and the first spacer material layers 142 during a subsequent etch process that is employed to etch substantially vertical sidewall of the joint level dielectric material layer 170.

Figure 5A:
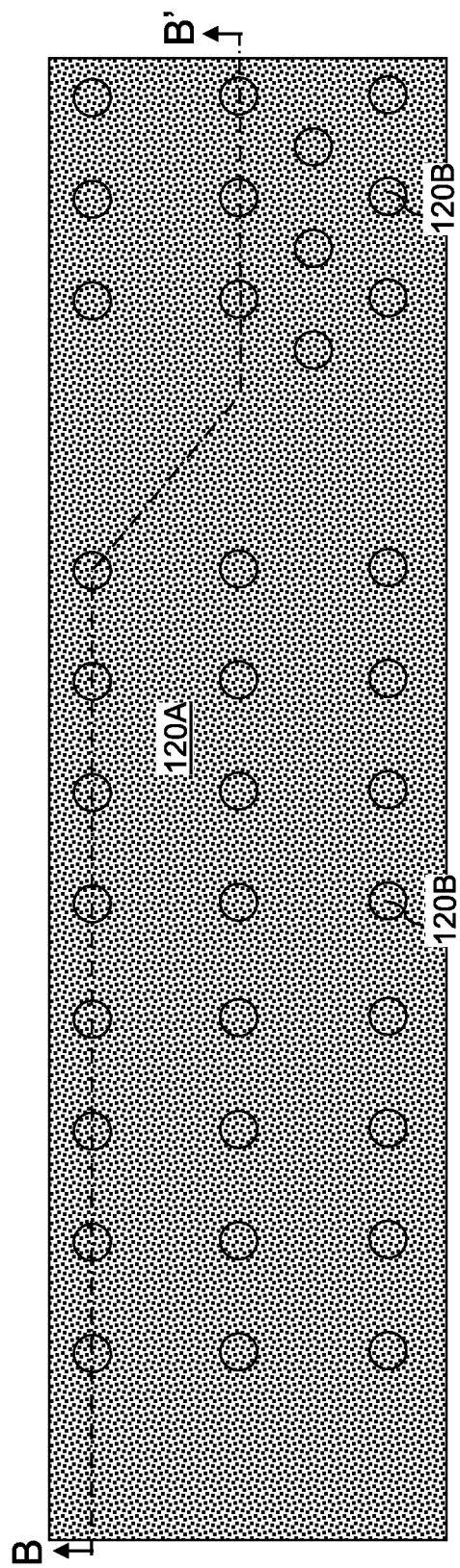
FIG. 5A is a top-down view of the first exemplary structure after anisotropic deposition of a photoresist material as a patterning film according to the first embodiment of the present disclosure.
Figure 5B:
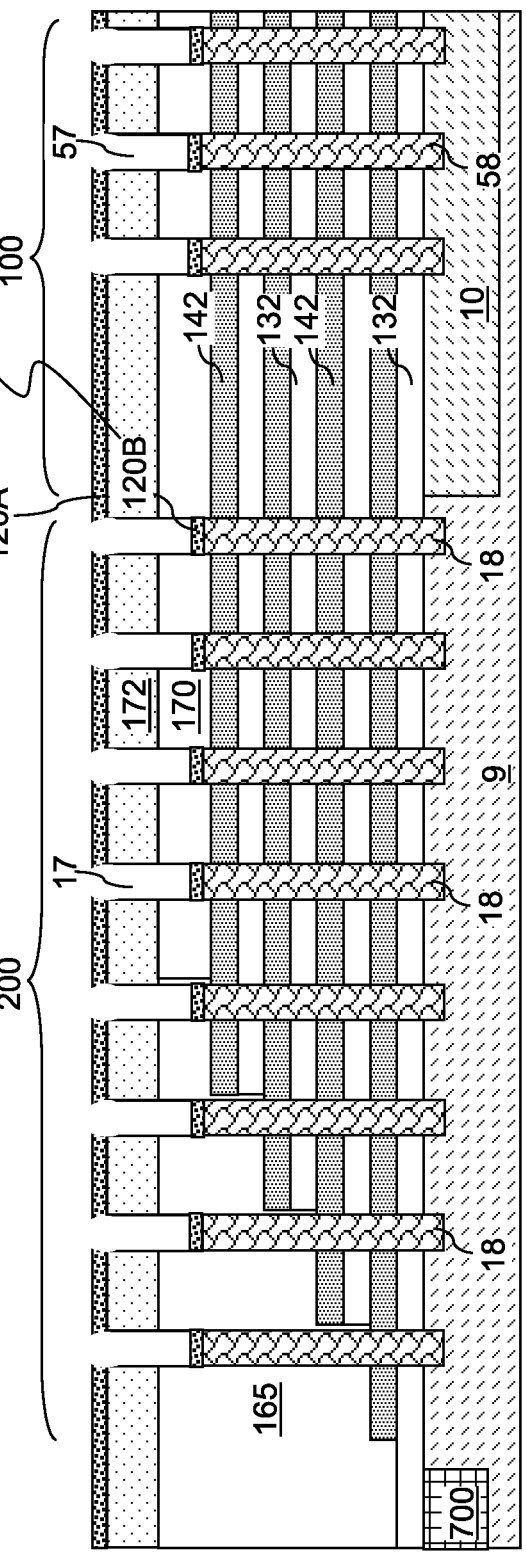
FIG. 5B is a vertical cross-sectional view of the first exemplary structure of FIG. 5A along the vertical plane B-B'.

Referring to FIGS. 5A and 5B, a patterning film 120 can be deposited employing an anisotropic deposition method. In one embodiment, the patterning film 120 can include a photoresist material or other lithographic patterning films such as amorphous carbon (e.g., Advanced Patterning Film (APF™) available from Applied Materials, Inc.). The material of the patterning film 120 can be anisotropically applied, i.e., applied with directionality, such that the deposited material of the patterning film 120 impinges on the first exemplary structure predominantly along a downward vertical direction. For example, plasma enhanced chemical vapor deposition (PECVD) or physical vapor deposition may be employed to deposit the patterning film 120. The patterning film 120 can be formed as a continuous patterning film layer 120A on a top surface of the sacrificial dielectric material layer 172 (or on a top surface of the joint level dielectric material layer 170 if the sacrificial dielectric material layer 172 is not present), and as discrete patterning film portions 120B in the recess cavities (57, 17) on top surfaces of the respective sacrificial fill material portions (58, 18). The thickness of the continuous patterning film layer 120A can be in a range from 10 nm to 300 nm, although lesser and greater thicknesses can also be employed. The substantially vertical sidewalls of the joint level dielectric material layer 170 may be free of the patterning film 120, or may have a negligible amount of the patterning film 120 thereupon.

Figure 6A:
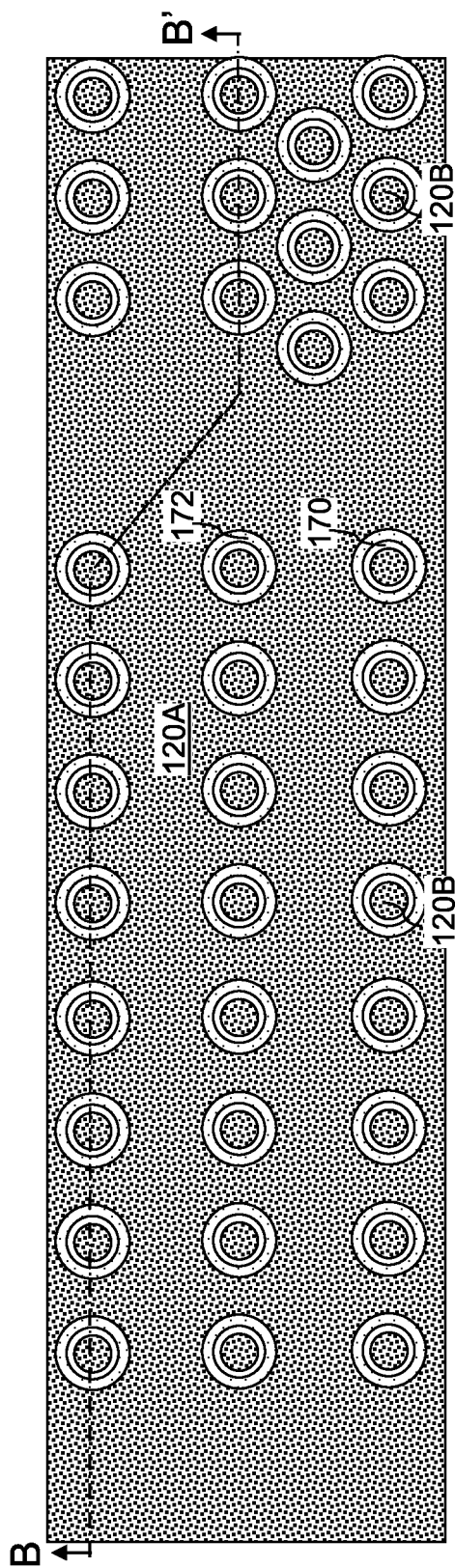
FIG. 6A is a top-down view of the first exemplary structure after an aspect-ratio-dependent anisotropic etch to form tapered sidewalls according to the first embodiment of the present disclosure.
Figure 6B:
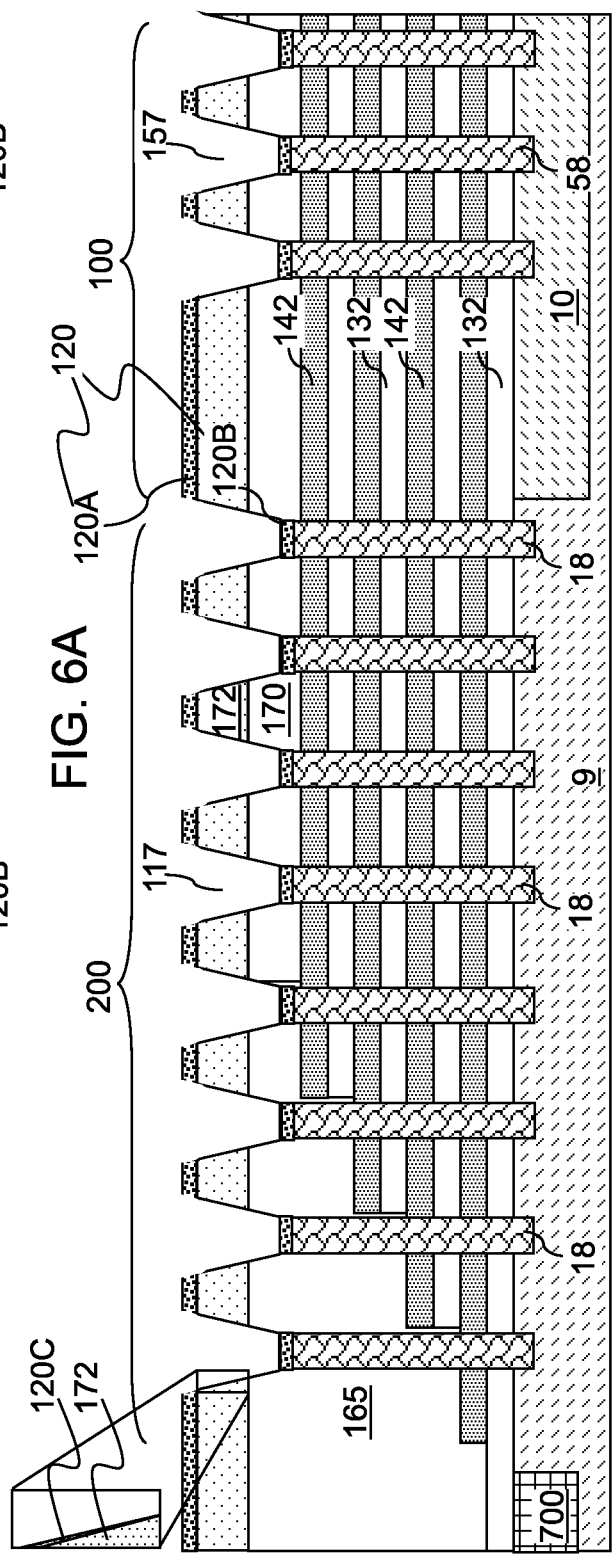
FIG. 6B is a vertical cross-sectional view of the first exemplary structure of FIG. 6A along the vertical plane B-B'.

Referring to FIGS. 6A and 6B, an aspect-ratio-dependent anisotropic etch is performed to form tapered sidewalls on the joint level dielectric material layer 170. If the sacrificial dielectric material layer 172 is present over the joint level dielectric material layer, the aspect-ratio-dependent anisotropic etch forms additional tapered sidewalls on the sacrificial dielectric material layer 172.

An "aspect-ratio-dependent anisotropic etch" is an anisotropic etch in which the etch rate depends on the aspect ratio of a volume through which an etchant is provided. Thus, a region that is readily accessed by the etchant has a higher etch rate than a region that is not readily accessed by the etchant in an aspect-ratio-dependent anisotropic etch. For example, the first exemplary structure can be loaded into a processing chamber such that the substrate (9, 10) is supported by a chuck and the patterning film 120 faces a showerhead from which a gas phase etchant is supplied. In this case, the aspect ratio-dependent anisotropic etch process can provide a height-dependent lateral etch distance that increases with the vertical distance from a top surface of the substrate (9, 10). In other words, the etch rate at portions of the sacrificial dielectric material layer 172 and the joint level dielectric material layer 170 that are more proximal to the showerhead, and thus, more proximal to the continuous patterning film layer 120A of the patterning film 120 is greater than the etch rate at portions of the sacrificial dielectric material layer 172 and the joint level dielectric material layer 170 that are less proximal to the showerhead, and thus, less proximal to the continuous patterning film layer 120A of the patterning film 120.

In one embodiment, the sacrificial dielectric material layer 172 and the joint level dielectric material layer 170 can include silicate glasses (e.g., silicon dioxide), and the aspect-ratio-dependent anisotropic etch can be an aspect-ratio-dependent reactive ion etch employing at least one fluorocarbon gas (such as $CF_4$) and hydrogen and/or at least one hydrofluorocarbon gas as the etchant gas. The supply of the etchant gas can be limited so that a predominant portion of the etchant gas is depleted prior to reaching the discrete patterning film portions 120B or lower portions of the recess cavities (57, 17). The lateral etch rate can increase with the vertical distance from the substrate (9, 10) on the substantially vertical sidewalls of the joint level dielectric material layer 170 and the sacrificial dielectric material layer 172 around each of the recess cavities (57, 17). Thus, the sidewalls of the joint level dielectric material layer 170 and the sacrificial dielectric material layer 172 develop tapered profiles as the aspect-ratio-dependent anisotropic etch proceeds.

Tapered sidewall are formed on the joint level dielectric material layer 170 and on the sacrificial dielectric material layer 172 by etching the substantially vertical sidewalls of the joint level dielectric material layer 170 and the sacrificial dielectric material layer 172 with a height-dependent lateral etch distance that increases with a vertical distance from the top surface of the substrate (9, 10) (or with a vertical distance from any horizontal plane that includes, or underlies, the top surface of the sacrificial fill material portions (58, 18). As used herein, a "tapered sidewall" refers to a sidewall having a taper angle (as measured from a vertical line which extends perpendicular to the top surface of the substrate) that is greater than 3 degrees, such as greater than 5 degrees, for example 10 to 60 degrees. During the aspect-ratio-dependent anisotropic etch, a portion of the patterning film 120 overlying the joint level dielectric material layer 170 and/or the sacrificial dielectric material layer 172 can facet to add to the taper and/or form a thin viscous material layer 120C that flows over an in-process tapered sidewall of the joint level dielectric material layer 170 and/or the sacrificial dielectric material layer 172. The viscous material layer 120C can further accelerate formation of the tapered sidewalls on the joint level dielectric material layer 170 by retarding etching of lower portions of the joint level dielectric material layer 170. The in-process tapered sidewalls form the tapered sidewalls of the joint level dielectric material layer 170 at an end of the aspect ratio-dependent anisotropic etch process. A tapered memory cavity 157 is formed by height-dependent lateral expansion of each memory recess cavity 57, and a tapered support cavity 117 is formed by height-dependent expansion of each support recess cavity 17. The taper angle of the tapered sidewalls of the joint level dielectric material layer 170 and the sacrificial dielectric material layer 172 can be greater than 3 degrees and less than 60 degrees. For example, the taper angle can be in a range from 5 degrees to 45 degrees, and may be in a range from 7.5 degrees to 30 degrees. In one embodiment, the taper angle may be greater than 3, 5, 7.5, 10, 12.5, 15, 17.5, and/or 20 degrees. In one embodiment, the taper angle may be less than 60, 45, 30, 25, 20, 17.5, and/or 15 degrees.

Figure 7A:
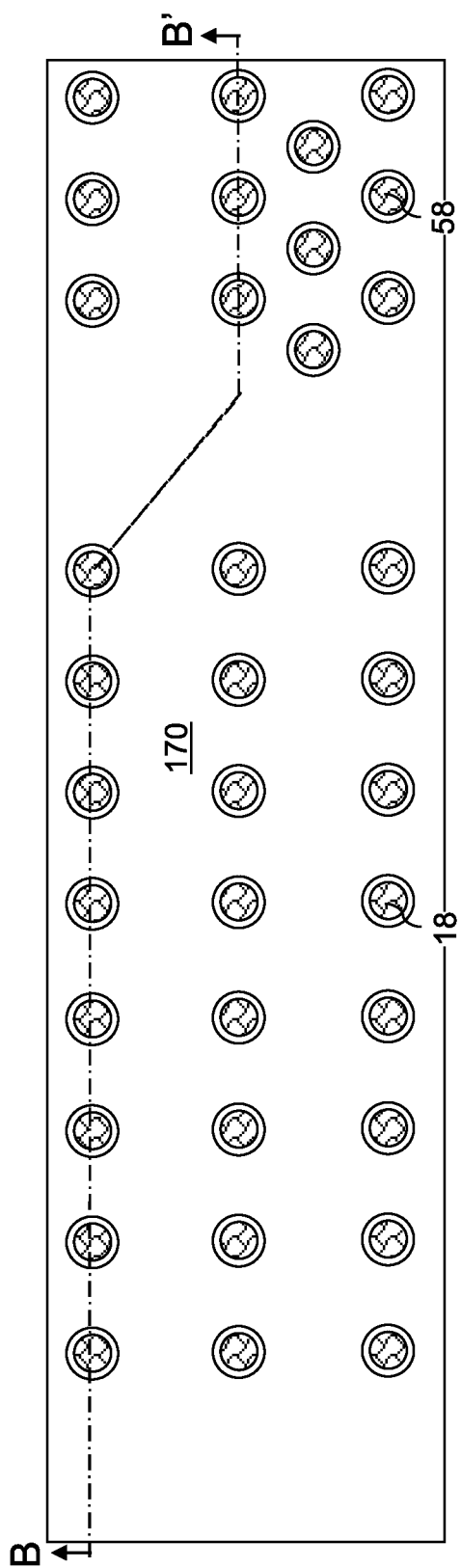
FIG. 7A is a top-down view of the first exemplary structure after removal of the patterning film and a sacrificial dielectric material layer according to the first embodiment of the present disclosure.
Figure 7B:
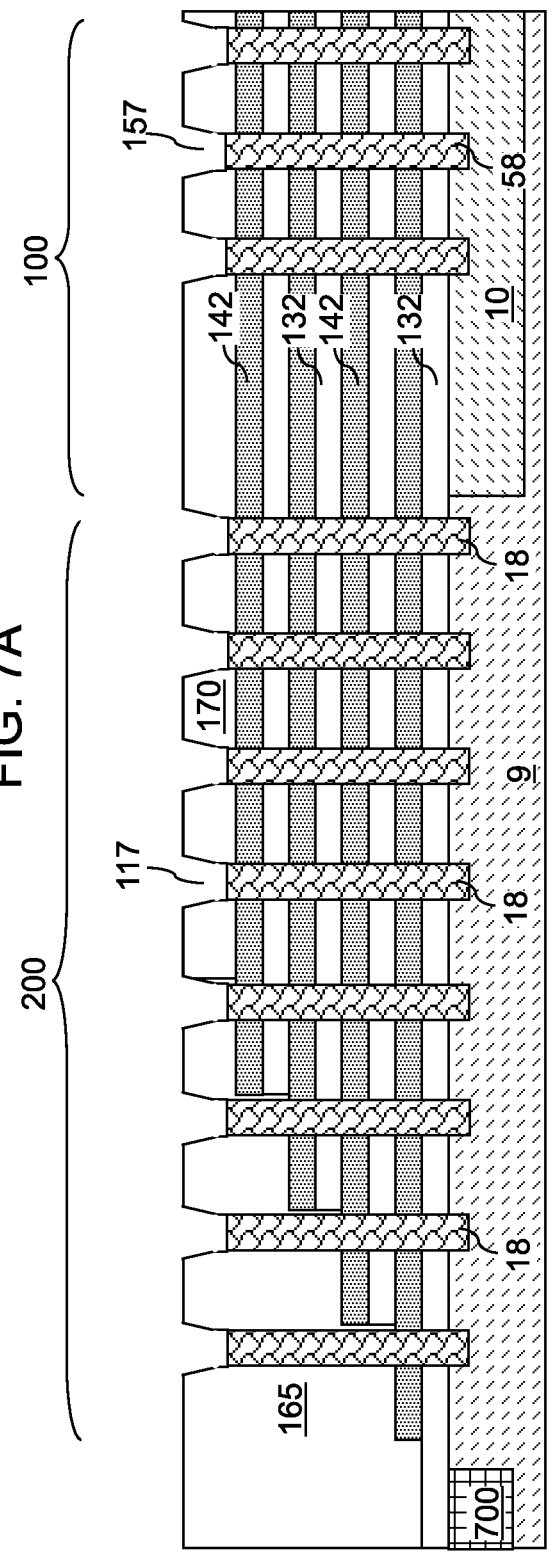
FIG. 7B is a vertical cross-sectional view of the first exemplary structure of FIG. 7A along the vertical plane B-B'.

Referring to FIGS. 7A and 7B, the patterning film 120 can be removed, for example, by ashing. If the sacrificial dielectric material layer 172 is present, the sacrificial dielectric material layer 172 can be removed selective to the joint level dielectric material layer 170 using an anisotropic selective etch. For example, if the sacrificial dielectric material layer 172 includes doped or undoped silicate glass from a TEOS source, and if the joint level dielectric material layer 170 includes an undoped silicate glass formed from a precursor other than TEOS, then sacrificial dielectric material layer 172 can be removed by an HF-based vapor phase etch process or by an HF-based wet etch process that selectively etches TEOS based silicon oxides over non-TEOS based silicon oxides.

Referring to FIGS. 8A and 8B, a sacrificial material can be deposited in the tapered memory cavities 157 and the tapered support cavities 117. The sacrificial material can be any material that can be employed for the sacrificial fill material portions (58, 18). Excess portions of the deposited sacrificial material can be removed from above the horizontal plane including the top surface of the joint level dielectric material layer 170. Each remaining portion of the sacrificial material that fills the tapered memory cavities 157 forms a retro-tapered memory opening sacrificial cap 158, and each remaining portion of the sacrificial material that fills the tapered sacrificial cavities 117 forms a retro-tapered support opening sacrificial caps 118. A vertical stack of a memory opening fill material portion 58 and a retro-tapered memory opening sacrificial cap 158 fills a first memory opening that includes a tapered sidewall of the joint level dielectric material layer 170. A vertical stack of a support opening fill material portion 18 and a retro-tapered support opening sacrificial cap 118 fills a support opening, which includes a tapered sidewall of the joint level dielectric material layer 170 or a tapered sidewall of the retro-stepped dielectric material portion 165. The retro-tapered memory opening sacrificial caps 158 and the retro-tapered support opening sacrificial caps 118 are collectively referred to as retro-stepped sacrificial caps (158, 118).

Referring to FIGS. 9A and 9B, a second alternating stack (232, 242) of material layers is subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

An insulating cap layer 70 can be subsequently formed over the second stack (232, 242). The dielectric cap layer 70 includes a dielectric material that is different from the material of the second sacrificial material layers 242. In one embodiment, the dielectric cap layer 70 can include silicon oxide.

Referring to FIGS. 10A and 10B, second stepped surfaces are formed in the second stack (232, 242) in the contact region 200. The additional stepped surfaces are herein referred to as second stepped surfaces. The second stepped surfaces are formed in a second stepped area, which is adjacent to, and does not overlie, the first stepped area of the first stepped surfaces within the first alternating stack (132, 142). The second stepped surfaces can be adjacent to, and do not overlie, the stepped interface between the first alternating stack (132, 142) and the first retro-stepped dielectric material portion 165.

The second stepped surfaces can be formed, for example, by forming a mask layer with an opening therein, etching a cavity within the levels of the topmost second sacrificial material layer 242 and the topmost second insulating layer 232, and iteratively expanding the etched area and vertically recessing the cavity by etching a pair of a second insulating layer 232 and a second sacrificial material layer 242 located directly underneath the bottom surface of the etched cavity within the etched area. The second stack (232, 242) is patterned such that each underlying second sacrificial material layer 242 laterally protrudes farther than any overlying second sacrificial material layer 242 in the etched region, and each underlying second insulating layer 232 laterally protrudes farther than any overlying second insulating layer 232 in the etched region. The etched area includes the area of the contact region 200, which includes the contact area for the second stack (232, 242) and a contact area for the first alternating stack (132, 142).

Thus, the second stack (232, 242) is patterned to form the second stepped surfaces thereupon. The cavity formed by removal of portions of the second stack (232, 242) is herein referred to as a second stepped cavity. The area of the second stepped cavity includes the area of the first retro-stepped first dielectric material portion 165, from which all layers of the second stack (232, 242) are removed. The area of the second stepped cavity further includes the area of the second stepped surfaces of the second stack (232, 242).

A dielectric material is deposited to fill the second stepped cavity. Excess portions of the dielectric material overlying the topmost surface of the second stack (232, 242) are removed, for example, by chemical mechanical planarization. The remaining portion of the deposited dielectric material is retro-stepped, and thus, forms a second retro-stepped dielectric material portion 265. The second retro-stepped dielectric material portion 265 is located on, and over, the second stepped surfaces of the second stack (232, 242). The second retro-stepped dielectric material portion 265 is formed on the second stepped surfaces. The contact region 200 comprises a region of the first stepped surfaces and a region of the second stepped surfaces.

Referring to FIGS. 11A and 11B, second memory openings 69 and second support openings 29 are formed through an upper stack structure that includes the second alternating stack (232, 242), the insulating cap layer 70, and the second retro-stepped dielectric material portion 265.

The second memory openings 69 are formed in areas that overlie the first memory openings, i.e., in areas that substantially coincides with the areas of stacks of the memory opening fill material portions 58 and the retro-tapered memory opening sacrificial caps 158. Specifically, a bottom periphery of each memory openings 69 can be entirely within an outer periphery of a top surface of an underlying retro-tapered memory opening sacrificial cap 158.

The second support openings 29 are formed in areas that overlie the first support openings, i.e., in areas that substantially coincides with the areas of stacks of the support opening fill material portions 18 and the retro-tapered support opening sacrificial caps 118.

For example, a lithographic material stack (not shown) including at least a photoresist layer can be formed over the insulating cap layer 70, and can be lithographically patterned to form openings within the lithographic material stack. The pattern in the lithographic material stack can be transferred through the entirety of the upper stack structure (232, 242, 265, 70) by at least one anisotropic etch that employs the patterned lithographic material stack as an etch mask. Portions of the upper stack structure (232, 242, 265, 70) underlying the openings in the patterned lithographic material stack are etched to form the second memory openings 69 and the second support openings 29. In other words, the transfer of the pattern in the patterned lithographic material stack through the upper stack structure (232, 242, 265, 70) forms the second memory openings 69 and the second support openings 29.

In one embodiment, the chemistry of the anisotropic etch process employed to etch through the materials of the second stack (232, 242) can alternate to optimize etching of the third and fourth materials in the second stack (232, 242) while providing a comparable average etch rate for the second dielectric material portion 265. The anisotropic etch can be, for example, a series of reactive ion etches. The sidewalls of the second memory openings 69 can be substantially vertical, or can be tapered. In one embodiment, the retro-stepped sacrificial caps (158, 118) may be employed as stopping structures for the anisotropic etch process that forms the second memory openings 69 and the second support openings 29.

Figure 12A:
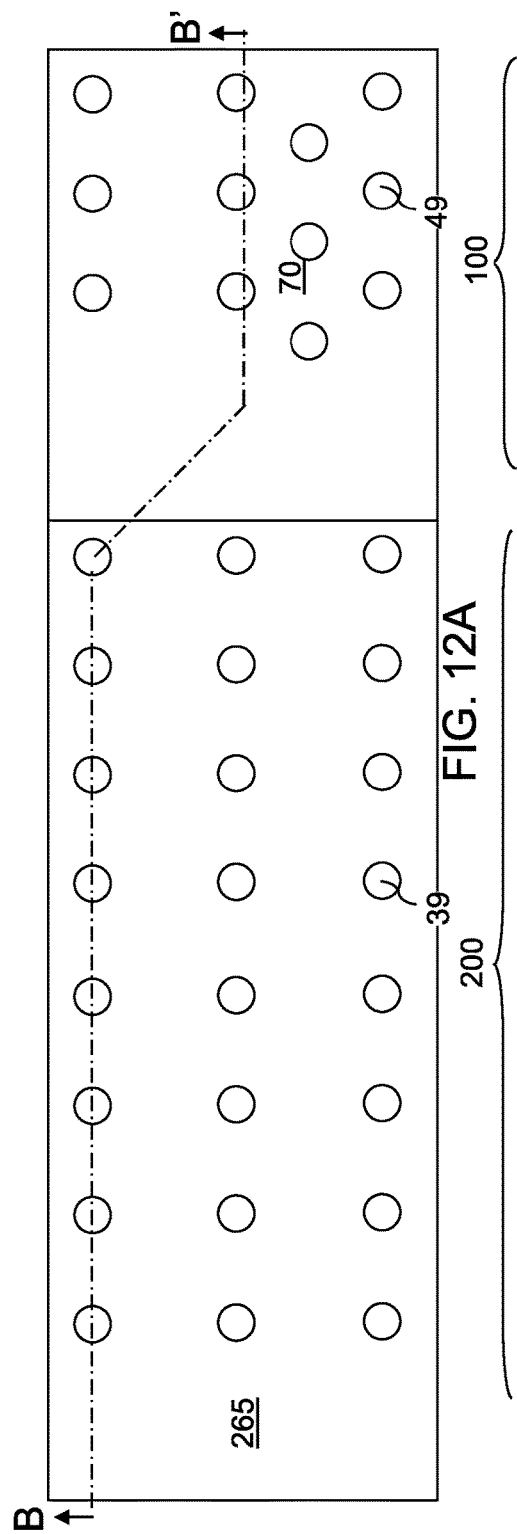
FIG. 12A is a top-down view of the first exemplary structure after formation of inter-stack memory openings according to the first embodiment of the present disclosure.
Figure 12B:
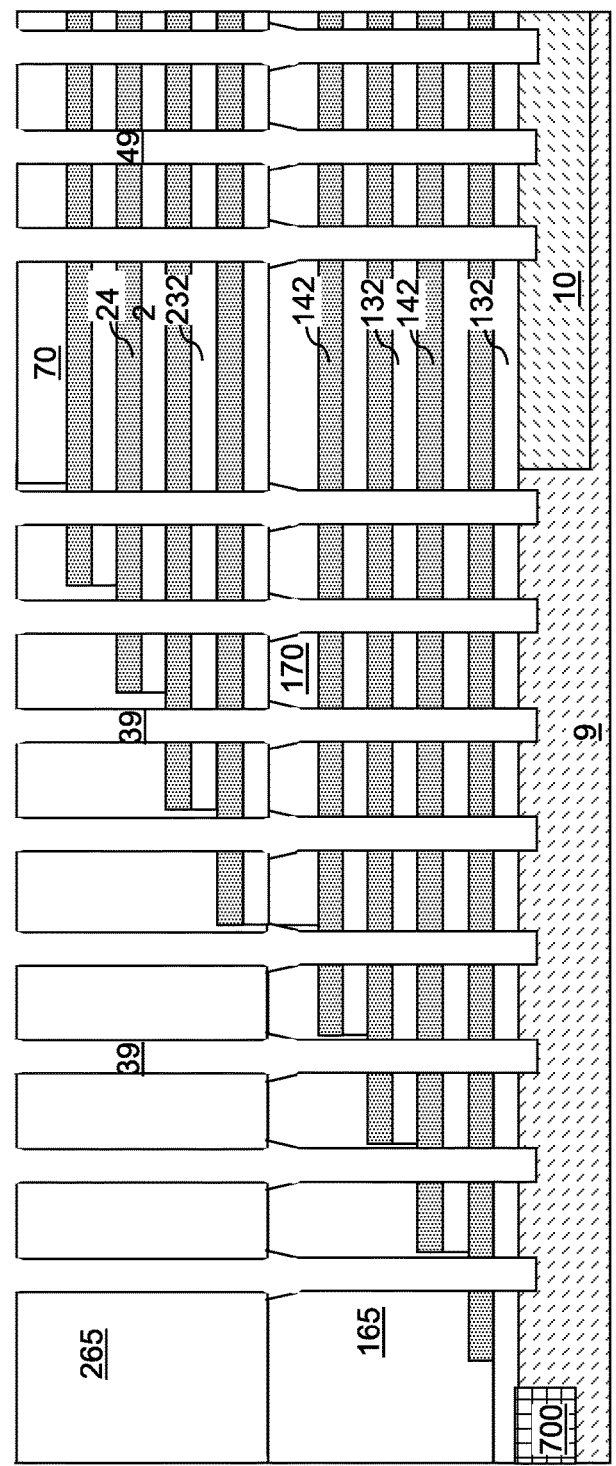
FIG. 12B is a vertical cross-sectional view of the first exemplary structure of FIG. 12A along the vertical plane B-B'.

Referring to FIGS. 12A and 12B, the retro-stepped sacrificial caps (158, 118) and the sacrificial fill material portions (58, 18) can be removed selective to the first alternating stack (132, 142), the second alternating stack (232, 242), the joint level dielectric material layer 170, the insulating cap layer 70, the first and second retro-stepped dielectric material portions (165, 265), and the substrate (9, 10). An isotropic etch or an anisotropic etch may be employed to remove the retro-stepped sacrificial caps (158, 118) and the sacrificial fill material portions (58, 18). Each volume of a second memory opening 69 is adjoined to the volume of a respective underlying first memory opening (which is filled with a stack of a retro-tapered memory opening sacrificial cap 158 and a memory opening fill material portions 58 prior to the isotropic etch or the anisotropic etch) to form a memory opening, which is herein referred to as an inter-tier memory openings 49. Each volume of a second support opening 29 is adjoined to the volume of a respective underlying first support opening (which is filled with a stack of a retro-tapered support opening sacrificial cap 118 and a support opening fill material portions 18 prior to the isotropic etch or the anisotropic etch) to form a support opening, which is herein referred to as an inter-tier support openings 39.

Each inter-tier memory opening 49 extends through a first tier structure (i.e., a lower tier structure) that includes the first alternating stack (132, 142) and the first retro-stepped dielectric material portion 165, through a second tier structure that is the upper stack structure (232, 242, 265, 70), and through the joint level dielectric material layer 170. Each inter-tier support opening 39 extends through the first tier structure and through the second tier structure. A subset of the inter-tier support openings 39 can extend through the joint level dielectric material layer 170. Another subset of the inter-tier support openings 39 can extend through the interface between the first and second retro-stepped dielectric material portions (165, 265).

FIGS. 13A-13H illustrate an inter-tier memory opening 49 during formation of a pillar semiconductor channel portion 11, a memory stack structure 55, a dielectric core 62, and a drain region 63, which are collectively referred to as a memory opening fill structure (element 77 in FIG. 14). Each inter-tier memory opening 49 is filled with a respective memory opening fill structure. Further, each inter-tier support opening 39 is filled with a respective support opening fill structure, which can have the same set of components as a memory opening fill structure and can be formed at the same time as the memory opening fill structures.

FIG. 13A illustrate an inter-tier memory opening 49 as provided at the processing steps of FIGS. 12A and 12B. A tapered sidewall of the joint level dielectric layer 170 is physically exposed to the inter-tier memory opening 49 at this step.

Referring to FIG. 13B, an optional pillar semiconductor channel portion (e.g., an epitaxial pedestal) 11 can be formed at the bottom portion of each inter-tier memory opening 49 and each inter-tier support openings 39, for example, by selective epitaxy. Each pillar semiconductor channel portion 11 comprises a single crystalline semiconductor material in epitaxial alignment with the single crystalline semiconductor material of the semiconductor material layer 10. In one embodiment, the pillar semiconductor channel portion 11 can be doped with electrical dopants of the same conductivity type as the semiconductor material layer 10. The pillar semiconductor channel portion 11 can be a portion of a transistor channel that extends between a source region to be subsequently formed in the substrate (9, 10) and a drain region to be subsequently formed in an upper portion of the inter-tier memory opening 49. A memory cavity 49' is present in the unfilled portion of the inter-tier memory opening 49 above the pillar semiconductor channel portion 11. In one embodiment, the pillar semiconductor channel portion 11 can comprise single crystalline silicon. In one embodiment, the pillar semiconductor channel portion 11 can have a doping of the first conductivity type, which is the same as the conductivity type of the semiconductor material layer 10 that the pillar semiconductor channel portion contacts. If a semiconductor material layer 10 is not present, the pillar semiconductor channel portion 11 can be formed directly on the substrate semiconductor layer 9, which can have a doping of the first conductivity type.

Referring to FIG. 13C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into first and second sacrificial material layers (142, 242). In one embodiment, the charge storage layer 54 includes a silicon nitride layer. In one embodiment, the first and second sacrificial material layers (142, 242) and the first and second insulating layers (132, 232) can have vertically coincident sidewalls, and the charge storage layer 54 can be formed as a single continuous layer.

In another embodiment, the first and second sacrificial material layers (142, 242) can be laterally recessed with respect to the sidewalls of the first and second insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each inter-tier memory opening 49 that is not filled with the deposited material layers (52, 54, 56, 601).

Referring to FIG. 13D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

The tapered sidewalls of the joint level dielectric layer 170 causes each of the optional first semiconductor channel layer 601, the tunneling dielectric layer 56, the charge storage layer 54, and the blocking dielectric layer 52 to be formed with tapered surfaces. The tapered surfaces of the optional first semiconductor channel layer 601, the tunneling dielectric layer 56, the charge storage layer 54, the blocking dielectric layer 52 effectively increases the thickness of each layer by the factor of $1/(\cos \theta)$, in which $\theta$ is the taper angle of the tapered sidewall of the joint level dielectric material layer 170. Further, the angle of a joint region between the tapered sidewall of the joint level dielectric material layer 170 and an adjoining and underlying substantially vertical sidewall (which may be a sidewall of the joint level dielectric material layer 170 or of a topmost layer of the first alternating stack (132, 142)) is given by 180 degrees less the taper angle, which is less than 90 degrees. Thus, formation of a roughly horizontal portion of the memory stack structure 55 (i.e., channel 60 and memory film 50) having a sharp edge with near-90-degree angle at the level of the joint level dielectric material layer 170 can be avoided due to the tapered sidewall of the joint level dielectric material layer 170. By avoiding formation of the roughly horizontal portion of the memory stack structure 55, the damage to such roughly horizontal portion of the memory stack structure 55 during the anisotropic etch process can be reduced avoided, which in turn reduces or avoids word line leakage current in the completed memory device.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the first and second sacrificial material layers (142, 242) constitutes a charge storage region.

A surface of the pillar semiconductor channel portion 11 (or a surface of the semiconductor material layer 10 in case the pillar semiconductor channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pillar semiconductor channel portion 11 (or of the semiconductor substrate layer 10 in case pillar semiconductor channel portions 11 are not employed) by a recess distance. A tunneling dielectric layer 56 is located over the charge storage layer 54. A set of a blocking dielectric layer 52, a charge storage layer 54, and a tunneling dielectric layer 56 in a inter-tier memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 13E, a second semiconductor channel layer 602 can be deposited directly on the semiconductor surface of the pillar semiconductor channel portion 11 or the semiconductor substrate layer 10 if the pillar semiconductor channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 13F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 13H:
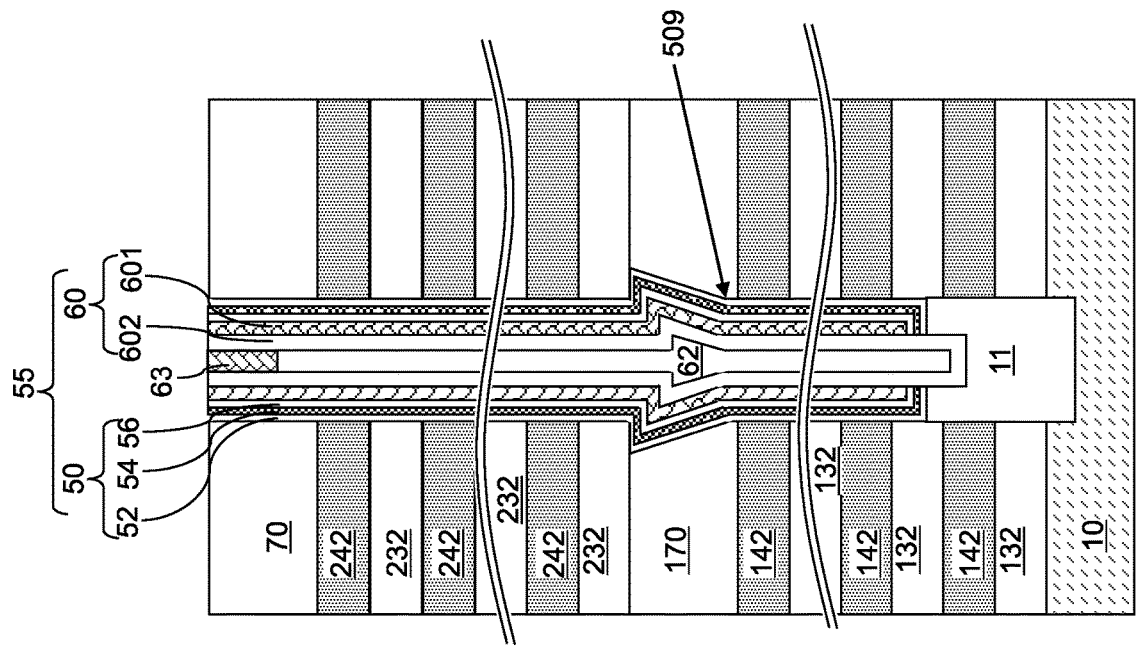
Figure 13G:
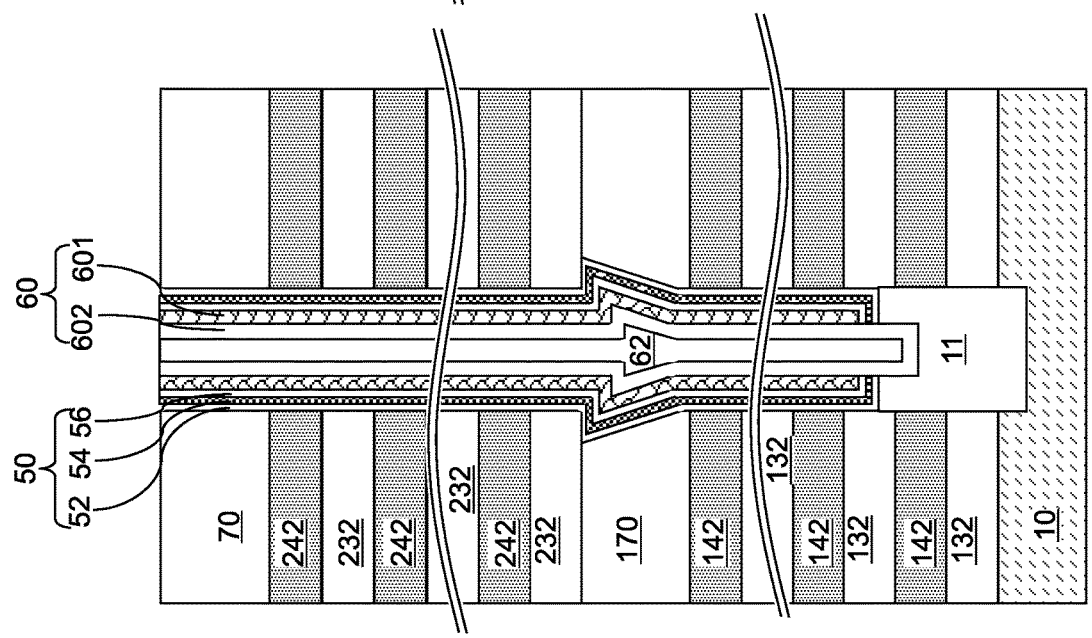

Referring to FIG. 13G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within an inter-tier memory opening 49 or entirely within an inter-tier support opening 39.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 13H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

A memory stack structure 55 is formed within the inter-tier memory opening 49. The memory stack structure 55 comprises a memory film 50 and a semiconductor channel, i.e., a vertical semiconductor channel 60. A tapered outer sidewall of the memory film 50 is formed directly on the tapered sidewall of the joint level dielectric material layer 170 and directly on a horizontal bottom surface of the second alternating stack (232, 242). The memory film 50 includes an upper outer sidewall that extends substantially vertically through the second alternating stack (232, 242), and a lower outer sidewall that extends substantially vertically through the first alternating stack (132, 142). The lower outer sidewall of the memory film 50 includes an upper periphery that adjoins a lower periphery of the tapered outer sidewall of the memory film 50 at an interface 509 having a closed shape.

Referring to FIGS. 14A and 14B, the first exemplary structure is shown after formation of the drain regions 63. Each combination of a memory film 50 and a vertical semiconductor channel 60 within an inter-tier memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pillar semiconductor channel portion 11 (if present), a memory stack structure 55, a dielectric core 62, and a drain region 63 within a inter-tier memory opening 49 is herein referred to as a memory opening fill structure 77. Each combination of a pillar semiconductor channel portion 11 (if present), a memory film 50, a vertical semiconductor channel 60, a dielectric core 62, and a drain region 63 within each inter-tier support opening 19 constitutes a support pillar structure 20.

Referring to FIGS. 15A and 15B, a contact level dielectric layer 80 can be formed over the insulating cap layer 70 and over the memory stack structures 55 and the support pillar structures 20. The contact level dielectric layer 80 includes a dielectric material that is different from the dielectric material of the sacrificial material layers (142, 242). For example, the contact level dielectric layer 80 can include silicon oxide. The contact level dielectric layer 80 can have a thickness in a range from 50 nm to 500 nm, although lesser and greater thicknesses can also be employed.

A photoresist layer (not shown) can be applied over the contact level dielectric layer 80, and is lithographically patterned to form openings in areas between clusters of memory stack structures 55. The pattern in the photoresist layer can be transferred through the contact level dielectric layer 80, the insulating cap layer 70, the second alternating stack (232, 242), the joint level dielectric material layer 170, and/or the first and second retro-stepped dielectric material portions (165, 265) employing an anisotropic etch to form backside trenches 79. The backside trenches 79 vertically extend from the top surface of the contact level dielectric layer 80 at least to the top surface of the substrate (9, 10), and laterally extend through the device region 100 and the contact region 200. In one embodiment, the backside trenches 79 can include a source contact opening in which a source contact via structure can be subsequently formed. The photoresist layer can be removed, for example, by ashing.

Figure 16A:
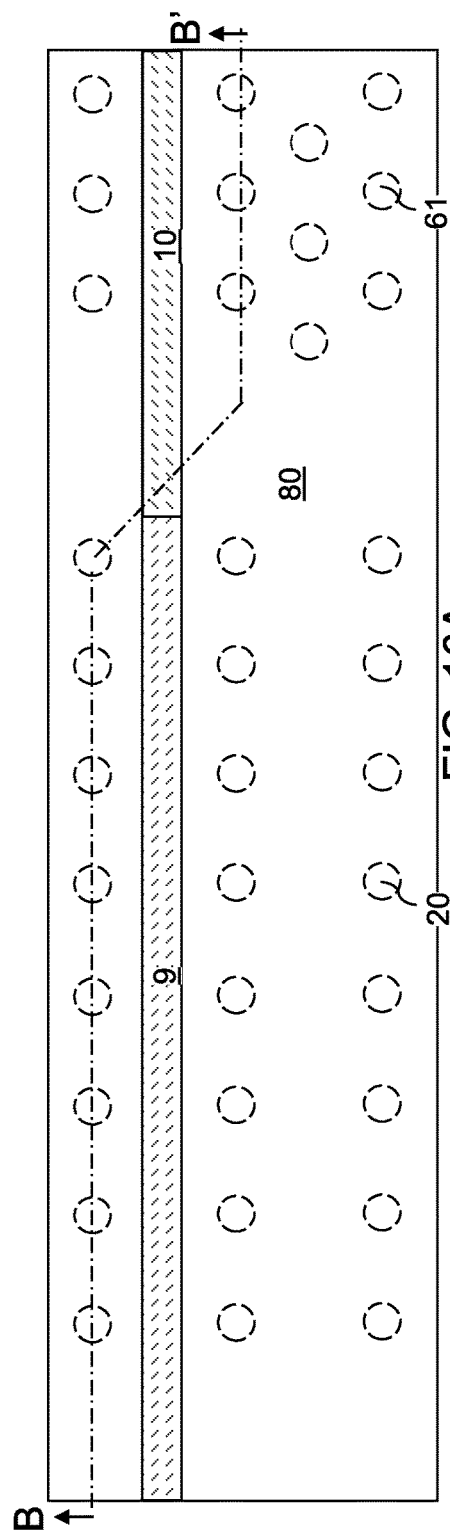
FIG. 16A is a top-down view of the first exemplary structure after formation of backside recesses according to the first embodiment of the present disclosure.
Figure 16B:
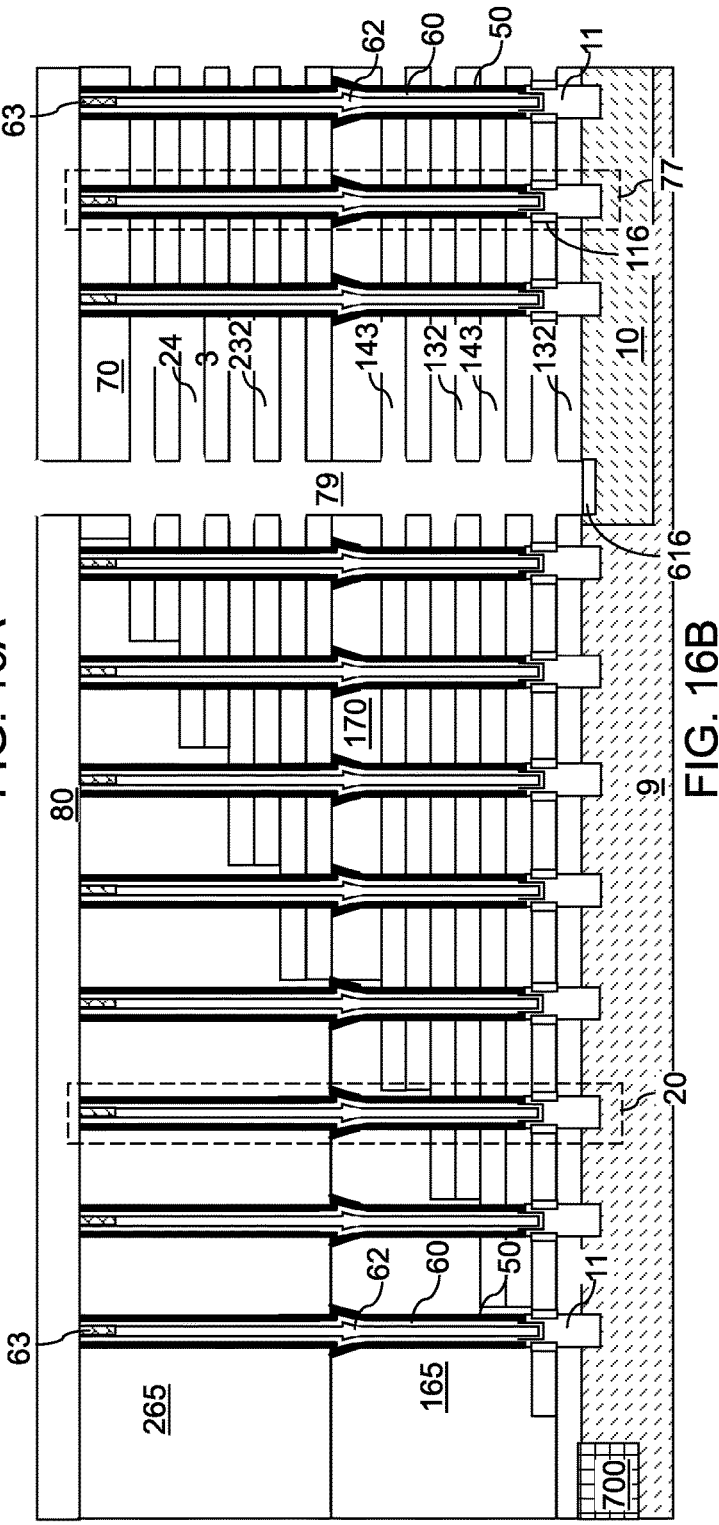
FIG. 16B is a vertical cross-sectional view of the first exemplary structure of FIG. 16A along the vertical plane B-B'.

FIGS. 16A and 16B, an etchant that selectively etches the materials of the first and second sacrificial material layers (142, 242) with respect to the materials of the first and second insulating layers (132, 232), the first and second retro-stepped dielectric material portions (165, 265), the joint level dielectric material layer 170, the insulating cap layer 70, the contact level dielectric material layer 80, and the semiconductor materials of the substrate (9, 10) can be introduced into the contact trench 79, for example, employing an isotropic etch process. First backside recesses 143 are formed in volumes from which the first sacrificial material layers 142 are removed. Second backside recesses 243 are formed in volumes from which the second sacrificial material layers 242 are removed. In one embodiment, the first and second sacrificial material layers (142, 242) can include silicon nitride, and the materials of the first and second insulating layers (132, 232), and the first and second retro-stepped dielectric material portions (165, 265) can be selected from silicon oxide and dielectric metal oxides. In another embodiment, the first and second sacrificial material layers (142, 242) can include a semiconductor material such as germanium or a silicon-germanium alloy, and the materials of the second insulating layers 232 and the first and second retro-stepped dielectric material portions (165, 265) can be selected from silicon oxide, silicon nitride, and dielectric metal oxides.

The isotropic etch process can be a wet etch process employing a wet etch solution, or can be a gas phase (dry) etch process in which the etchant is introduced in a vapor phase into the contact trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate (9, 10). A backside recess (143, 243) can be vertically bounded by a top surface of an underlying insulating layer (132 or 232) and a bottom surface of an overlying insulating layer (132 or 232). In one embodiment, each of the first and second backside recesses (143, 243) can have a uniform height throughout.

Physically exposed surface portions of the optional pillar semiconductor channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pillar semiconductor channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pillar semiconductor channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pillar semiconductor channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 17A:
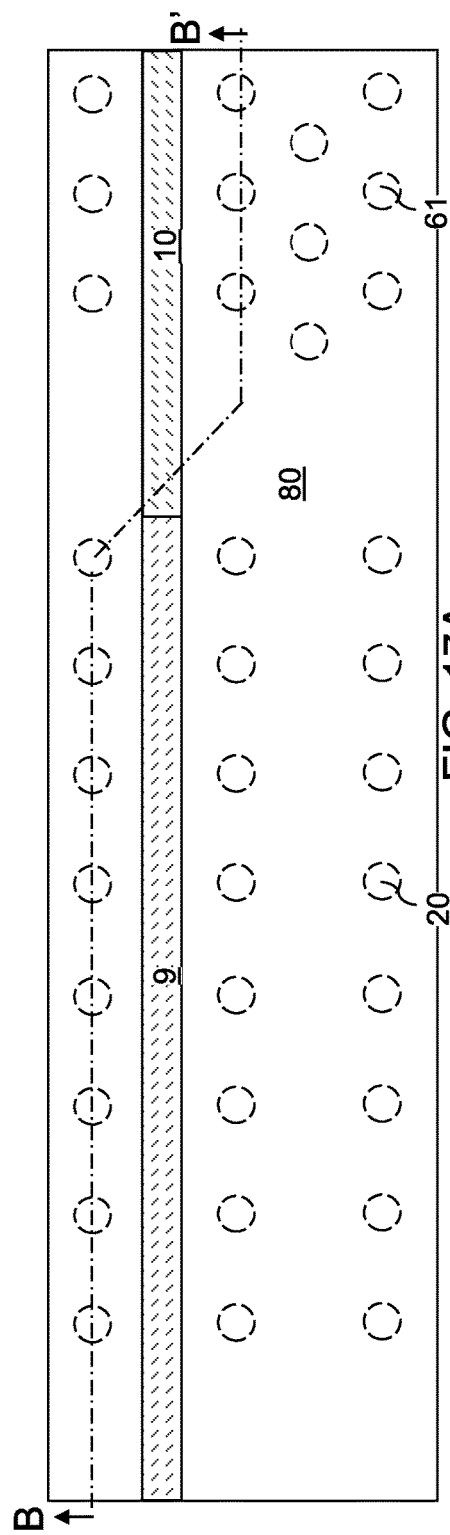
FIG. 17A is a top-down view of the first exemplary structure after formation of electrically conductive layers according to the first embodiment of the present disclosure.
Figure 17B:
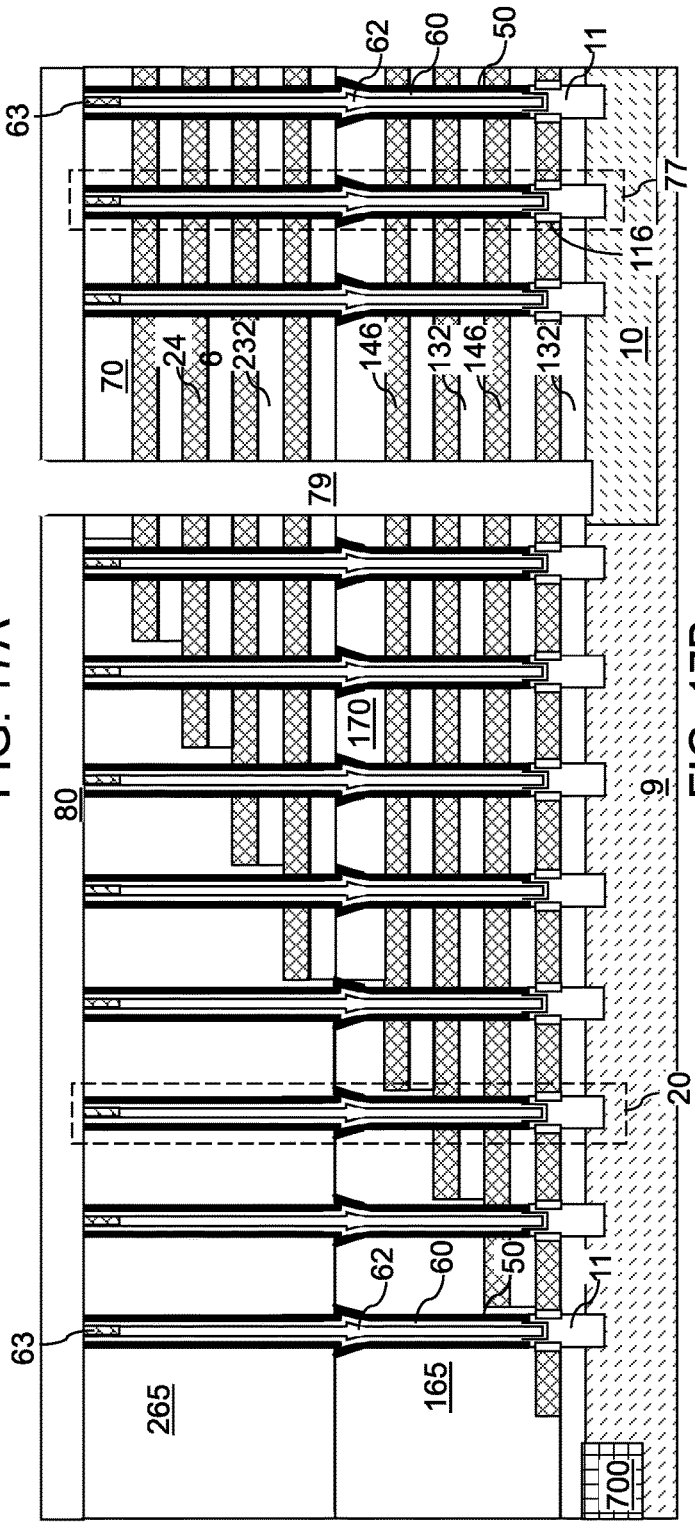
FIG. 17B is a vertical cross-sectional view of the first exemplary structure of FIG. 17A along the vertical plane B-B'.

Referring to FIGS. 17A and 17B, a backside blocking dielectric layer (not shown) can be optionally formed. The backside blocking dielectric layer, if present, comprises a dielectric material that functions as a control gate dielectric for the control gates to be subsequently formed in the backside recesses (143, 243). In case the blocking dielectric layer 52 is present within each memory opening, the backside blocking dielectric layer is optional. In case the blocking dielectric layer 52 is omitted, the backside blocking dielectric layer is present.

The backside blocking dielectric layer can be formed in the backside recesses (143, 243) and on a sidewall of the backside trench 79. The backside blocking dielectric layer can be formed directly on horizontal surfaces of the insulating layers (132, 232) and sidewalls of the memory stack structures 55 within the backside recesses (143, 243). If the backside blocking dielectric layer is formed, formation of the tubular dielectric spacers 116 and the planar dielectric portion 616 prior to formation of the backside blocking dielectric layer is optional. In one embodiment, the backside blocking dielectric layer can be formed by a conformal deposition process such as atomic layer deposition (ALD). The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed. A backside cavity 79' is present within the portion of each backside trench 79 that is not filled with the backside blocking dielectric layer.

At least one conductive material is subsequently deposited in the backside recesses (143, 243) and at a periphery of each backside trench 79. For example, the at least one conductive material can include a metallic barrier layer and a metal fill material (not shown separately). The metallic barrier layer can include an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN. The metal fill material can be deposited in remaining volumes of the backside recesses (143, 243), at a periphery of each backside trench 79, and over the top surface of the contact level dielectric layer 80 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers (132, 232) and the memory stack structures 55 by the metallic barrier layer, which is a metallic barrier layer that blocks diffusion of fluorine atoms therethrough.

A plurality of electrically conductive layers (146, 246) can be formed in the plurality of backside recesses (143, 243), and a continuous metallic material layer (not shown) can be formed on the sidewalls of each backside trench 79 and over the contact level dielectric layer 80. Each electrically conductive layer (146, 246) includes a portion of the metallic barrier layer and a portion of the metallic fill material layer that are located between a vertically neighboring pair of dielectric material layers, which can be a pair of insulating layers (132, 232), an insulating layer (132, 232) and the joint level dielectric material layer 170, or a topmost second insulating layer 232 and an insulating cap layer 70. The continuous metallic material layer includes a continuous portion of the metallic barrier layer and a continuous portion of the metallic fill material layer that are located in the backside trenches 79 or above the contact level dielectric layer 80.

Each sacrificial material layer (142, 242) can be replaced with an electrically conductive layer (146, 246). A backside cavity 79' is present in the portion of each backside trench 79 that is not filled with the backside blocking dielectric layer and the continuous metallic material layer. A tubular dielectric spacer 116 laterally surrounds a pillar semiconductor channel portion 11. A bottommost first electrically conductive layer 146 laterally surrounds each tubular dielectric spacer 116 upon formation of the electrically conductive layers (146, 246).

The deposited metallic material of the continuous electrically conductive material layer is etched back from the sidewalls of each backside trench 79 and from above the contact level dielectric layer 80, for example, by an isotropic wet etch, an anisotropic dry etch, or a combination thereof. Each remaining portion of the deposited metallic material in the backside recesses (143, 243) constitutes an electrically conductive layer (146, 246). Each electrically conductive layer (146, 246) can be a conductive line structure. Thus, the sacrificial material layers (142, 242) are replaced with the electrically conductive layers (146, 246). The planar dielectric portion 616 at the bottom of each backside trench 79 can be removed by the anisotropic etch.

Each electrically conductive layer (146, 246) can function as a combination of a plurality of control gate electrodes located at a same level and a word line electrically interconnecting, i.e., electrically shorting, the plurality of control gate electrodes located at the same level. The plurality of control gate electrodes within each electrically conductive layer (146, 246) are the control gate electrodes for the vertical memory devices including the memory stack structures 55. In other words, each electrically conductive layer (146, 246) can be a word line that functions as a common control gate electrode for the plurality of vertical memory devices.

Figure 18A:
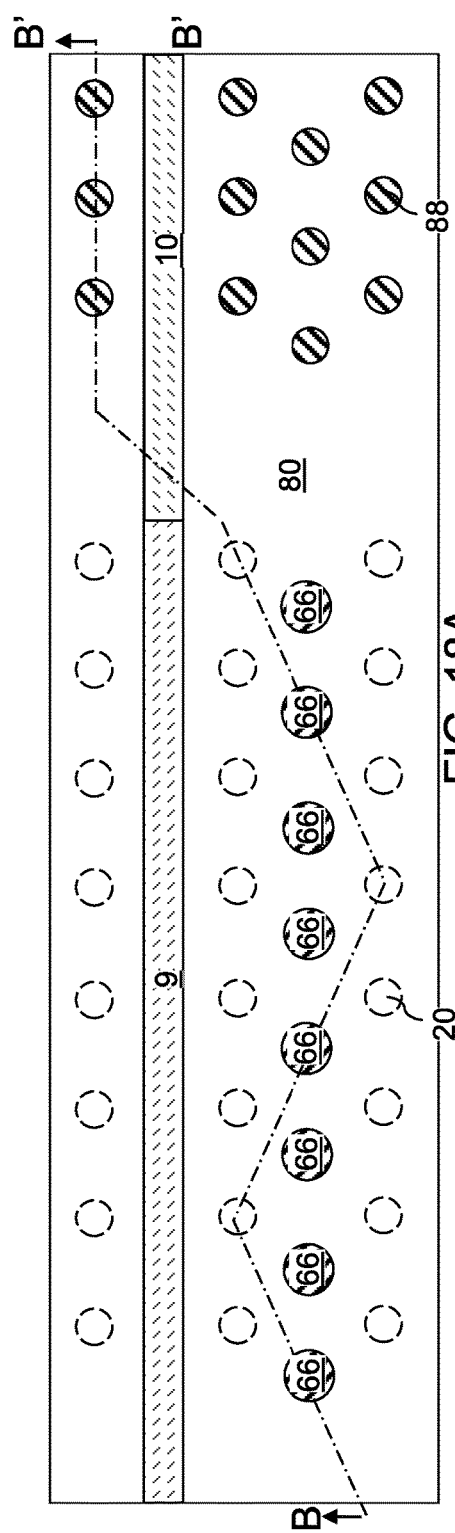
FIG. 18A is a top-down view of the first exemplary structure after formation of contact via structures according to the first embodiment of the present disclosure.
Figure 18B:
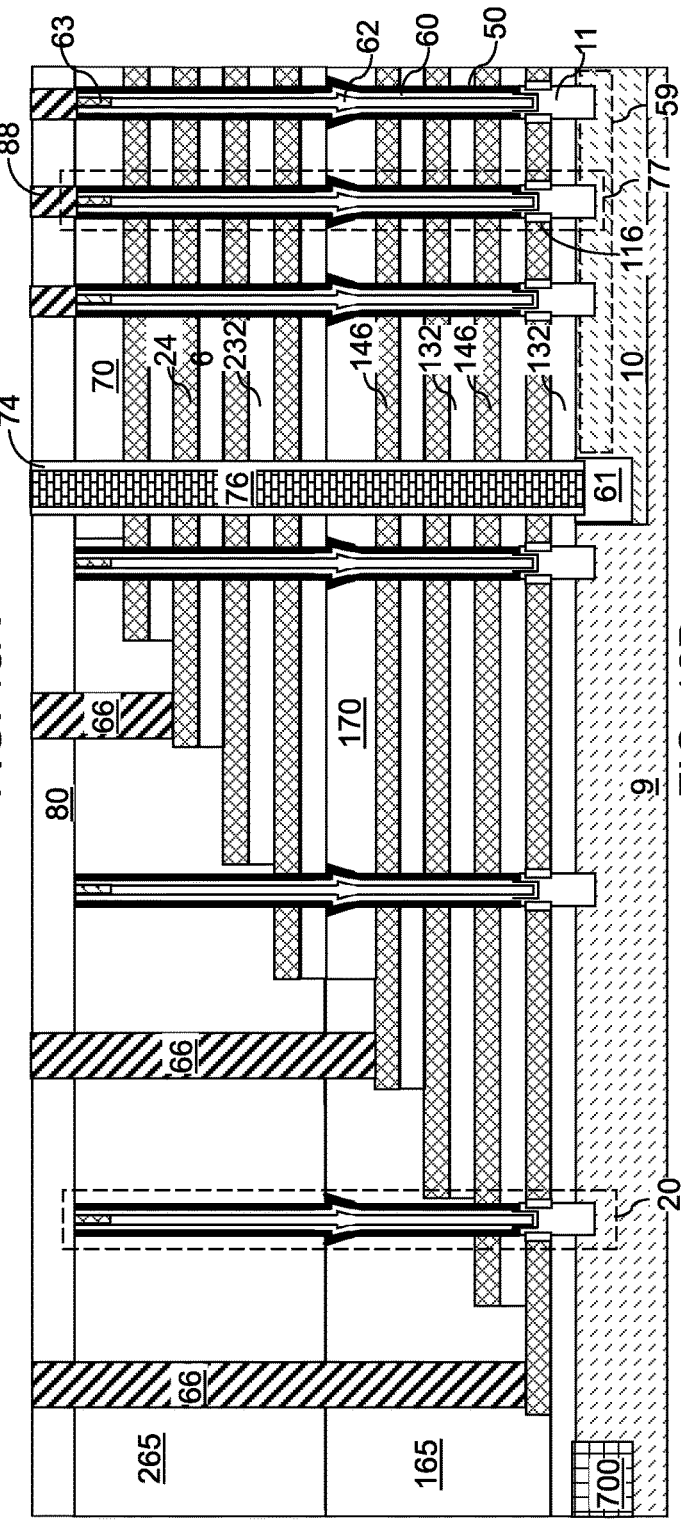
FIG. 18B is a vertical cross-sectional view of the first exemplary structure of FIG. 148 along the vertical plane B-B'.
Figure 18C:
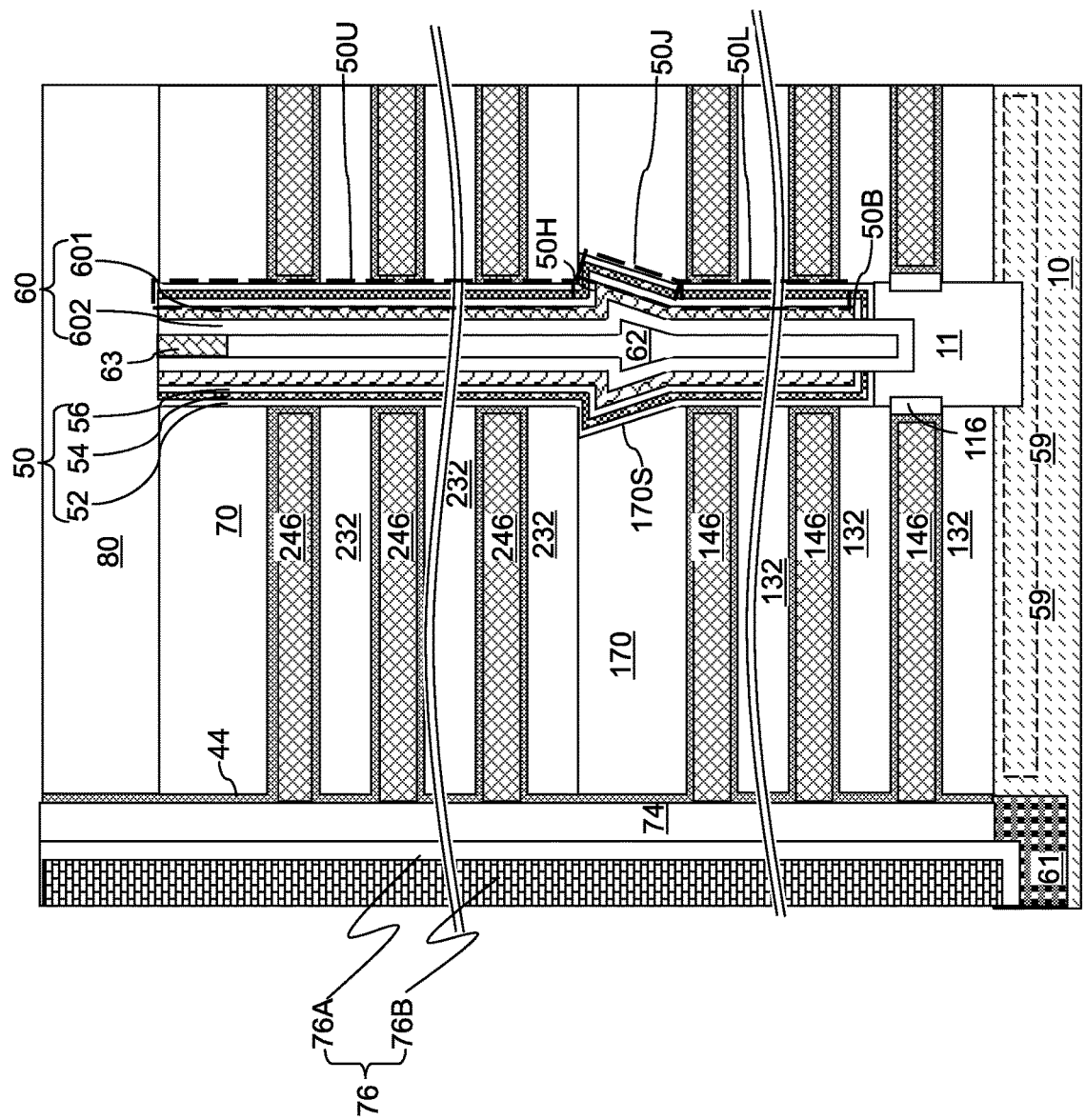
FIG. 18C is a vertical cross-sectional view of a region including a memory step structure of FIGS. 18A and 18B.

Referring to FIGS. 18A-18C, an insulating material layer can be formed in the at least one backside trench 79 and over the contact level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, as shown in FIG. 18C, then the insulating material layer can be formed directly on surfaces of the backside blocking dielectric layer 44 and directly on the sidewalls of the electrically conductive layers (146, 246). If a backside blocking dielectric layer 44 is not employed, the insulating material layer can be formed directly on sidewalls of the insulating layers 32 and directly on sidewalls of the electrically conductive layers (146, 246).

An anisotropic etch is performed to remove horizontal portions of the insulating material layer from above the contact level dielectric layer 80 and at the bottom of each backside trench 79. Each remaining portion of the insulating material layer constitutes an insulating spacer 74. A backside cavity can be present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pillar semiconductor channel portions 11 constitutes a horizontal semiconductor channel 59 for a plurality of field effect transistors. The horizontal semiconductor channel 59 is connected to multiple vertical semiconductor channels 60 through respective pillar semiconductor channel portions 11. The horizontal semiconductor channel 59 contacts the source region 61 and the plurality of pillar semiconductor channel portions 11. A bottommost first electrically conductive layer 146 can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 80 overlying the alternating stack (32, 46) as a stopping layer. If chemical mechanical planarization (CMP) process is employed, the contact level dielectric layer 80 can be employed as a CMP stopping layer. Each remaining continuous portion of the at least one conductive material in the backside trenches 79 constitutes a backside contact via structure 76. The backside contact via structure 76 extends through the first alternating stack (132, 146) and the second alternating stack (232, 246), and contacts a top surface of the source region 61. If a backside blocking dielectric layer 44 is employed, the backside contact via structure 76 can contact a sidewall of the backside blocking dielectric layer 44.

Additional contact via structures (66, 88) shown in FIGS. 18A and 18B can be formed through the contact level dielectric layer 80, and optionally through the first and second retro-stepped dielectric material portions (165, 265). For example, drain contact via structures 88 can be formed through the contact level dielectric layer 80 on each drain region 63 on the memory stack structures 55 within the inter-tier memory openings. Word line contact via structures 86 can be formed on the electrically conductive layers (146, 246) through the contact level dielectric layer 80, and through the retro-stepped dielectric material portions (165, 265). Peripheral device contact via structures (not shown) can be formed through the retro-stepped dielectric material portions (165, 265) directly on respective nodes of the peripheral devices. The support pillar structures 20 are not contacted by any contact via structure, and remain electrically floating.

Figure 19:
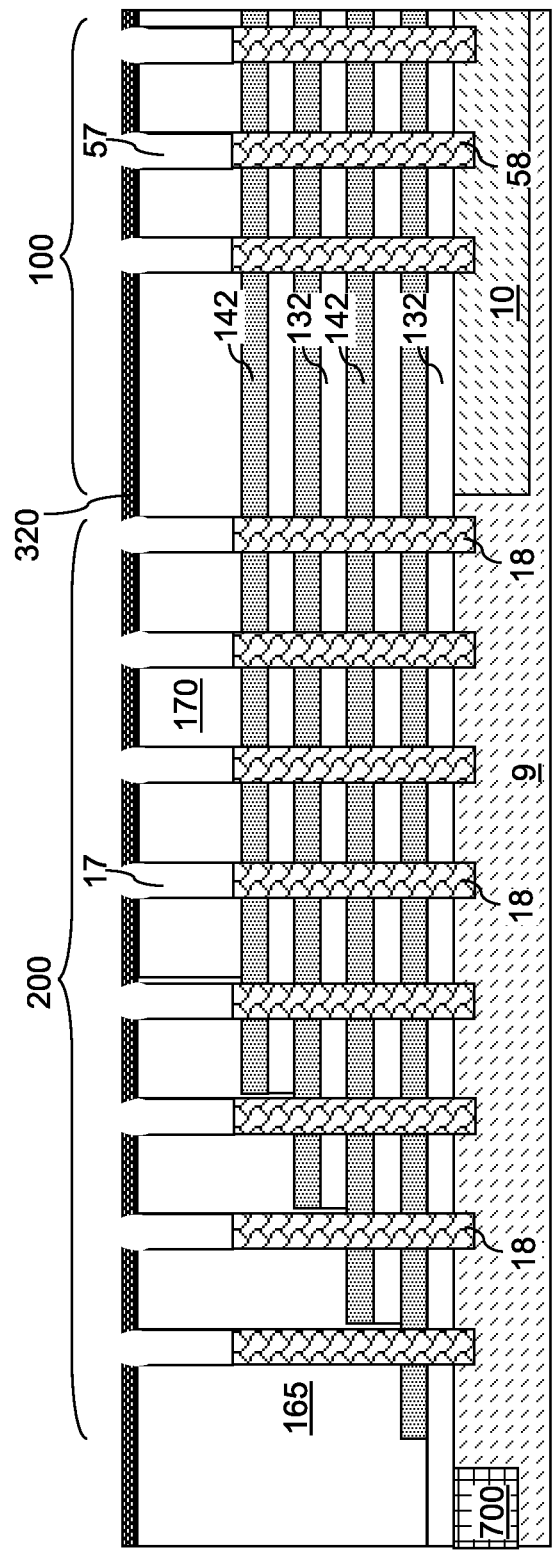
FIG. 19 is vertical cross-sectional view of a second exemplary structure after deposition of a carbon-containing material as a patterning film over recessed surfaces of the sacrificial fill material portions according to a second embodiment of the present disclosure.

Referring to FIG. 19 a second exemplary structure according to a second embodiment of the present disclosure can be derived from the first exemplary structure of FIGS. 4A and 4B by depositing a photoresist or carbon-containing (e.g., amorphous carbon or diamond-like carbon) material as a patterning film 320 without including the discrete patterning film portions 220B on top surfaces of the sacrificial fill material portions (58, 18) shown in FIGS. 5A and 5B of the first embodiment.

In this embodiment, the patterning film 320 may be either the photoresist or a hard mask used to pattern the openings (67, 19), and which is not removed after the openings (67, 19) are formed.

Alternatively, the patterning film 320 may be separate photoresist layer which is formed a top surface of the sacrificial dielectric material layer 172 (or on a top surface of the joint level dielectric material layer 170 if the sacrificial dielectric material layer 172 is not present) after forming the openings (67, 19). The photoresist layer 320 is then exposed and patterned to include openings therein which correspond to the openings (67, 19) which extend through the first alternating stack (132, 142).

Figure 20:
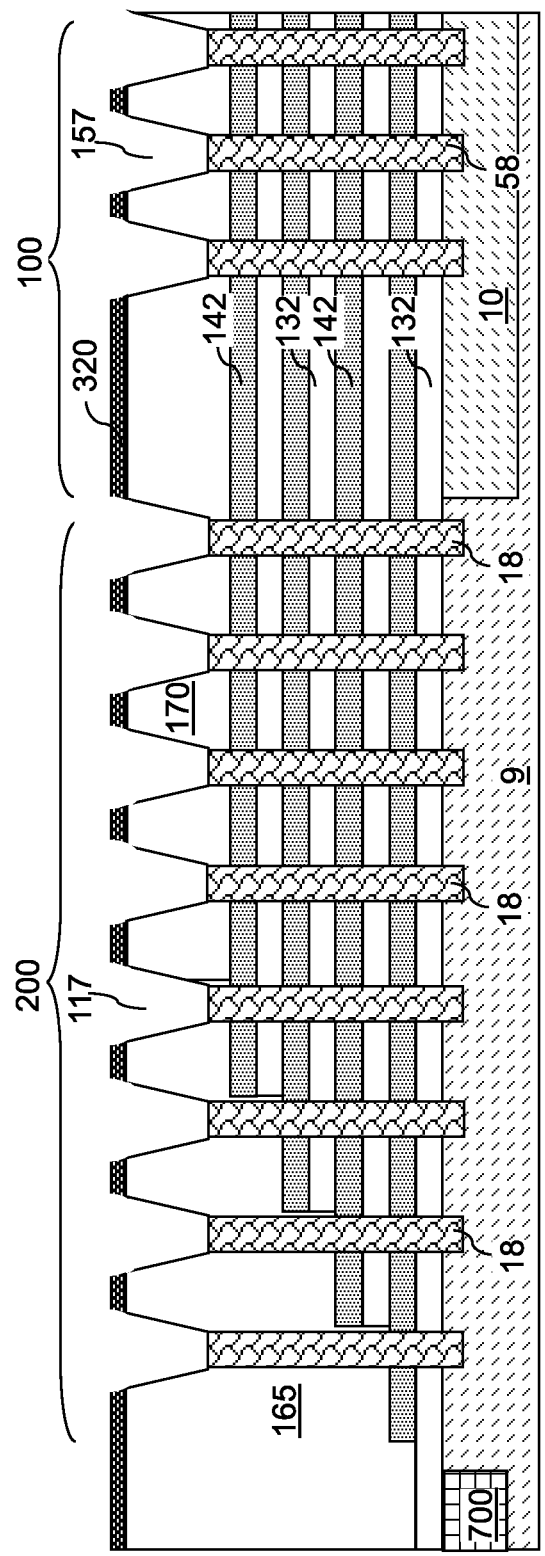
FIG. 20 is a vertical cross-sectional view of the second exemplary structure after an aspect-ratio-dependent anisotropic etch to form tapered sidewalls according to the second embodiment of the present disclosure.

Referring to FIG. 20, an aspect-ratio-dependent anisotropic etch is performed to form tapered sidewalls on the joint level dielectric material layer 170 as in the first embodiment. If the sacrificial dielectric material layer 172 is present over the joint level dielectric material layer, the aspect-ratio-dependent anisotropic etch forms additional tapered sidewalls on the sacrificial dielectric material layer 172.

Tapered sidewall are formed on the joint level dielectric material layer and on the sacrificial dielectric material layer 172 by etching the substantially vertical sidewalls of the joint level dielectric material layer 170 and the sacrificial dielectric material layer 172 with a height-dependent lateral etch distance that increases with a vertical distance from the top surface of the substrate (9, 10) (or with a vertical distance from any horizontal plane that includes, or underlies, the top surface of the sacrificial fill material portions (58, 18)), as in the first embodiment.

Then, the patterning film 320 can be removed, for example, by ashing. If the sacrificial dielectric material layer 172 is present, the sacrificial dielectric material layer 172 can be removed selective to the joint level dielectric material layer 170, as in the first embodiment.

Subsequently, the processing steps of FIGS. 8A-8B, 9A-9B, 10A-10B, 11A-11B, 12A-12B, 13A-13H, 14A-14B, 15A-15B, 16A-16B, 17A-17B, and 18A-18C can be performed to provide a second exemplary structure having the same structural characteristics as the first exemplary structure of FIGS. 18A-18C.

Figure 21A:
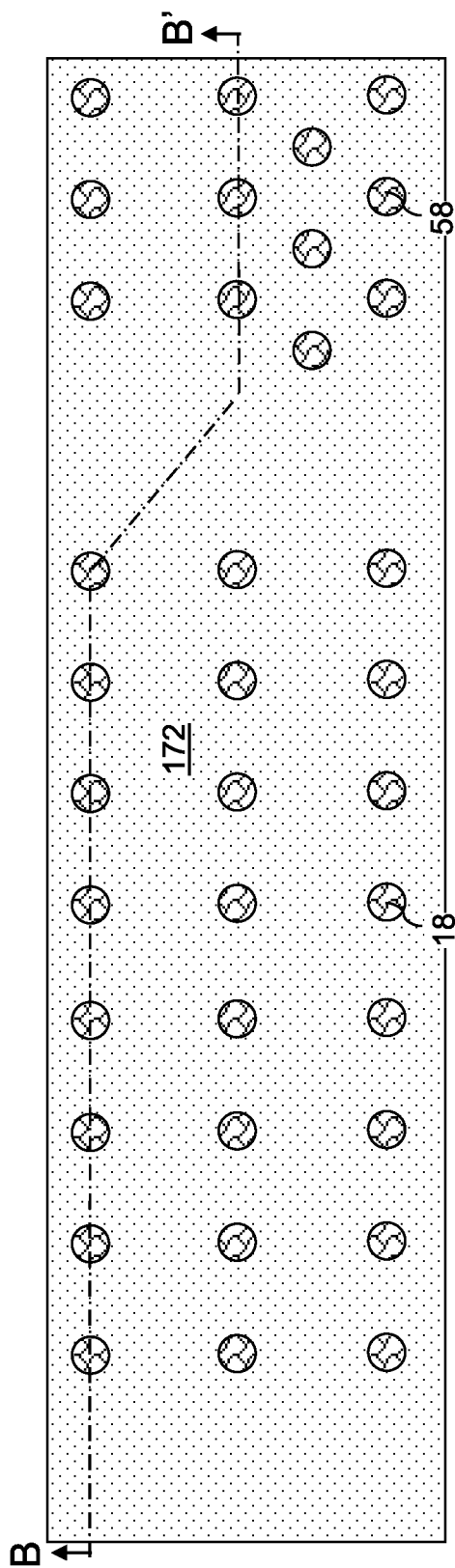
FIG. 21A is a top-down view of the third exemplary structure after formation of sacrificial fill material portions according to the third embodiment of the present disclosure.
Figure 21B:
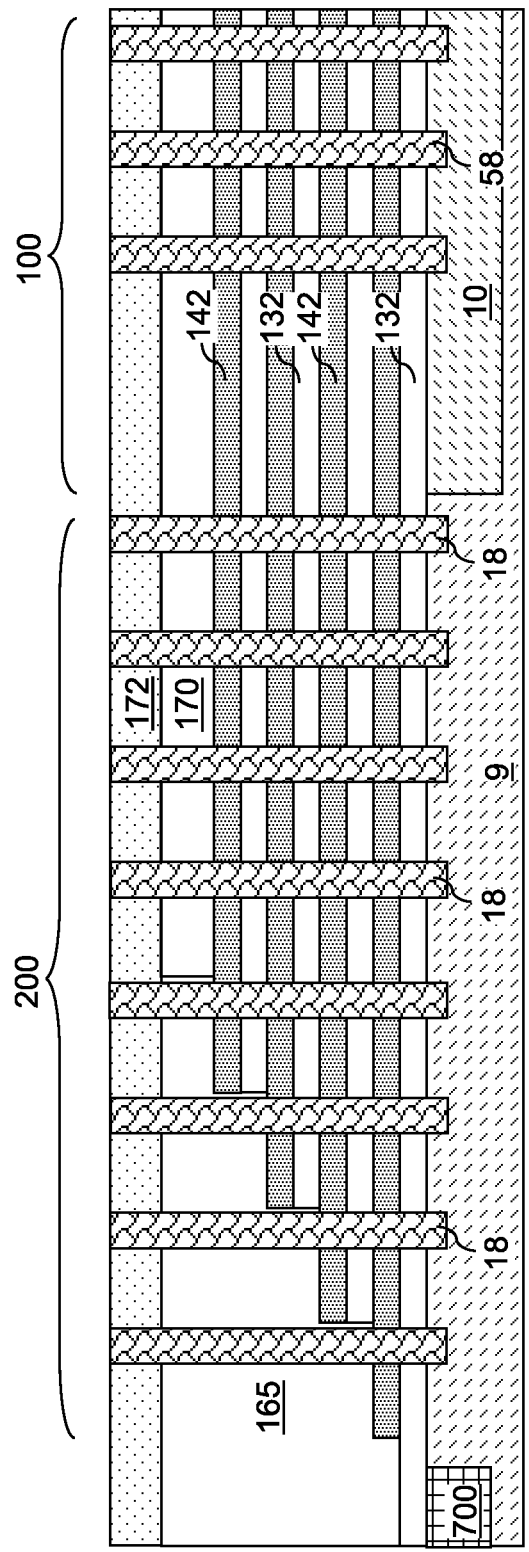
FIG. 21B is a vertical cross-sectional view of the third exemplary structure of FIG. 21A along the vertical plane B-B'.

Referring to FIGS. 21A and 21B, a third exemplary structure according to the third embodiment of the present disclosure can be derived from the first exemplary structure of FIGS. 3A and 3B.

Figure 22A:
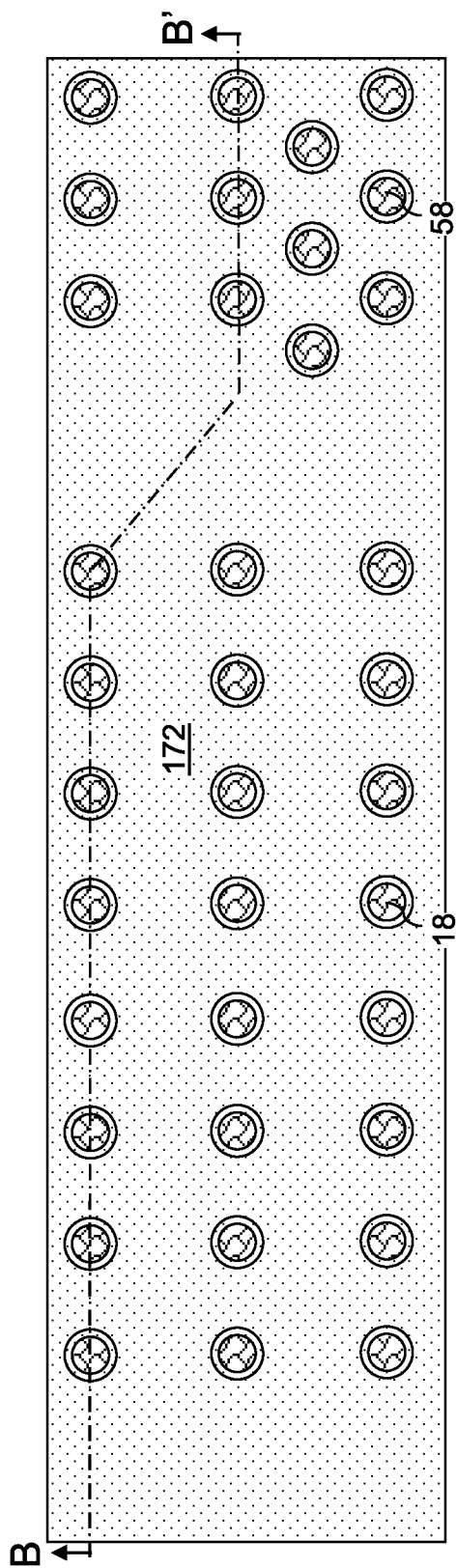
FIG. 22A is a top-down view of the third exemplary structure during an interface-enhanced etch process to form tapered sidewalls according to the third embodiment of the present disclosure.
Figure 22B:
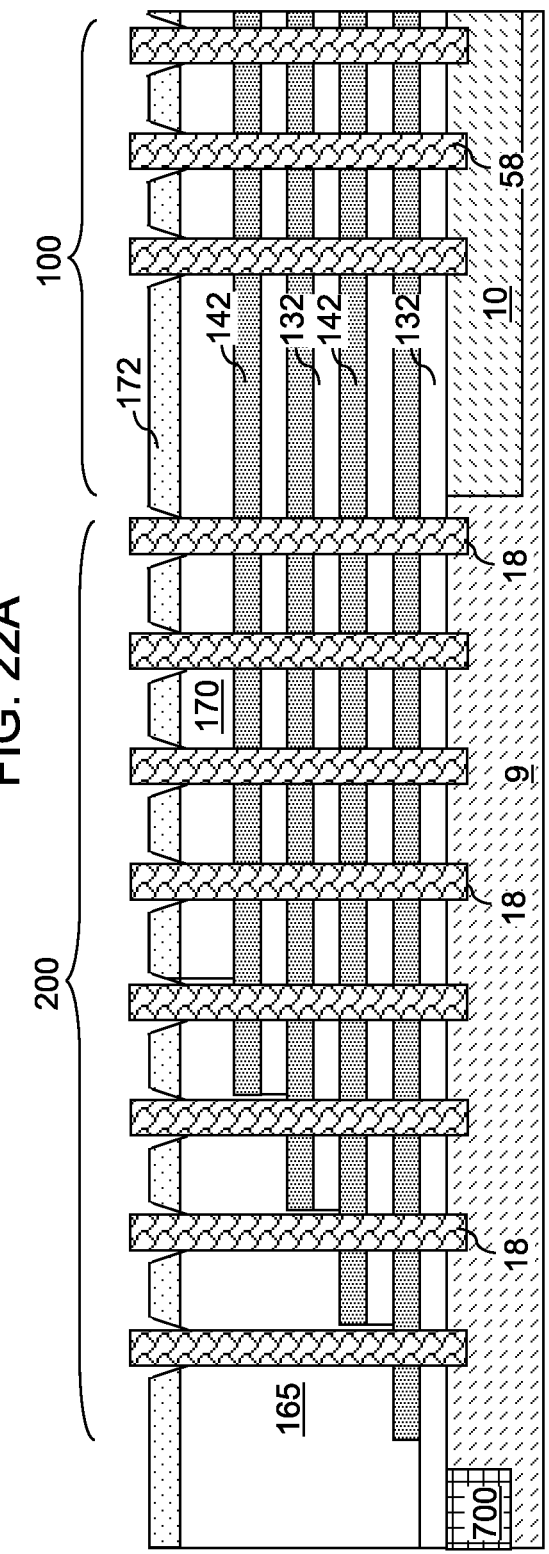
FIG. 22B is a vertical cross-sectional view of the third exemplary structure of FIG. 22A along the vertical plane B-B'.
Figure 22C:
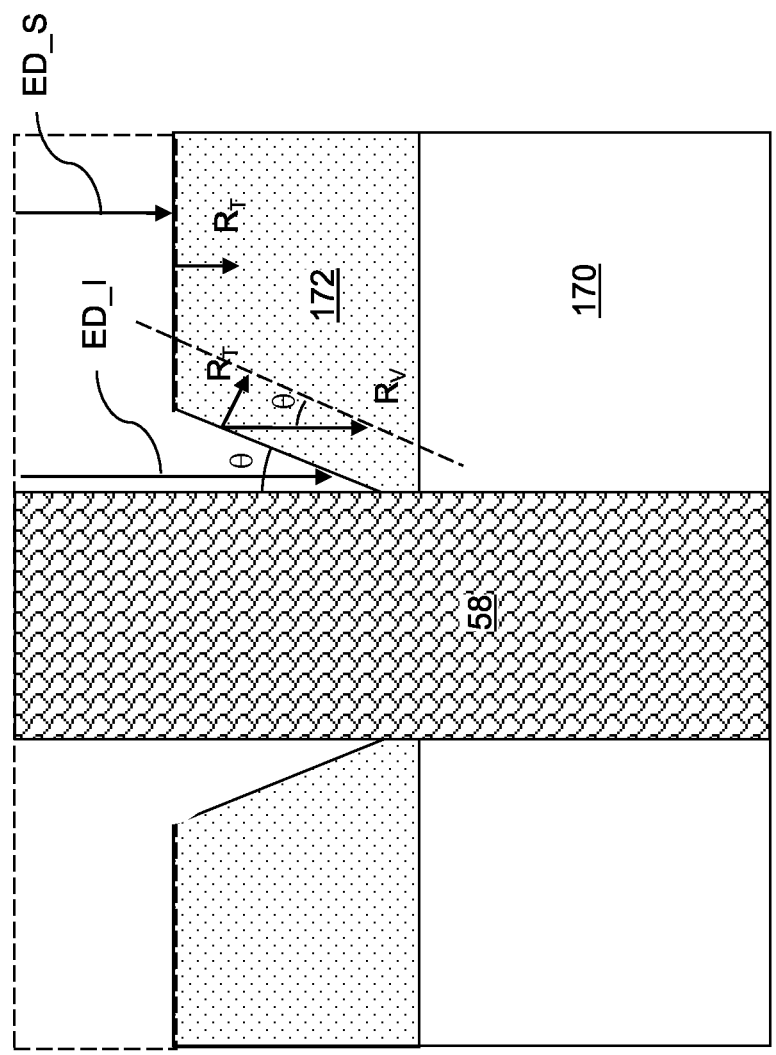
FIG. 22C is a magnified vertical cross-sectional view of a top portion of a sacrificial fill material portion of FIGS. 22A and 22B.

Referring to FIGS. 22A-22C, an etch process providing enhanced interfacial etch rate is performed. For example, the etch process can be a wet etch process employing a wet etch chemical, and the sacrificial fill material portions (58, 18) can include a material that permits interfacial diffusion of the wet etch chemical along the interface between the sacrificial fill material portions (58, 18) and the sacrificial dielectric material layer 172, and along the interface between the sacrificial fill material portions (58, 18) and the joint level dielectric material layer 170. For example, the sacrificial fill material portions (58, 18) can include an amorphous semiconductor material such as amorphous silicon or an amorphous silicon-germanium alloy, the joint level dielectric material layer 170 can include an undoped silicate glass such as densified TEOS oxide (which is an undoped silicate glass formed by decomposition of tetraethylorthosilicate (TEOS) by low pressure chemical vapor deposition or plasma enhanced chemical vapor deposition and subsequently densified in an anneal process), and the wet etch chemical can be dilute hydrofluoric acid (DHF). If the sacrificial dielectric material layer 172 is present, the sacrificial dielectric material layer 172 can include additional densified TEOS oxide, or a doped silicate glass such as borophosphosilicate glass or phosphosilicate glass. In one embodiment, the sacrificial dielectric material layer 172 and the joint level dielectric material layer 170 can include a same dielectric material such as densified TEOS oxide.

Each material of the sacrificial dielectric material layer 172 and the joint level dielectric material layer 170 can be etched in the etch process at two different rates. Specifically, as shown in FIG. 22C, the material of the sacrificial dielectric material layer 172 is etched from the physically exposed surfaces of the sacrificial dielectric material layer 172 at a bulk etch rate $R_T$, and along the interface between the sacrificial dielectric material layer 172 and the sacrificial fill material portions (58, 18) at an interfacial etch rate $R_v$, which is greater than the bulk etch rate $R_T$. Correspondingly, the interfacial etch distance ED_I (which is measured from the top surface of the sacrificial dielectric material layer 172 prior to the etch process to the bottommost portion of the in-process tapered sidewall of the sacrificial dielectric material layer 172) is greater than the surface etch distance ED_S (which is measured from the top surface of the sacrificial dielectric material layer 172 prior to the etch process to the recessed top surface of the sacrificial dielectric material layer 172 during the etch process). The taper angle θ of each tapered sidewall of the sacrificial dielectric material layer 172 is related to the bulk etch rate $R_T$ and the interfacial etch rate $R_v$ by the relationship $\sin θ = R_T/R_v$. The taper angle θ is not 90 degrees because the interfacial etch rate $R_v$ is greater than the bulk etch rate $R_T$.

Figure 23A:
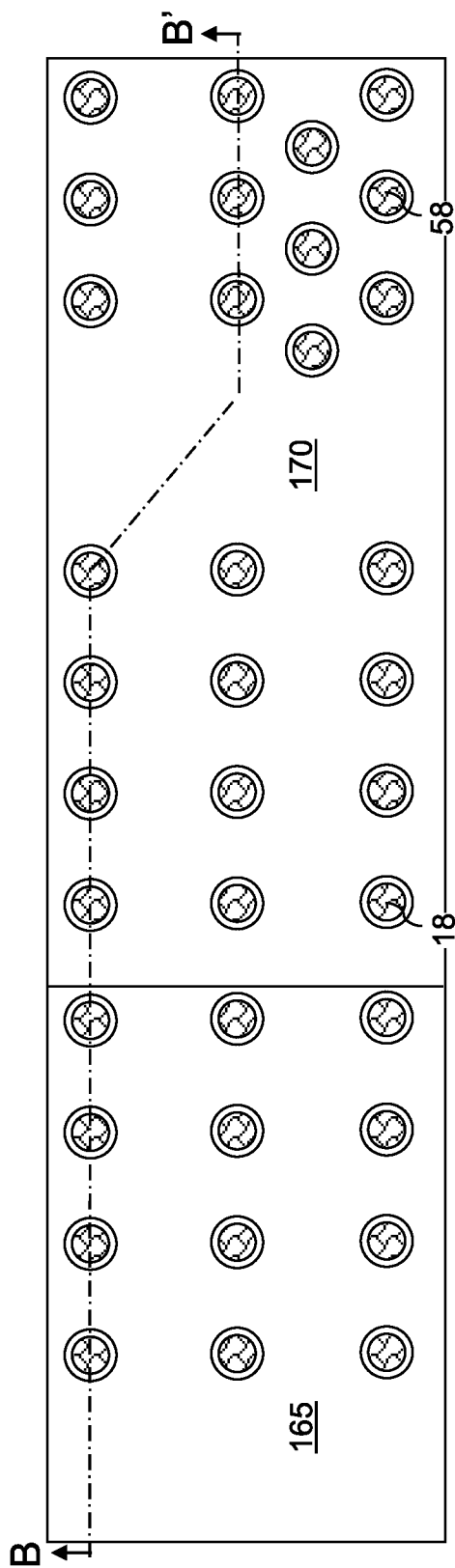
FIG. 23A is a top-down view of the third exemplary structure after the interface-enhanced etch process to form tapered sidewalls according to the third embodiment of the present disclosure.
Figure 23B:
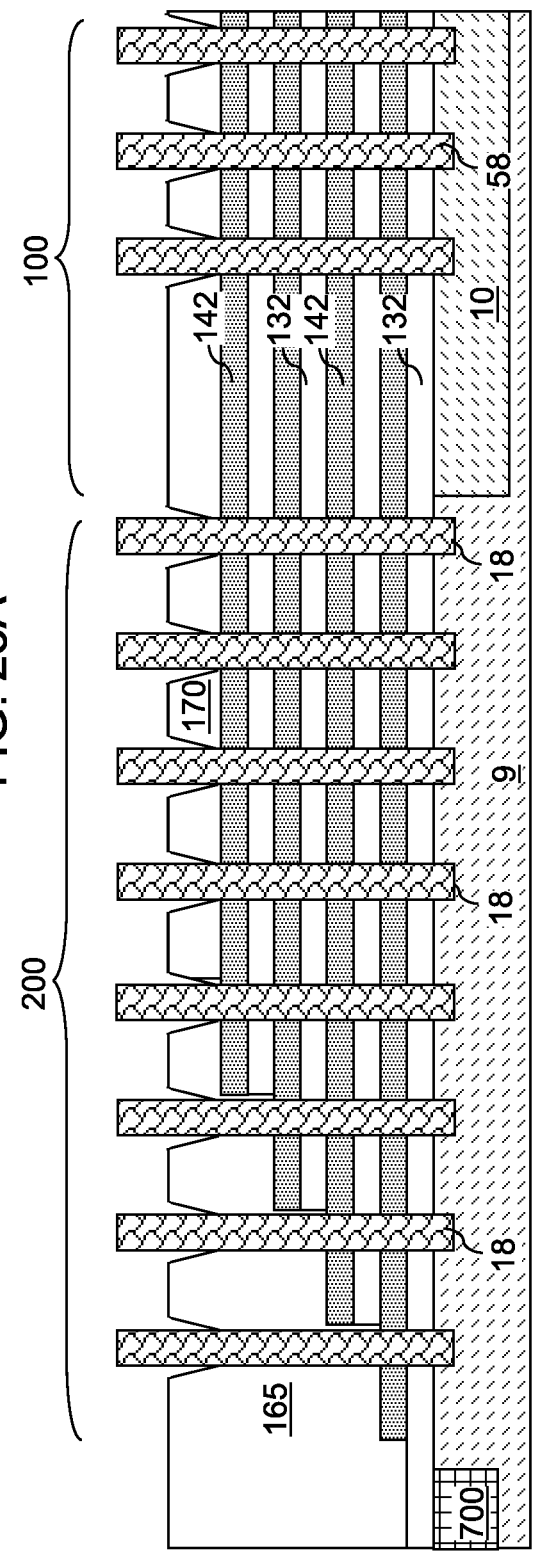
FIG. 23B is a vertical cross-sectional view of the third exemplary structure of FIG. 23A along the vertical plane B-B'.
Figure 23C:
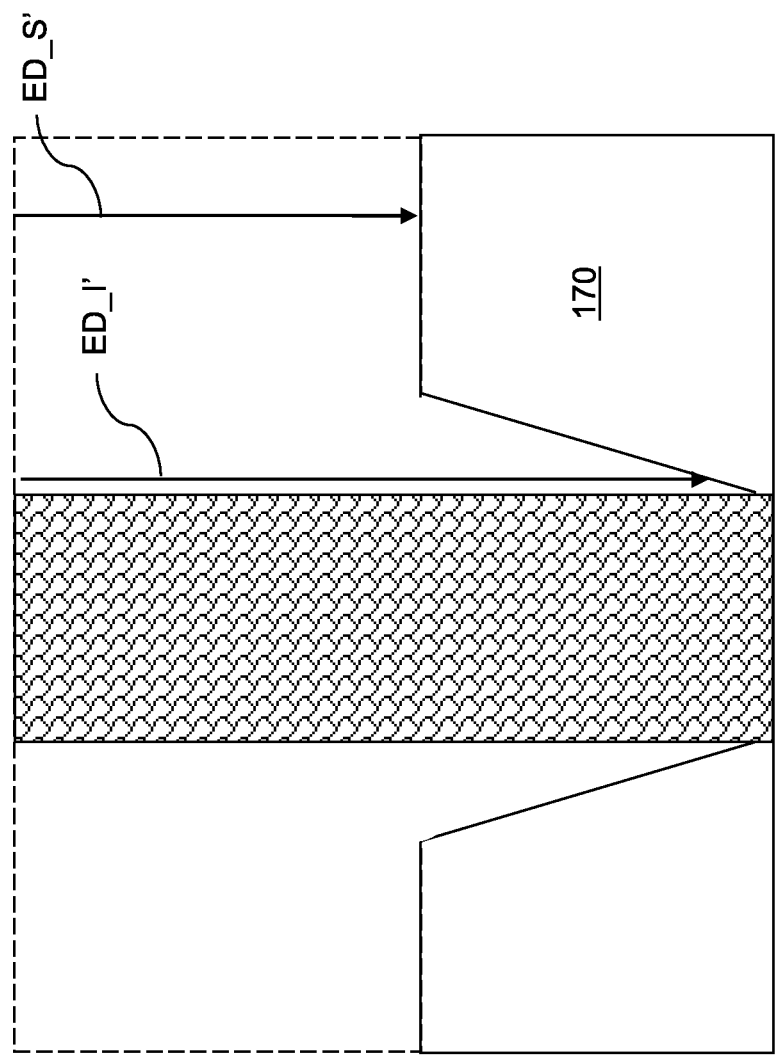
FIG. 23C is a magnified vertical cross-sectional view of a top portion of a sacrificial fill material portion of FIGS. 23A and 23B.

The etch process is continued until the etchant reaches a bottom portion of the interface between the interface between the sacrificial fill material portions (58, 18) and the joint level dielectric material layer 170. Referring to FIGS. 23A-23C, the material of the joint level dielectric material layer 170 is etched employing the same etch process, which provides a higher interfacial etch rate for the material of the joint level dielectric material layer 170 at an interface between the joint level dielectric material layer 170 and the sacrificial fill material portions (58, 18) than the bulk etch rate for the material of the joint level dielectric material layer 170. Thus, as shown in FIG. 23C, the interfacial etch distance ED_I' (which is measured from the top surface of the sacrificial dielectric material layer 172 prior to the etch process to the bottommost portion of the in-process tapered sidewall of the joint level dielectric material layer 170) is greater than the surface etch distance ED_S' (which is measured from the top surface of the sacrificial dielectric material layer 172 prior to the etch process to the recessed top surface of the joint level dielectric material layer 170 during the etch process). At the end of the etch process, a tapered sidewall is formed around each sacrificial fill material portions (58, 18) on the joint level dielectric material layer 170. In one embodiment, the sacrificial dielectric material layer 172 may be completely removed during the etch process.

Referring to FIGS. 24A and 24B, protruding portion of the sacrificial fill material portions (58, 18) can be removed, for example, by a selective anisotropic etch process after formation of the tapered sidewalls on the joint level dielectric material layer 170. In one embodiment, the recessed top surfaces of the sacrificial fill material portions (58, 18) can be located at a lower portion of the tapered sidewalls of the joint level dielectric material layer 170, or at the interface between the joint level dielectric material layer 170 and the topmost layer of the first alternating stack (132, 142). A tapered memory cavity 157 can be formed at an upper portion of each first memory opening, and a tapered support cavity 117 can be formed at an upper portion of each first support opening. The taper angle of the tapered sidewalls of the joint level dielectric material layer 170 can be greater than 3 degrees and less than 60 degrees, such as 10 to 55 degrees. For example, the taper angle can be in a range from 5 degrees to 45 degrees, and may be in a range from 7.5 degrees to 30 degrees. In one embodiment, the taper angle may be greater than 3, 5, 7.5, 10, 12.5, 15, 17.5, and/or 20 degrees. In one embodiment, the taper angle may be less than 60, 45, 30, 25, 20, 17.5, and/or 15 degrees.

Referring to FIGS. 25A and 25B, the processing steps of FIGS. 8A and 8B can be performed to form retro-tapered sacrificial caps (158, 118) in the tapered cavities (157, 117). Each retro-tapered sacrificial cap (158, 118) can be formed within a volume laterally bounded by a tapered sidewall of the joint level dielectric material layer 170 and vertically bounded by a horizontal plane including a top surface of the joint level dielectric material layer 170.

Subsequently, the processing steps of FIGS. 9A-9B, 10A-10B, 11A-11B, 12A-12B, 13A-13H, 14A-14B, 15A-15B, 16A-16B, 17A-17B, and 18A-18C can be performed to provide a third exemplary structure having the same structural characteristics as the first exemplary structure of FIGS. 18A-18C.

The various exemplary structures of the present disclosure, as provided at the processing steps of FIGS. 18A-18C, at equivalent processing steps, or at subsequent processing steps can include a monolithic three-dimensional memory device. The monolithic three-dimensional memory device comprises: a first alternating stack (132, 146) of first insulating layers 132 and first electrically conductive layers 146 located over a substrate (9, 10); a joint level dielectric material layer 170 overlying the first alternating stack (132, 146); a second alternating stack (232, 246) of second insulating layers 232 and second electrically conductive layers 246 located over the joint level dielectric material layer 170; an inter-tier memory opening 49 extending through the second alternating stack (232, 246), the joint level dielectric material layer 170, and the first alternating stack (132, 146); and a memory stack structure 55 located within the inter-tier memory opening 49 and comprising a memory film 50 and a semiconductor channel 60.

As shown in FIG. 18C, the memory film comprises a lower portion SOL located adjacent to the first alternating stack (132, 146), an upper portion 50U located adjacent to the second alternating stack (232, 246), and a joint portion 50J located between the lower portion SOL and the upper portion 50U and adjacent to the joint level dielectric material layer 170. A tapered outer sidewall of the joint portion 50J of the memory film contacts a tapered sidewall 170S of the joint level dielectric material layer in the memory opening 49. An outer sidewall of the lower portion SOL and an outer sidewall of the upper portion 50U of the memory film 50 are either untapered or have a smaller taper angle than a taper angle θ of the tapered outer sidewall of the joint portion 50J of the memory film 50. Untapered outer sidewalls have a taper angle of zero and extend perpendicular to the upper surface of the substrate (9, 10). If the outer sidewalls of the lower portion SOL and an outer sidewall of the upper portion 50U of the memory film 50 are tapered, then they may have a taper angle of 20 degrees or less, such as less than 10 degrees, such as less than 5 degrees, for example 1 to 2.5 degrees.

A horizontal surface 50H located between the upper portion 50U and the joint portion 50J of the memory film 50 contacts a horizontal bottom surface of the second alternating stack (232, 246), as shown in FIG. 18C. The outer sidewall of the lower portion SOL of the memory film 50 extends through the first alternating stack (132, 146) and includes an upper periphery that adjoins a lower periphery of the tapered outer sidewall of the joint portion 50J of the memory film 50.

In one embodiment, the tapered outer sidewall of the memory film 50 has a uniform taper angle throughout, and the uniform taper angle can be in a range from 5 degrees to 45 degrees with respect to a vertical direction that is perpendicular to a top surface of the substrate (9, 10).

In one embodiment, the annular horizontal surface 50H of the memory film 50 contacts the horizontal bottom surface of the second alternating stack (232, 246), and an upper periphery of the tapered outer sidewall of joint portion 50J the memory film 50 adjoins an outer periphery of the annular horizontal surface of the memory film 50. In one embodiment, an outer sidewall of the upper portion 50U of the memory film 50 extends through the second alternating stack (232, 246) and has a lower periphery that adjoins an inner periphery of the annular horizontal surface 50H of the memory film 50.

In case the substantially vertical lower outer sidewall of the memory film 50 has a non-zero taper angle, a taper angle θ of the tapered outer sidewall of the joint portion 50J of the memory film 50 with respect to a vertical direction that is perpendicular to a top surface of the substrate (9, 10) is greater than the taper angle of the outer sidewall of the lower portion of the memory film 50 by at least 3 degrees, such as by 5 to 60 degrees.

In one embodiment, the upper periphery of the outer sidewall of the lower portion SOL of the memory film 50 is located on a surface of the joint level dielectric material layer 170, and a lower periphery of the outer sidewall of the lower portion SOL of the memory film 50 adjoins an outer periphery of a bottommost surface 50B of the memory film 50, as shown in FIG. 18C.

In one embodiment, the memory film 50 comprises a lateral stack of a blocking dielectric layer 52, a charge storage layer 54, and a tunneling dielectric layer 56, and each of the blocking dielectric layer 52, the charge storage layer 54, and the tunneling dielectric layer 56 extends continuously through the second alternating stack (232, 246), the joint level dielectric material layer 170, and the first alternating stack (132, 146) as a respective continuous material layer.

In one embodiment, a bottom surface of the memory stack structure 55 contacts a doped semiconductor material portion (which may be a pillar semiconductor channel portion 11 or the semiconductor material layer 10 in case a pillar semiconductor channel portion 11 is absent) located on, or within, the substrate (9, 10), and the semiconductor channel 60 protrudes downward into the doped semiconductor material portion (11 or 10) such that a sidewall of the semiconductor channel 60 contacts the doped semiconductor material portion (11 or 10).

In one embodiment, the monolithic three-dimensional memory device can further comprise a backside blocking dielectric layer 44 including vertical portions located between the memory film 50 and each of the first and second electrically conductive layers (146, 246) and horizontal portions contacting each top surface and each bottom surface of the first and second electrically conductive layers (146, 246). The joint level dielectric material layer 170 contacts a horizontal portion of the backside blocking dielectric layer 44 overlying a topmost one of the first electrically conductive layers 146.

In one embodiment, the first alternating stack (132, 146) comprises a first terrace region in which each first electrically conductive layer 146 other than a topmost first electrically conductive layer 146 within the first alternating stack (132, 146) laterally extends farther than any overlying first electrically conductive layer 146 within the first alternating stack (132, 146). The second alternating stack can comprise a second terrace region in which each second electrically conductive layer 246 other than a topmost second electrically conductive layer 246 within the second alternating stack (232, 246) laterally extends farther than any overlying second electrically conductive layer 246 within the second alternating stack (232, 246). The first and second terrace regions include stepped surfaces that continuously extend from a bottommost layer within the first alternating stack (132, 146) to a topmost layer within the second alternating stack (232, 246). The support pillar structures 20 can extend through the stepped surfaces and through at least one retro-stepped dielectric material portion (165, 265) that overlies the stepped surfaces.

In one embodiment, the three-dimensional memory device comprises a vertical NAND memory device. The electrically conductive layers (146, 246) can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer (146, 246)) in a first device level of the array of monolithic three-dimensional NAND strings can be located over another memory cell (as embodied as another portion of the charge storage layer 54 at a level of another electrically conductive layer (146, 246)) in a second device level of the array of monolithic three-dimensional NAND strings. The silicon substrate can contain an integrated circuit comprising a driver circuit for the memory device located thereon. The electrically conductive layers (146, 246) can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a monolithic three-dimensional memory device, comprising:
   forming a first alternating stack of first insulating layers and first spacer material layers over a substrate;
   forming a joint level dielectric material layer over the first alternating stack;
   forming a first memory opening through the joint level dielectric material layer and the first alternating stack;
   forming a tapered sidewall of the joint level dielectric material layer in the first memory opening;
   forming a second alternating stack of second insulating layers and second spacer material layers over the joint level dielectric material layer, wherein the first and second spacer material layers are formed as, or are subsequently replaced with, electrically conductive layers;
   forming an inter-tier memory opening that includes a volume of a second memory opening that extends through the second alternating stack and a volume of the first memory opening;
   forming a memory stack structure within the inter-tier memory opening, wherein:
      the memory stack structure comprises a memory film and a semiconductor channel; and
      a tapered outer sidewall of the memory film is formed directly on the tapered sidewall of the joint level dielectric material layer;
   forming an in-process first memory opening through the joint level dielectric material layer and the first alternating stack, wherein surfaces of the in-process first memory opening include a substantially vertical sidewall of the joint level dielectric material layer; and forming the tapered sidewall of the joint level dielectric material layer by etching the substantially vertical sidewall of the joint level dielectric material layer with a height-dependent lateral etch distance that increases with a vertical distance from a top surface of the substrate.

2. The method of claim 1, further comprising forming a sacrificial fill material portion within the in-process first memory opening, wherein the sacrificial fill material portion protects sidewalls of the first insulating layers and the first spacer material layers during etching of the substantially vertical sidewall of the joint level dielectric material layer.

3. The method of claim 2, further comprising:
vertically recessing the sacrificial fill material portion to physically expose the substantially vertical sidewall of the joint level dielectric material layer;
anisotropically applying a patterning film over the joint level dielectric material layer and the sacrificial fill material portion; and
performing an aspect ratio-dependent anisotropic etch process that provides the height-dependent lateral etch distance that increases with the vertical distance from the top surface of the substrate.

4. The method of claim 3, wherein the patterning film comprises a material selected from a photoresist material, amorphous carbon, and diamond-like carbon (DLC).

5. The method of claim 3, further comprising:
forming a sacrificial dielectric material layer over the joint level dielectric material layer, wherein the first memory opening is formed through the sacrificial dielectric material layer, the patterning film is formed on a top surface of the sacrificial dielectric material layer, and another tapered sidewall is formed on the sacrificial dielectric material layer during formation of the tapered sidewall of the joint level dielectric material layer; and
removing the sacrificial dielectric material layer selective to the joint level dielectric material layer after formation of the first memory opening.

6. The method of claim 2, further comprising etching a material of the joint level dielectric material layer employing an etch process that provides a higher interfacial etch rate for the material of the joint level dielectric material layer at an interface between the joint level dielectric material layer and the sacrificial fill material portion than a bulk etch rate for the material of the joint level dielectric material layer.

7. The method of claim 6, further comprising:
removing a protruding portion of the sacrificial fill material portion after formation of the tapered sidewall of the joint level dielectric material layer; and
forming a retro-tapered sacrificial cap within a volume laterally bounded by the tapered sidewall of the joint level dielectric material layer and vertically bounded by a horizontal plane including a top surface of the joint level dielectric material layer.

8. A method of forming a monolithic three-dimensional memory device, comprising:
forming a first alternating stack of first insulating layers and first spacer material layers over a substrate;
forming a joint level dielectric material layer over the first alternating stack;
forming a first memory opening through the joint level dielectric material layer and the first alternating stack;
forming a tapered sidewall of the joint level dielectric material layer in the first memory opening;
forming a second alternating stack of second insulating layers and second spacer material layers over the joint level dielectric material layer, wherein the first and second spacer material layers are formed as, or are subsequently replaced with, electrically conductive layers;
forming an inter-tier memory opening that includes a volume of a second memory opening that extends through the second alternating stack and a volume of the first memory opening; and
forming a memory stack structure within the inter-tier memory opening, wherein:
the memory stack structure comprises a memory film and a semiconductor channel; and
a tapered outer sidewall of the memory film is formed directly on the tapered sidewall of the joint level dielectric material layer, and wherein:
the memory film comprises a lower portion located adjacent to the first alternating stack, an upper portion located adjacent to the second alternating stack, and a joint portion located between the lower portion and the upper portion and adjacent to the joint level dielectric material layer;
the tapered outer sidewall of the memory film is located in the joint portion of the memory film and contacts the tapered sidewall of the joint level dielectric material layer in the first memory opening;
an outer sidewall of the lower portion and an outer sidewall of the upper portion of the memory film are either untapered or have a smaller taper angle than a taper angle of the tapered outer sidewall of the joint portion of the memory film;
the tapered outer sidewall of the joint portion of the memory film has a uniform taper angle throughout, and the uniform taper angle is in a range from 5 degrees to 45 degrees with respect to a vertical direction that is perpendicular to a top surface of the substrate;
an annular horizontal surface of the memory film contacts a horizontal bottom surface of the second alternating stack; and
an upper periphery of the tapered outer sidewall of the memory film adjoins an outer periphery of the annular horizontal surface of the memory film.

* * * * *